(12) United States Patent
Kondo

(10) Patent No.: US 9,208,887 B2
(45) Date of Patent: Dec. 8, 2015

(54) NONVOLATILE SEMICONDUCTOR MEMORY DEVICE

(71) Applicant: KABUSHIKI KAISHA TOSHIBA, Minato-ku (JP)

(72) Inventor: Shigeo Kondo, Saitama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/645,058

(22) Filed: Mar. 11, 2015

(65) Prior Publication Data

US 2015/0187424 A1 Jul. 2, 2015

Related U.S. Application Data

(62) Division of application No. 13/707,851, filed on Dec. 7, 2012, now Pat. No. 9,105,336.

(30) Foreign Application Priority Data

Dec. 9, 2011 (JP) ................................ 2011-270210
Feb. 1, 2012 (JP) ................................ 2012-019885
Apr. 26, 2012 (JP) ................................ 2012-100721

(51) Int. Cl.
*G11C 11/34* (2006.01)
*G11C 16/10* (2006.01)
(Continued)

(52) U.S. Cl.
CPC ............. *G11C 16/10* (2013.01); *G11C 11/5628* (2013.01); *G11C 16/3427* (2013.01); *G11C 16/3459* (2013.01)

(58) Field of Classification Search
CPC .......... G11C 16/00; G11C 16/02; G11C 16/24
USPC ............................ 365/185.03, 185.22, 185.24
See application file for complete search history.

(56) References Cited

U.S. PATENT DOCUMENTS 6,862,217 B2   3/2005   Kawabata
7,355,887 B2   4/2008   Nakamura et al.
(Continued)

FOREIGN PATENT DOCUMENTS

JP   8-96591 A   4/1996
JP   11-31391    2/1999
(Continued)

OTHER PUBLICATIONS

Office Action issued Jul. 1, 2014 in Japanese Patent Application No. 2011-270210 with English language translation.
(Continued)

*Primary Examiner* — Han Yang
(74) *Attorney, Agent, or Firm* — Oblon, McClelland, Maier & Neustadt, L.L.P.

(57) ABSTRACT

A non-volatile semiconductor memory device according to one embodiment includes: a cell array; and a data writing unit that repeatedly executes a write loop including a programming operation of applying a program voltage to a selected word line and a passage voltage to non-selected word lines during writing of data, in which, when a difference between the passage voltage used in an n-th write loop and the passage voltage used in an n+1-th write loop is expressed as $\Delta Vn$ and when a condition of L<M (L and M are integers) is satisfied, the data writing unit executes the write loop using the passage voltage where $\Delta V (L-1) < \Delta VL$, $\Delta VL \leq \Delta V (M-1)$, and $\Delta V (M-1) < \Delta VM$.

11 Claims, 45 Drawing Sheets

(51) Int. Cl.
*G11C 11/56* (2006.01)
*G11C 16/34* (2006.01)

(56) References Cited

U.S. PATENT DOCUMENTS

| | | | |
|---|---|---|---|
| 7,376,016 | B2 | 5/2008 | Kajimoto et al. |
| 7,688,631 | B2 | 3/2010 | Kim et al. |
| 7,916,545 | B2 | 3/2011 | Fujiu |
| 8,179,720 | B2 | 5/2012 | Fukuda et al. |
| 8,738,836 | B2 | 5/2014 | Yano |
| 2004/0174748 | A1 | 9/2004 | Lutze et al. |
| 2006/0018162 | A1* | 1/2006 | Kawai ............ 365/185.28 |
| 2006/0120162 | A1 | 6/2006 | Fujiu et al. |
| 2007/0076487 | A1 | 4/2007 | Takeuchi et al. |
| 2007/0177431 | A1 | 8/2007 | Matsunaga et al. |
| 2009/0141557 | A1 | 6/2009 | Fujiu |
| 2010/0067305 | A1 | 3/2010 | Park et al. |
| 2011/0007572 | A1 | 1/2011 | Ueno et al. |
| 2011/0228608 | A1 | 9/2011 | Shiino et al. |
| 2012/0281477 | A1 | 11/2012 | Sakaniwa et al. |
| 2012/0281487 | A1 | 11/2012 | Sakaniwa et al. |
| 2013/0010547 | A1 | 1/2013 | Aritome |
| 2014/0063968 | A1* | 3/2014 | Shim .............. G11C 16/0483 365/185.19 |

FOREIGN PATENT DOCUMENTS

| | | |
|---|---|---|
| JP | 11-110977 | 4/1999 |
| JP | 2004-110986 A | 4/2004 |
| JP | 2005-129194 A | 5/2005 |
| JP | 2005-216466 A | 8/2005 |
| JP | 2005-276428 | 10/2005 |
| JP | 2005-327436 A | 11/2005 |
| JP | 2006-522428 | 9/2006 |
| JP | 2007-026579 A | 2/2007 |
| JP | 2007-102865 | 4/2007 |
| JP | 2007-207333 | 8/2007 |
| JP | 2007-305204 A | 11/2007 |
| JP | 2009-140542 | 6/2009 |
| JP | 2009-151865 A | 7/2009 |
| JP | 2009-199706 A | 9/2009 |
| JP | 2009-205728 | 9/2009 |
| JP | 2009-266377 | 11/2009 |
| JP | 2010-225225 A | 10/2010 |
| JP | 2011-18397 | 1/2011 |

OTHER PUBLICATIONS

Office Action issued Jul. 18, 2014 in Japanese Patent Application No. 2012-019885 (with English language translation).
Japanese Office Action issued Mar. 24, 2015 in Patent Application No. 2012-100721 (with English Translation).
Taiwanese Office Action issued Feb. 10, 2015 in Patent Application No. 101145867 (with English Translation).
Combined Chinese Office Action and Search Report issued Apr. 23, 2015 in Patent Application No. 201210519501.1(with English language translation and English translation of Category of Cited Documents).

* cited by examiner

FIG. 27

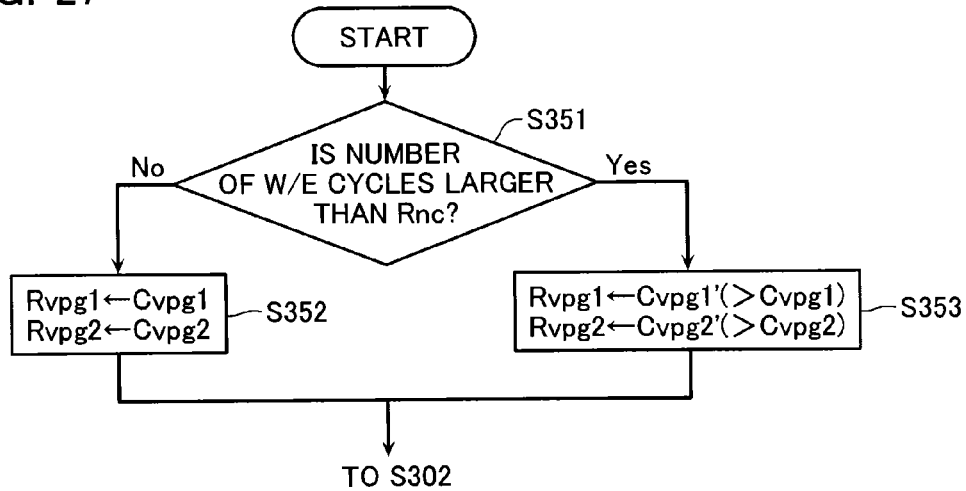

FIG. 28

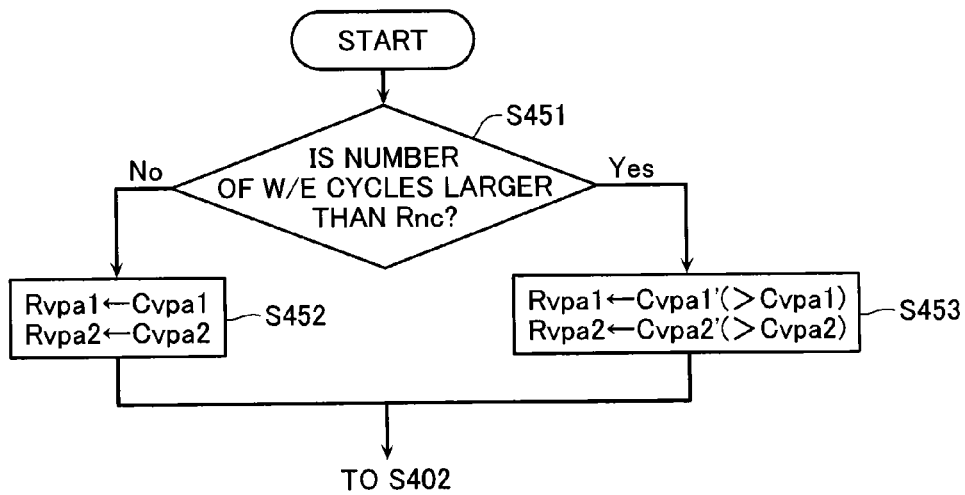

FIG. 29

| NUMBER OF W/E CYCLES (Rnc) | STEP S601 | STEP S605 | STEP S614 |
|---|---|---|---|
| LESS THAN 1,000 | IS VERIFICATION PASS RATE OF A LEVEL 100%? | IS VERIFICATION PASS RATE OF B LEVEL 100%? | IS VERIFICATION PASS RATE OF C LEVEL 100%? |
| LESS THAN 10,000 | IS VERIFICATION PASS RATE OF B LEVEL 50%? | IS VERIFICATION PASS RATE OF C LEVEL 50% OR MORE? | IS VERIFICATION PASS RATE OF C LEVEL 100%? |
| 100,000 OR MORE | IS VERIFICATION PASS RATE OF B LEVEL 75%? | IS VERIFICATION PASS RATE OF C LEVEL 75%? | IS VERIFICATION PASS RATE OF C LEVEL 100%? |

<THRESHOLD VOLTAGE OF MEMORY CELL
CONNECTED TO WORD LINE WLi IMMEDIATELY
AFTER WRITING TO WORD LINE WLi IS PERFORMED>

FIG. 55 <THRESHOLD VOLTAGE OF MEMORY CELL CONNECTED TO WORD LINE WLi IMMEDIATELY AFTER ADDITIONAL VOLTAGE IS APPLIED TO WORD LINE WLi>

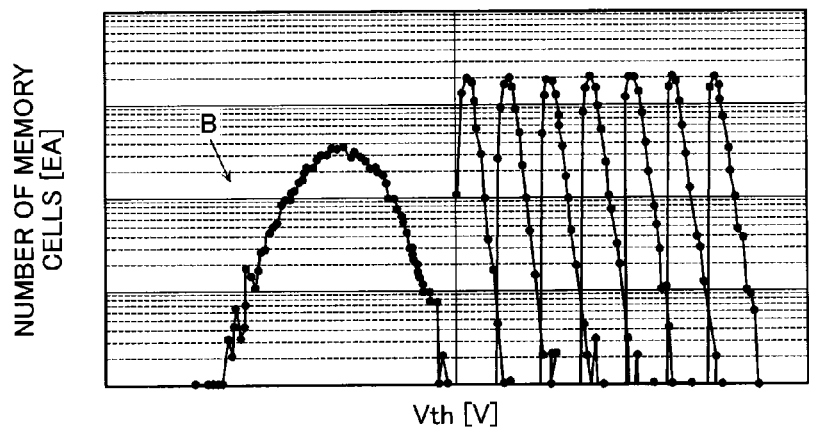

FIG. 56 <THRESHOLD VOLTAGE OF MEMORY CELL CONNECTED TO WORD LINE WLi IMMEDIATELY AFTER WRITING O WORD LINE WLi IS PERFORMED>

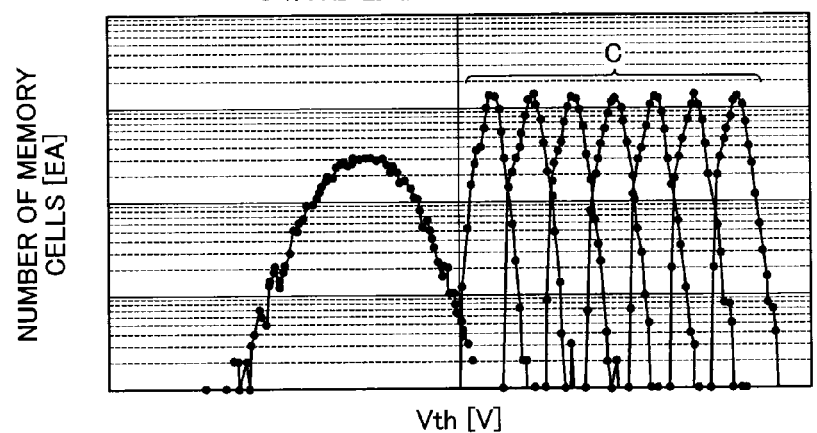

FIG. 57 <THRESHOLD VOLTAGE OF MEMORY CELL CONNECTED TO WORD LINE WLi IMMEDIATELY AFTER ADDITIONAL VOLTAGE IS APPLIED TO WORD LINE WLi>

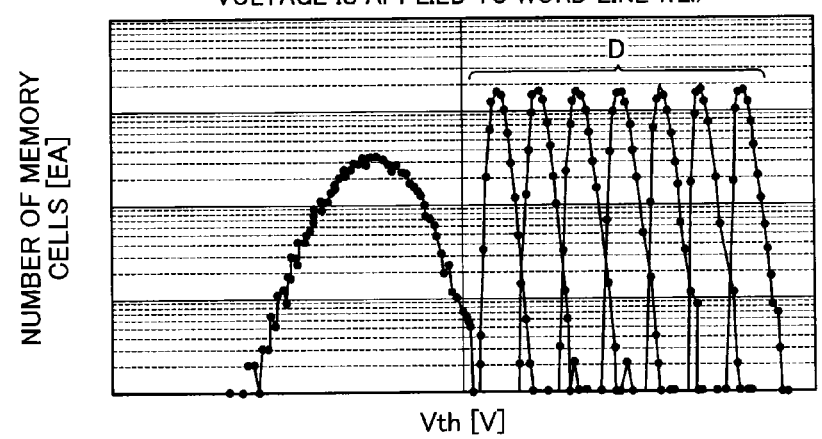

<THRESHOLD VOLTAGE OF MEMORY CELL CONNECTED
TO WORD LINE WLi-1 IMMEDIATELY AFTER WRITING
TO WORD LINE WLi IS PERFORMED>

NONVOLATILE SEMICONDUCTOR MEMORY DEVICE

CROSS-REFERENCE TO RELATED APPLICATIONS

This application is a divisional of U.S. application Ser. No. 13/707,851 filed Dec. 7, 2012 and is based upon and claims the benefit of priority from the prior Japanese Patent Application No. 2011-270210, filed on Dec. 9, 2011, the prior Japanese Patent Application No. 2012-019885, filed on Feb. 1, 2012, and the prior Japanese Patent Application No. 2012-100721, filed on Apr. 26, 2012, the entire contents of each of which are incorporated herein by reference.

FIELD

Embodiments disclosed herein are directed to a nonvolatile semiconductor memory device.

BACKGROUND

Writing of data to a flash memory which is one of nonvolatile semiconductor memory devices is achieved by usually repeatedly executing a write loop which includes a programming operation and a verifying operation.

For NAND flash memories, in the programming operation, a program voltage, which is stepped up each time a write loop is executed, is applied to a word line connected to a selected memory cell, and a passage voltage of a level capable of barely turning on a non-selected memory cell is applied to at least one of the other word lines.

However, in this case, there is a possibility that an erroneous write may occur in the non-selected memory cells connected to non-selected bit lines because a potential difference between the control gate and the channel of each of the non-selected memory cells increases in the non-selected memory cells.

Moreover, in the nonvolatile semiconductor memory devices, an inter-cell interference effect increases and a threshold distribution of memory cells broadens with shrinking of the devices in recent years. Because the breakdown voltage of memory cells increasingly decreases with the shrinking of the nonvolatile semiconductor memory devices, the upper limit of the program voltage is lowered and therefore a width of a threshold distribution of a high voltage is difficult to be secured. Especially when multiple bits are stored in a memory cell, because a plurality of threshold distributions which tends to broaden is provided within a voltage range which tends to narrow, writing becomes increasingly difficult. Therefore, there is the demand of narrowing the threshold distribution.

BRIEF DESCRIPTION OF THE DRAWINGS

FIG. 27 is an example of a flowchart of the write sequence of the nonvolatile semiconductor memory device according to the fifth embodiment;

FIG. 28 is an example of a flowchart of the write sequence of the nonvolatile semiconductor memory device according to the fifth embodiment;

FIG. 29 is an example of a table showing a determination condition of the write sequence of the nonvolatile semiconductor memory device according to the fifth embodiment;

FIGS. 54 through 57 are examples of a graph illustrating a threshold distribution of memory cells of the nonvolatile semiconductor memory device according to the eleventh embodiment;

DETAILED DESCRIPTION

Figure 1:
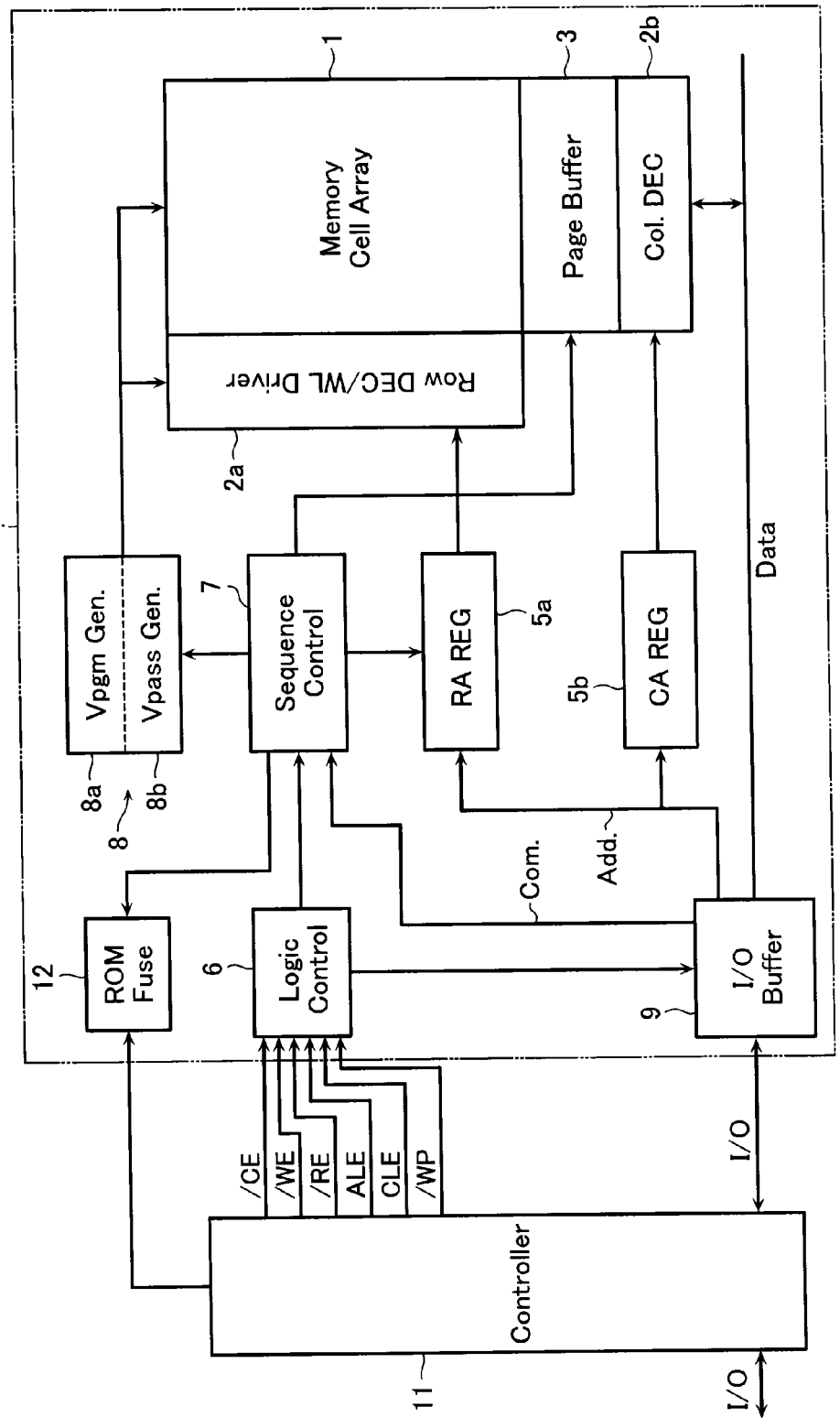
FIG. 1 is an example of a block diagram of a nonvolatile semiconductor memory device according to a first embodiment.

A non-volatile semiconductor memory device according to one embodiment includes: a cell array including bit lines and source lines that intersect each other, a cell string in which a plurality of memory cells is connected in series, each memory cell being disposed between the bit line and the source line and being formed of a transistor including a control gate and a charge storage layer, and word lines connected to the control gates of the respective memory cells of the cell string; and a data writing unit that repeatedly executes a write loop including a programming operation of applying a program voltage to a selected word line of the word lines and a passage voltage to the other word lines that are non-selected word lines during writing of data, in which, when a difference between the passage voltage used in an n-th write loop and the passage voltage used in an n+1-th write loop is expressed as $\Delta Vn$ and when a condition of $L<M$ (L and M are integers) is satisfied, the data writing unit executes the write loop using the passage voltage where $\Delta V(L-1) < \Delta VL$, $\Delta VL \leq \Delta V(M-1)$, and $\Delta V(M-1) < \Delta VM$.

A nonvolatile semiconductor memory device according to another embodiment includes: a memory cell array including a cell string in which a plurality of memory cells, each including a control gate and a charge storage layer, is connected in series, and a plurality of word lines that commonly connects the control gages of the respective memory cells of the cell string to each other in a first direction; and a data writing unit that repeatedly executes a programming operation at a time of writing data, in which when, among the plurality of word lines, a word line which is selected is referred to as a selected word line, word lines adjacent to the selected word line are referred to as a first adjacent word line and a second adjacent word line, respectively, and any one of the word lines other than the selected word line, the first adjacent word line, and the second adjacent word line is referred to as a first non-selected word line, the data writing unit applies, at the time of data programming operation, a program voltage to the selected word line, a first passage voltage to at least one of the first adjacent word line and the second adjacent word line, and a second passage voltage to the first non-selected word line; and when a difference between the first passage voltage used in an n-th write loop and the first passage voltage used in an n+1-th write loop is expressed as $\Delta Vn$ and when a condition of $L<M$ (L and M are integers) is satisfied, $\Delta V(L-1)<\Delta VL$, $\Delta VL \leq \Delta V(M-1)$, and $\Delta V(M-1)<\Delta VM$ are established with respect to the first passage voltage, and the second passage voltage is a voltage higher than a lowest value of the first passage voltage.

A nonvolatile semiconductor memory device according to a further embodiment includes: a memory cell array including a plurality of memory cells, and a plurality of word lines and a plurality of bit lines used to control the memory cells; and a data writing unit that writes data to a memory cell connected to a first word line by applying a program voltage to the first word line among the plurality of word lines one or more times, and applies an additional voltage to the first word line one or more times after performing the data writing to the memory cell connected to the first word line, in which when performing data writing to a second word line different from the first word line among the plurality of word lines after performing the data writing to the memory cell connected to the first word line, the data writing unit sets the plurality of bit lines as non-selected bit lines or selected bit lines after performing the data writing to the memory cell connected to the second word line and applies the additional voltage to the second word line.

Hereinbelow, nonvolatile semiconductor memory devices according to embodiments will be described with reference to the accompanying drawings.

First Embodiment

Overall Structure

First, an overall configuration of a nonvolatile semiconductor memory device according to a first embodiment will be described.

FIG. 1 is an example of a block diagram of the nonvolatile semiconductor memory device according to the first embodiment.

This NAND flash memory includes a NAND chip 10, a controller 11 which controls the NAND chip 10.

In a memory cell array 1 which makes up the NAND chip 10, a plurality of memory cells of a charge storage layer type is arranged in matrix as described below.

A row decoder/word line driver 2a, a column decoder 2b, a page buffer 3, and a voltage generation circuit 8 including a program voltage generation circuit 8a and a passage voltage generation circuit 8b are arranged around the memory cell array 1. The row decoder/word line driver 2a, the column decoder 2b, the page buffer 3, and the voltage generation circuit 8 form a data writing unit, and perform writing of data to or reading of data out of the memory cell array 1 on page basis.

The row decoder/word line driver 2a activates word lines and selected gate lines of the memory cell array 1. The page buffer 3 includes sense amplifier circuits and data latching circuits for one page. With regard to data read out of the page buffer 3 in an amount of one page, it is sequentially selected column, column by column, by the column decoder 2b, and is output to external I/O terminals via an I/O buffer 9. Write data supplied from the I/O terminals is selected by the column decoder 2b and is then loaded to the page buffer 3. The write data for one page is loaded to the page buffer 3. A row address signal and a column address signal are input via the I/O buffer 9, and are then transmitted to the row decoder 2a and the column decoder 2b, respectively. A low address register 5a holds an erase block address during an erasing operation, and holds a page address during a writing operation or a reading operation. A head column address for load of the write data before starting the writing operation and a head column address for the reading operation are input to a column address register 5b. The column address register 5b holds a column address which is input, until a write enable signal /WE, a read enable signal /RE, etc. are input.

A logic control circuit 6 controls input of commands and/or addresses, and input/output of data, based on control signals such as a chip enable signal /CE, a command enable signal CLE, an address latch enable signal ALE, a write enable signal /WE, a read enable signal /RE. The reading operation and the writing operation are executed according to commands. In response to a command, a sequence control circuit 7 performs sequence control of the reading operation and the writing operation or an erasing operation. The voltage generation circuit 8 generates voltages required for various operation under the control of the control circuit 7.

The controller 11 controls writing of data and reading of data under the conditions suitable for the current write state of the NAND chip 10 by using a variety of information required for the control which is stored in the ROM fuse 12. In addition, a portion of the writing operation to be described below may be performed by the NAND chip 10.

<Memory Cell Array>

Next, the memory cell array 1 of the nonvolatile semiconductor memory device according to the present embodiment will be described.

Figure 2:
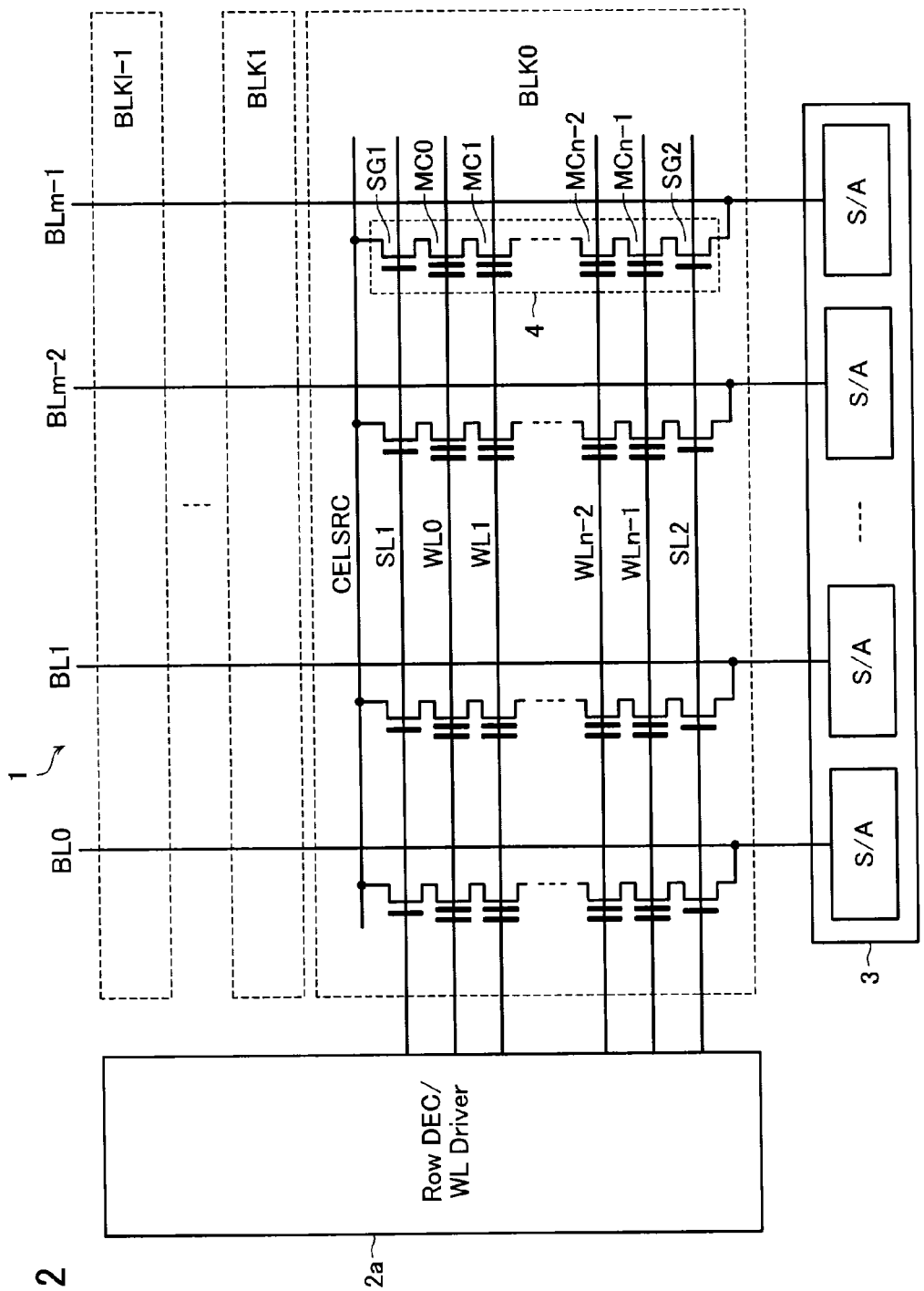
FIG. 2 is an example of a circuit diagram of a memory cell array of the nonvolatile semiconductor memory device according to the first embodiment.

FIG. 2 illustrates an example of a circuit diagram of the memory cell array 1. In the case of FIG. 2, a NAND string 4 includes n (n is a natural number) memory cells MC0 to MCn−1 connected in series to each other, and selection gate transistors SG1 and SG2 connected to both ends of the string of memory cells, respectively. A source of the selection gate transistor SG1 is connected to a source line CELSRC, and a drain of the selection gate transistor SG2 is connected to a bit line BL (BL0 to BLm−1). Control gates of the memory cells MC0 to MCn−1 are connected to word lines WL (WL0 to WLn−1), respectively and gates of the selection gate transistors SG1 and SG2 are connected to selection gate lines SL1 and SL2. Each of the memory cells MC0 to MCn−1 and the selection gate transistors SG1 and SG2 includes a gate insulation film formed on a well, a floating gate which is an example of a charge storage layer, an inter-gate insulation film, and a control gate. However, each of the selection gate transistors SG1 and SG2 has an opening in the center of the inter-gate insulation film. The floating gate and the control gate are electrically connected to each other through this opening.

The range of a plurality of memory cells MC corresponding to one word line WL serves as a page which is the unit of collective data reading or collective data writing. The range of a plurality of NAND strings 4 arranged in the direction of the word line WL serves as a block BLK which is the unit of collective data erasing. In FIG. 2, a plurality of blocks BLK0 to BLK1−1 which shares bit lines BL is arranged in the direction of a bit line BL to serve as one cell array 1. The word lines WL and the selection gate lines SL0 and SL1 are activated by the row decoder 2a. The bit lines BL are respectively connected to the sense amplifier circuits S/A of the page buffer 3.

Here, the term "page" which is an access unit of such a NAND flash memory is described. In the following description, it should be noted that the term "page" has two different meanings.

The first one is a "page" as a data access unit which is the unit of collective data access in one word line. The second one is a "page" as the hierarchy of stored data in a case where a plurality of bits is stored in a memory cell, and it is called "L (Lower) page", "U (Upper) page", etc. in this case.

<Data Writing>

First, before describing data writing of the present embodiment, the terms used below are defined first.

A series of processes executed during a data writing operation is called "a write sequence". The write sequence is executed in the unit of a "write loop" including a "programming operation" which substantially changes a threshold voltage of a memory cell, and a "verifying operation" which verifies the threshold voltage of the memory cell. In each programming operation, a program voltage Vpgm required to change the threshold voltage of a memory cell MC is applied to a selected word line WL, and a passage voltage Vpass of a level capable of turning on a memory cell MC is applied to non-selected word lines WL.

Next, the write sequence of the present embodiment is described.

Figure 3:
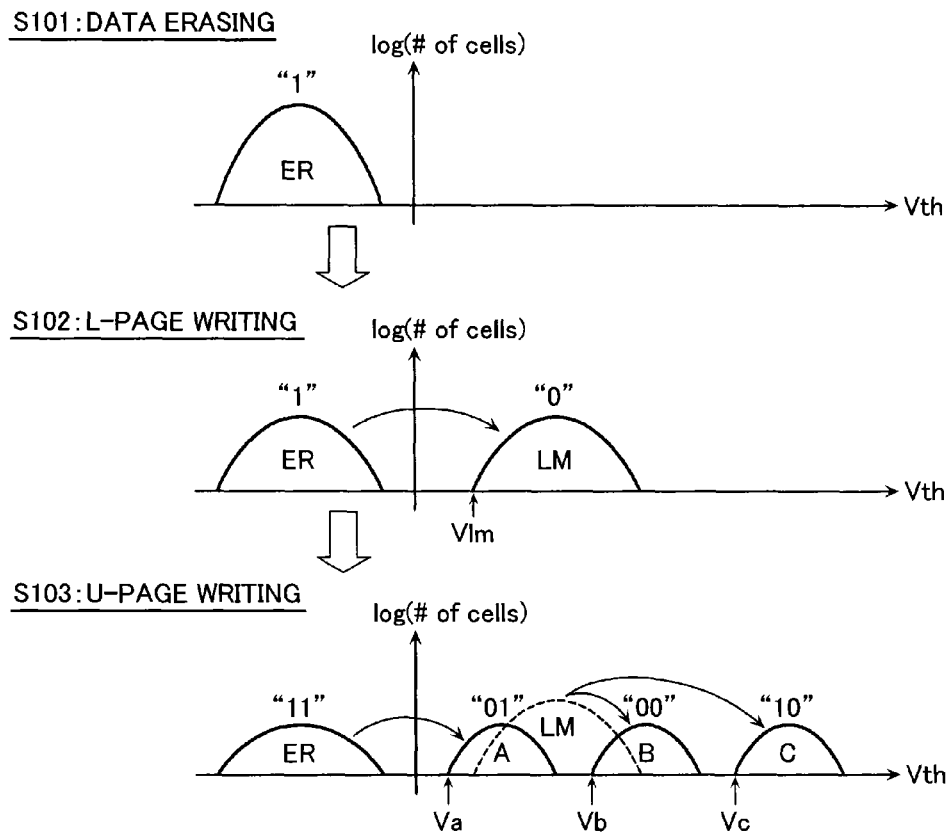
FIG. 3 is an example of a diagram illustrating the behavior of changes in the threshold distribution of a memory cell group during a write sequence of the nonvolatile semiconductor memory device according to the first embodiment.

FIG. 3 is an example of a diagram illustrating the behavior of changes in the threshold distribution of a memory cell group during a write sequence for memory cells of a 2 bits-per-cell type.

First, data erasing is executed (Step S101). This operation is collectively executed over the entire block. As a result, the threshold voltage Vth of all the memory cells within the block is set to an ER level which is the lowest level.

Subsequently, L-page writing is executed (Step S102). This operation is executed based on a lower-order bit of write data. When data of the lower-order bit is "1", the threshold voltage Vth of the memory cells is maintained at the ER level. When data of the lower-order bit is "0", the threshold voltage Vth of memory cells changes from the ER level to an LM level which is an intermediate level between an A level and a B level and which is higher than a voltage Vlm.

Lastly, U-page writing is executed (Step S103). This operation is executed based on a higher-order bit of the write data. If the threshold voltage Vth of the memory cells is the ER level, when data of a higher-order bit is "1", the threshold voltage Vth of the memory cells is maintained at the ER level. On the contrary, when data of the higher-order bit is "0", the threshold voltage Vth of the memory cells changes to the A level which is higher than a voltage Va (Va<Vlm). On the other hand, if the threshold voltage Vth of the memory cells is the LM level, when data of the higher-order bit is "0", the threshold voltage Vth of the memory cells changes to the B level higher than a voltage Vb (Va<Vb). On the contrary, when data of the higher-order bit is "1", the threshold voltage Vth of the memory cells changes to a C level which is higher than a voltage Vc (Vb<Vc).

As described above, the writing of 2-bit data to a memory cell is achieved by two steps, the L-page writing and the U-page writing.

The writing of each page is achieved by repeating the following write loop, for example.

The write loop includes a programming operation which changes the threshold voltage Vth of a memory cell MC, and a verifying operation of verifying whether the threshold voltage Vth of the memory cell MC is equal to or higher than a verification voltage.

Figure 4:
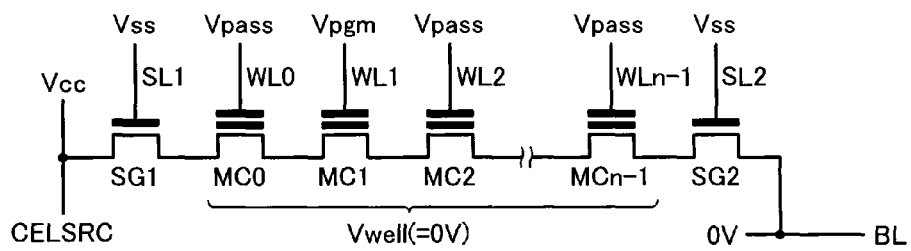
FIG. 4 is an example of a diagram illustrating a bias state of a memory cell array during a programming operation of the nonvolatile semiconductor memory device according to the first embodiment.

The programming operation of the write sequence is achieved by causing the memory cell array 1 to enter a bias state illustrated in FIG. 4. The example illustrated in FIG. 4 shows a case where data is written to a memory cell MC1 connected to a word line WL1.

That is, in the programming operation, a program voltage Vpgm (for example, about 20 V) to change the threshold voltage Vth of the memory cell MC is applied to the control gate (word line WL1) of the selected memory cell MC1, and a passage voltage Vpass (for example, about 10 V) is applied to each of the control gates of the other memory cells MC0, MC2, . . . , MCn−1. The passage voltage Vpass is set to a voltage which is a level at which the memory cells MC0, MC2, . . . , MCn−1 are turned on regardless of the threshold voltage Vth of the memory cells MC, that is, at which the memory cells MC0, MC2, . . . , MCn−1 are not programmed. A ground voltage Vss (for example, 0 V) is applied to the selection gate line SL1 disposed on the source line CELSRC side, and a power supply voltage Vcc is applied to the selection gate line SL2 disposed on the bit line BL side. 0V is applied to the bit line BL. The power supply voltage Vcc is applied to the source line CELSRC. In addition, a well voltage Vwell (for example, 0 V) is applied to a cell well.

By this, a high voltage is applied to the gate insulation film of the memory cell MC1, and electrons in the cell wall tunnel out to the charge storage layer. As a result, electric charges are accumulated in the charge storage layer. As a result, the threshold voltage Vth of the memory cell MC1 is shifted to a positive voltage side.

Here, in a write sequence of a conventional nonvolatile semiconductor memory device, the program voltage Vpgm is stepped up each time the write loop is executed, and the passage voltage Vpass is kept. In this way, the write loop is repeatedly executed.

However, in this case, the difference between the program voltage Vpgm and the passage voltage Vpass increases as the write sequence progresses. In this case, in non-selected memory cells MC connected to the selected word line WL and the non-selected bit lines BL, the potential difference between the control gate and the channel increases, so that an erroneous write is likely to occur.

Therefore, a write sequence described below is considered means to solve such a problem.

Figure 5:
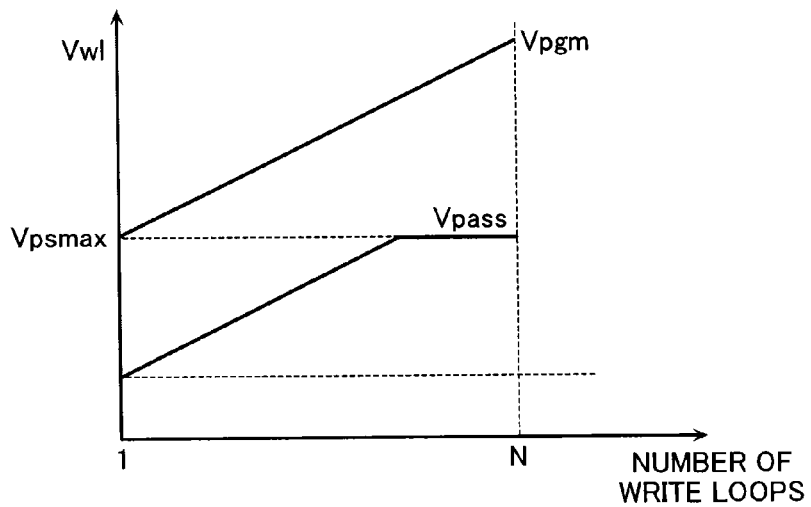
FIG. 5 is an example of a graph illustrating a relation between the number of write loops and each of a program voltage and a passage voltage in a nonvolatile semiconductor memory device according to a comparative example with respect to the first embodiment.

FIG. 5 is a graph illustrating an example of a relation between the number of write loops and each of a program voltage Vpgm and a passage voltage Vpass in a nonvolatile semiconductor memory device according to a comparative example with respect to the first embodiment.

In this write sequence, not only the program-voltage Vpgm but also the passage voltage Vpass is stepped up by a constant width each time a write loop is executed. Because of such a manner, the difference between the program voltage Vpgm and the passage voltage Vpass does not increase. Therefore, the problem that erroneous write to the non-selected memory cells MC connected to the selected word line WL and the non-selected bit lines BL occurs may be solved. However, because a large voltage (passage voltage Vpass) is applied to the control gates of the non-selected memory cells MC connected to the non-selected word lines WL and the selected bit line BL in such a case, the threshold voltage Vth of the non-selected memory cells MC is likely to change.

Figure 6:
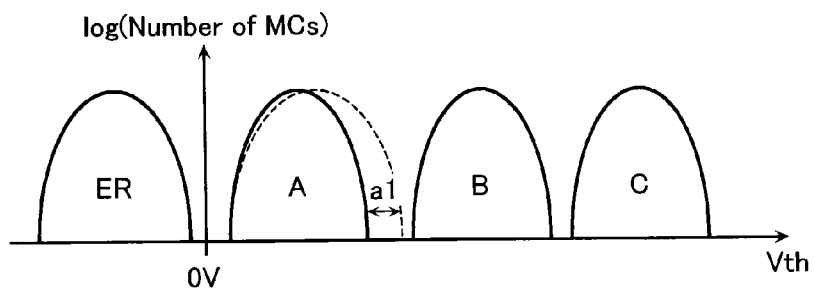
FIG. 6 is an example of a diagram illustrating a threshold distribution of a memory cell group after performing a write sequence in the nonvolatile semiconductor memory device according to the comparative example.

Therefore, there is a problem that especially a threshold distribution of a low level, for example, a threshold distribution of the A level easily increases as indicated by arrow al of FIG. 6.

Figure 7:
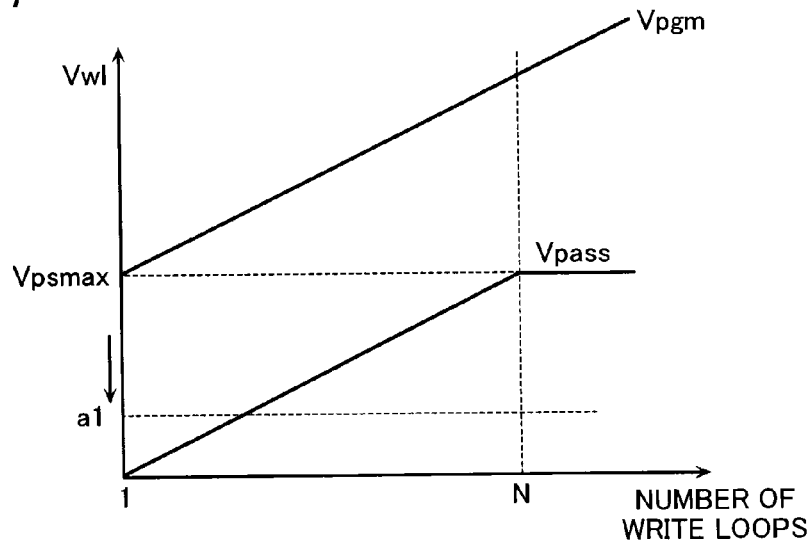
FIG. 7 is an example of a graph illustrating a relation between the number of write loops and each of a program voltage and a passage voltage in a nonvolatile semiconductor memory device according to another comparative example with respect to the first embodiment.

Therefore, a write sequence illustrated in FIG. 7 is considered one solution to such a problem. In the case of this write sequence, as indicated by arrow al of FIG. 7, the passage voltage Vpass is preset to a low level at an initial stage of the write sequence, and is then stepped up by a constant width each time a write loop is executed. The problem that a threshold distribution of a low level changes can be solved in this way.

However, in this case, because the initial value of the passage voltage Vpass is low, the number of the write loops is large to write data and therefore the processing time of the write sequence might increase.

Accordingly, the nonvolatile semiconductor memory device according to the first embodiment adopts a write sequence described below.

Figure 8:
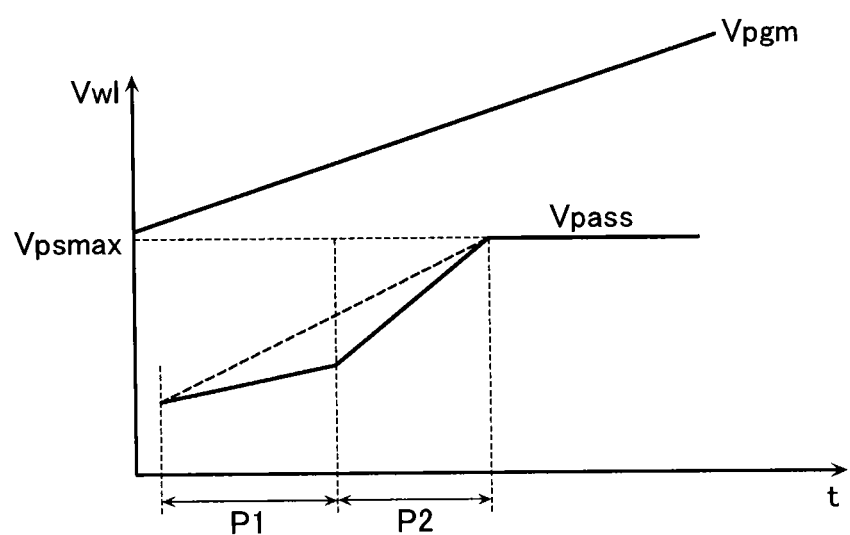
FIG. 8 is an example of a diagram to describe the principle of the write sequence of the nonvolatile semiconductor memory device according to the first embodiment.

FIG. 8 is an example of a diagram to describe the principle of a write sequence of the nonvolatile semiconductor memory device according to the present embodiment.

In the present embodiment, as illustrated in FIG. 8, in a write loop to be executed at an early stage of the write sequence, i.e., within a program period P1 during which a threshold voltage Vth of a low level is programmed, a step-up width of the passage voltage Vpass for each write loop is set to be small. On the other hand, within a program period P2 during which a threshold voltage of a high level is programmed, the step-up width of the passage voltage Vpass for each write loop is set to be larger than that of the program period P1. In the case of FIG. 8, at the end of the period P2, the passage voltage Vpass reaches a maximum passage voltage Vpsmax. Here, the maximum passage voltage Vpsmax is a passage voltage Vpass that if the potential difference between the non-selected word line WL and the channel increases to reach or exceed the voltage, a probability that erroneous write will occur in the non-selected memory cells MC becomes higher. Therefore, if the passage voltage Vpass is stepped up to exceed the maximum threshold voltage, the threshold voltage Vth of the non-selected memory cells MC connected to the non-selected word lines WL and the selected bit line BL will change. Therefore, the passage voltage Vpass is kept from being stepped up in the write loops subsequent to the period P2.

With this operation, the increase in effective program voltage Vpgm is suppressed during the period P1 as compared with the comparative example illustrated in FIG. 5. In addition, the threshold voltage Vth of a low level can be prevented from being changed and the increase in the threshold voltage Vth of a low level can be suppressed. Because the effective program voltage Vpgm is increased during the period P2 as compared with the comparative example illustrated in FIG. 7, the threshold voltage Vth of the selected memory cell MC easily changes to a desired threshold voltage Vth, and a time of the write sequence may shorten.

Next, a control method of the write sequence illustrated in FIG. 8 is described.

Figure 9:
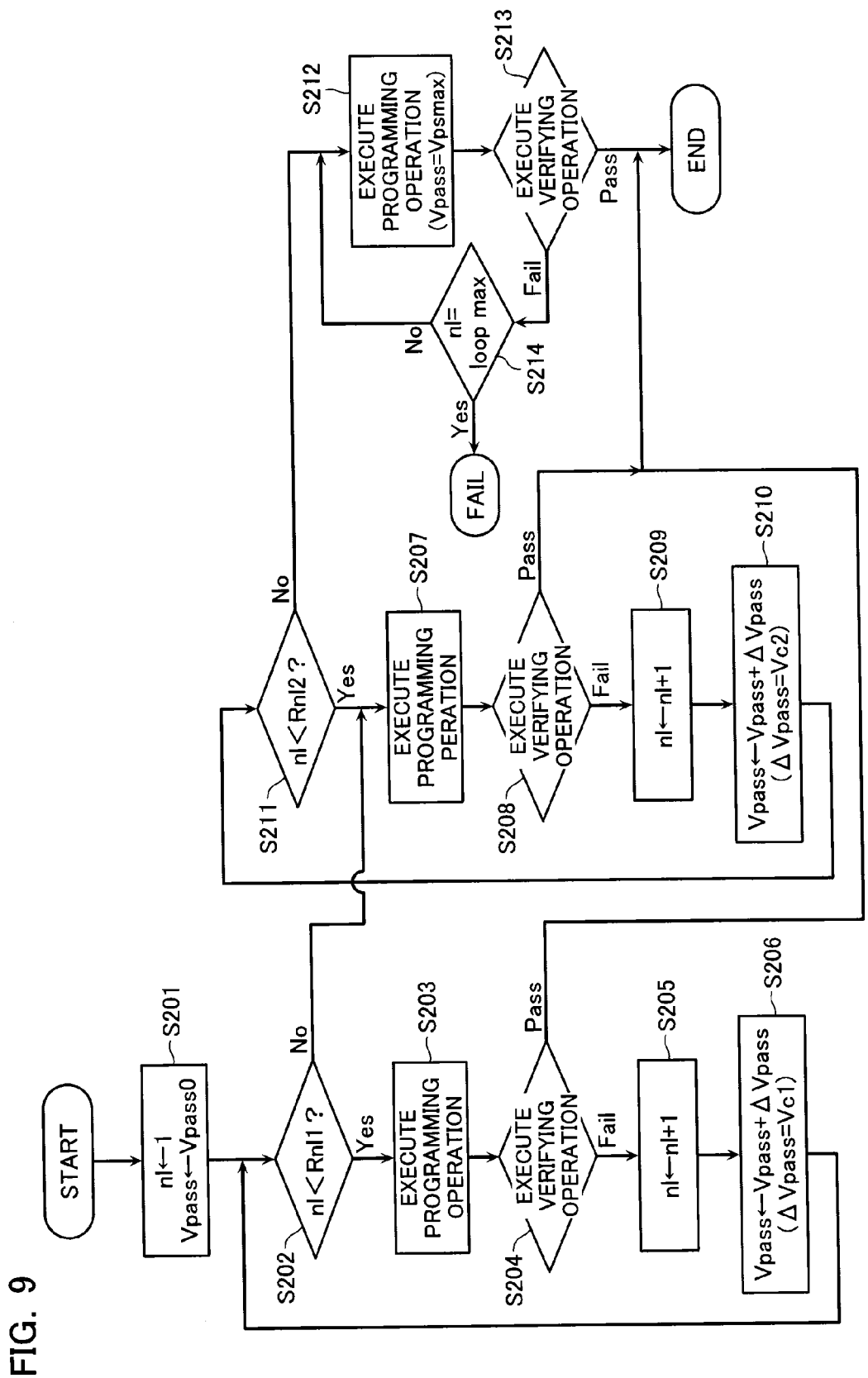
FIG. 9 is an example of a flowchart of the write sequence of the nonvolatile semiconductor memory device according to the first embodiment.

FIG. 9 illustrates an example of a flowchart of a write sequence when the step-up width ΔVpass of the passage voltage Vpass is controlled with the number of write loops. The operation of the flowchart is controlled, for example, by the sequence control circuit 7.

First, the number nl of write loops is initialized to 1 in Step S201. In addition, the passage voltage Vpass is initialized to an initial passage voltage Vpass0 (the initial passage voltage Vpass0 is, for example, 5 V).

It is determined whether the number of write loops nl satisfies a condition of nl<Rnl1 (Rnl1 is 10, for example) in Step S202. When it is nl<Rnl1 (Yes in S202), the programming operation is executed with the program voltage Vpgm and the passage voltage Vpass in Step S203. On the other hand, when it is n≥Rnl1 (No in S202), the processing proceeds to Step S207. Here, the number of write loops may be stored in a latch disposed in the NAND chip 10.

The verifying operation is executed in Step S204. When all the memory cells pass the verification in Step S204 (Pass in S204), the operation ends. On the other hand, when some memory cells fail to pass (Fail in S204), the number nl of write loops is incremented in Step S205.

ΔVpass is added to the passage voltage Vpass in Step S206. Here, the ΔVpass is a voltage Vc1. The program voltage Vpgm is stepped up by ΔVpgm in this case. Subsequently, the processing is returned to Step S202.

The programming operation is executed with the program voltage Vpgm and the passage voltage Vpass in Step S207.

The verifying operation is executed in Step S208. When all the memory cells pass the verification in Step S208 (Pass in S208), the operation ends. On the other hand, when some memory cells fail to pass (Fail in S208), the number nl of write loops is incremented in Step S209.

The ΔVpass is added to the passage voltage Vpass in Step S210. Here, the ΔVpass is a voltage Vc2 (>voltage Vc1). The program voltage Vpgm is stepped up by ΔVpgm.

It is determined whether the number nl of write loops satisfies a condition of, for example, nl<Rnl2 (Rnl2 is 15, for example) in Step S211. When it is nl<Rnl2 (Yes in S211), the programming operation is executed with the program voltage Vpgm and the passage voltage Vpass again in Step S207. On the other hand, when it is nl≥Rnl2 (No in S211), the processing proceeds to Step S212. In addition, it is Rnl1<Rnl2.

The programming operation is executed with the program voltage Vpgm and the passage voltage Vpass in Step S212. Here, the passage voltage Vpass is set to the maximum passage voltage Vpsmax. That is, the passage voltage Vpass is not stepped up in the subsequent programming operation.

The verifying operation is executed in Step S213. It is determined whether the programming is completed (whether all memory cells has passed) in the verifying operation. When it is determined to be completed (Pass in S213), the write sequence ends. When it is determined not to be completed (Fail in S213), it is determined whether the number nl of write loops ("loop max" in the drawing) has reached a maximum loop count in Step S214. When the number nl of write loops has reached the maximum loop count in Step S214, write failure is determined and the write sequence ends. On the other hand, when the number of write loops has not reached the maximum loop count, the processing is returned to Step S212. In this case, the program voltage Vpgm is stepped up by ΔVpgm, but the passage voltage Vpass is not stepped up.

Figure 10:
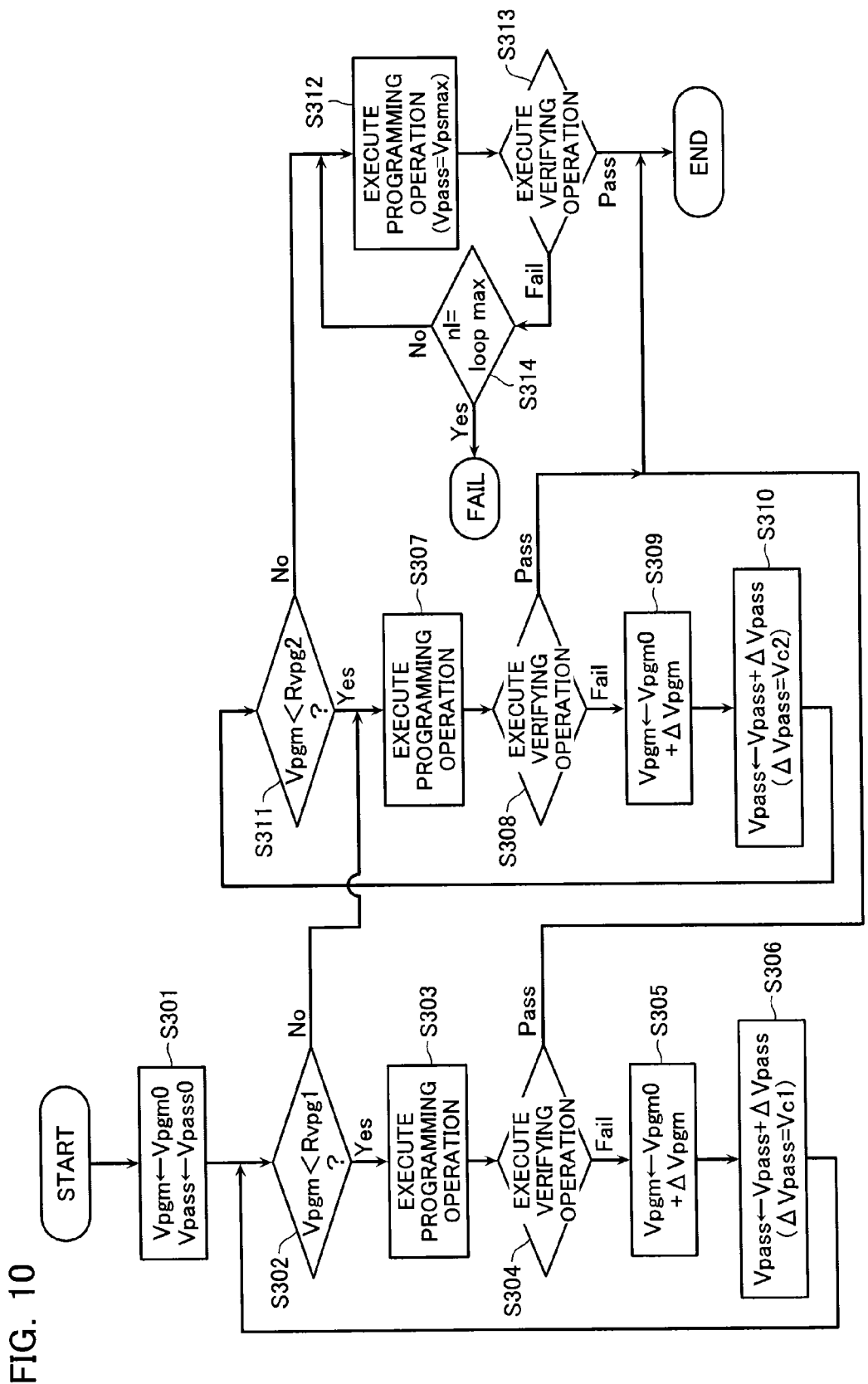
FIG. 10 is an example of a flowchart of the write sequence of the nonvolatile semiconductor memory device according to the first embodiment.

FIG. 10 is an example of a flowchart of a write sequence when the step-up width ΔVpass of the passage voltage Vpass is controlled with the program voltage Vpgm. The operation of the flowchart is controlled, for example, by the sequence control circuit 7.

First, the program voltage Vpgm is initialized to a predetermined voltage Vpgm0 (Vpgm0 is, for example, 13 V) in Step S301. In addition, the passage voltage Vpass is initialized to an initial passage voltage Vpass0 (the initial passage voltage Vpass0 is, for example, 5 V).

In Step S302, it is determined whether the program voltage Vpgm satisfies a condition of Vpgm<Rvpg1 (Rvpg1 is, for example, 15 V). When it is Vpgm<Rvpg1 (Yes in S302), the processing proceeds to Step S303, but when it is Vpgm≥Rvpg1 (No in S302), the processing proceeds to Step S307.

Steps S303 and S304 are performed. Since, the contents of these steps are the same as the contents of Steps S203 and S204 of FIG. 9, the detailed description thereof is not repeated.

In Step S305, the program voltage Vpgm is stepped up by a predetermined voltage ΔVpgm. After that, Step S306 which is the same as Step S206 of FIG. 9 is performed, and then the processing is returned to Step S302.

Since Steps S307 and S308 are the same as Steps S207 and S208 of FIG. 9, the detailed description thereof is not repeated.

In Step S309, the program voltage Vpgm is stepped up by a voltage ΔVpgm. Step S310 which is the same as Step S210 of FIG. 9 is performed.

In Step S311, it is determined whether the program voltage Vpgm satisfies a condition of Vpgm<Rvpg2 (Rvpg2 is, for example, 17 V). When it is Vpgm<Rvpg2 (Yes in Step S311), the programming operation is executed with the program voltage Vpgm and the passage voltage Vpass again in Step 307. On the other hand, when it is Vpgm≥Rvpg2 (No in Step S311), the processing proceeds to Step S312. Further, it is Rvpg1<Rvpg2.

Since Steps S312 to 314 are the same as Steps S212 to S214 of FIG. 9, the detailed description thereof is not repeated.

Figure 11:
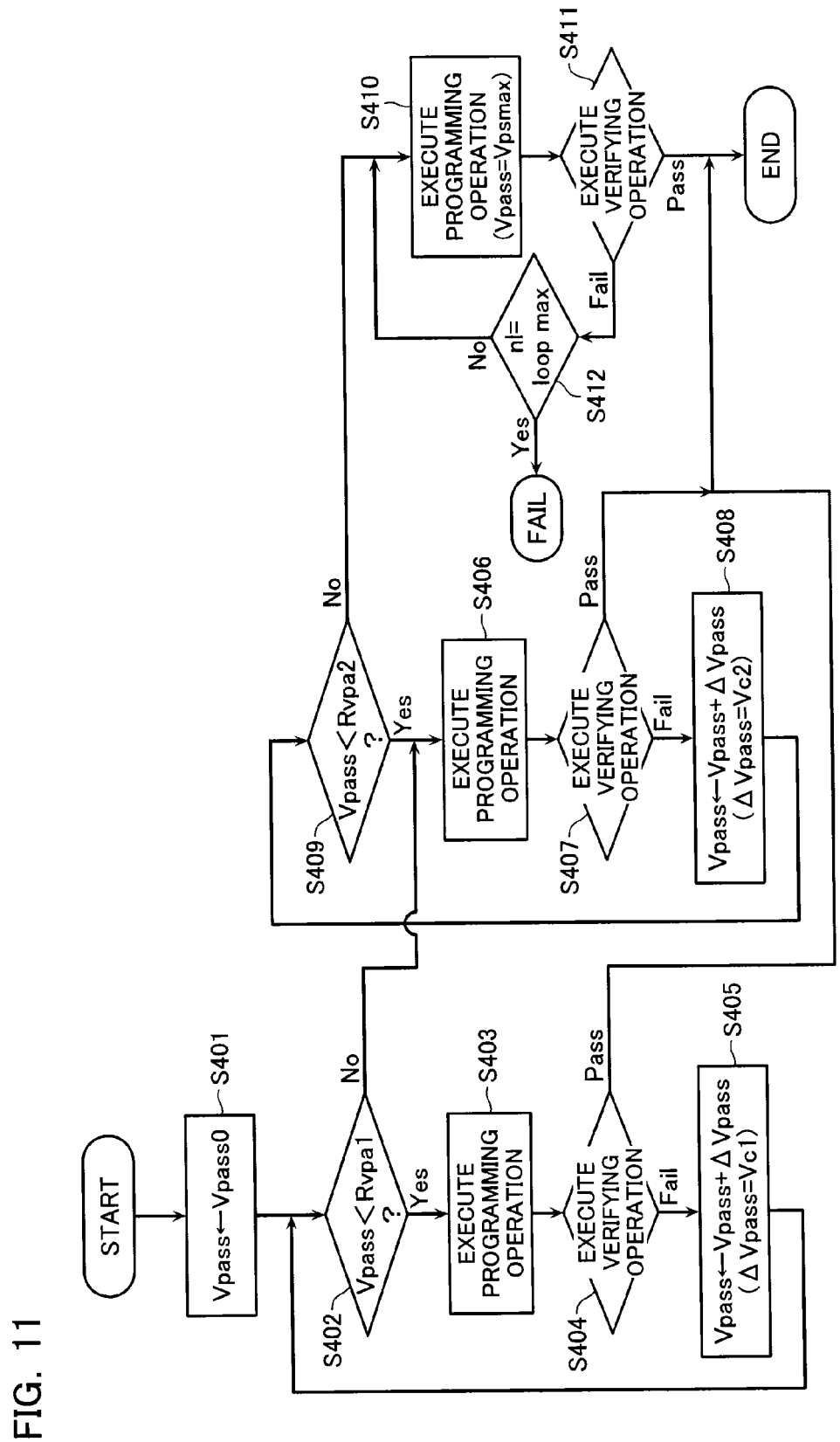
FIG. 11 is an example of a flowchart of the write sequence of the nonvolatile semiconductor memory device according to the first embodiment.

FIG. 11 is a flowchart of a write sequence when the step-up width ΔVpass of the passage voltage Vpass is controlled with the passage voltage Vpass. The operation of the flowchart is controlled, for example, by the sequence control circuit 7.

First, in Step S401, the passage voltage Vpass is initialized to an initial passage voltage Vpasss0 (initial passage voltage Vpass0 is 5 V, for example).

In Step S402, it is determined whether the passage voltage Vpass satisfies a condition of Vpass<Rvpa1 (Rvpa1 is, for example, 7 V). When it is Vpass<Rvpa1 (Yes in S402), the processing proceeds to Step S403. However when it is Vpass≥Rvpa1 (No in S402), the processing proceeds to Step S406.

Since Steps S403, S404, and S405, which are to be performed subsequently, are the same as Steps S203, S204, and S206 of FIG. 9, respectively, the detailed description thereof is not repeated.

Since Steps S406, S407, and S408 are the same as Steps S207, S208, and S210 of FIG. 9, respectively, the detailed description thereof is not repeated.

In Step S409, it is determined whether the pass voltage Vpass satisfies a condition of Vpass<Rvpa2 (Rvpa2 is, for example, 9 V). When it is Vpass<Rvpa2 (Yes in Step S409), the programming operation is executed with the program voltage Vpgm and the passage voltage Vpass again in Step 406. On the other hand, when it is Vpass≥Rvpa2 (No in Step S409), the processing proceeds to Step S410. Further, it is "Rvpa1<Rvpa2".

Because Steps S410 to 412 are the same as Steps S212 to S214 of FIG. 9, the detailed description thereof is not repeated.

Next, the write sequence according to the present embodiment may be applied to a nonvolatile semiconductor memory device with memory cells of a 2 bits-per-cell type is described. For example, the case of the U-page writing of FIG. 3 is assumed.

Figure 12:
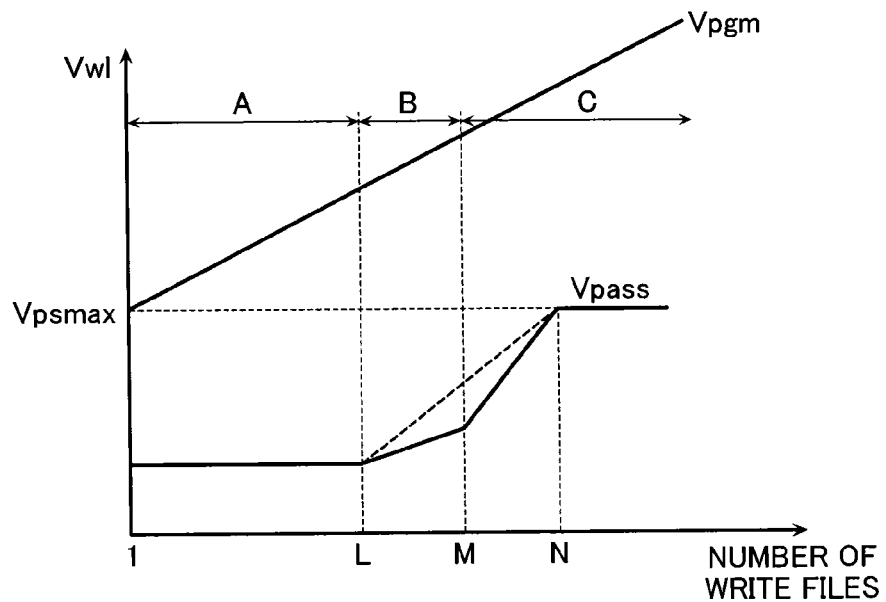
FIG. 12 is an example of a graph illustrating a relation between the number of write loops and each of a program voltage and a passage voltage during the write sequence of the nonvolatile semiconductor memory device according to the first embodiment.
Figure 13:
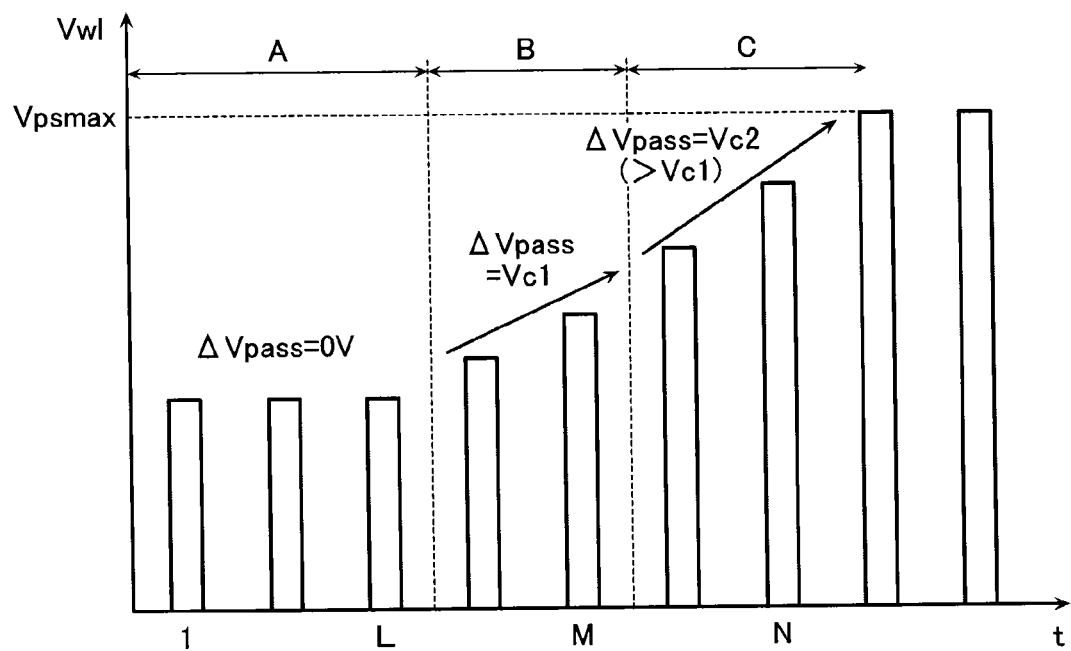
FIG. 13 is an example of a graph illustrating a passage voltage during the write sequence of the nonvolatile semiconductor memory device according to the first embodiment.

FIG. 12 is an example of a graph illustrating a relation between the number of write loops and each of a program voltage Vpgm and a passage voltage Vpass during a write sequence for the memory cell MC of a 2 bits-per-cell type. FIG. 13 is a graph illustrating the passage voltage Vpass in the case of FIG. 12.

First to L-th write loops (L is 5, for example) of an early stage serves as a program period of an A level. Here, a step-up width ΔVpass of the passage voltage Vpass is set to 0 V.

The subsequent L+1-th to M-th write loops (M is 10, for example) serves as a program period of a B level. Here, the step-up width ΔVpass of the passage voltage Vpass is set to a constant voltage Vc1.

M+1-th and the subsequent write loops serve as a program period of a C level. Here, the step-up width ΔVpass of the passage voltage Vpass is set to a constant voltage Vc2 which is higher than the voltage Vc1. In addition, in the case of FIGS. 12 and 13, the passage voltage Vpass will reach the maximum passage voltage Vpsmax in an N-th write loop (N is 15, for example). Therefore, if the passage voltage Vpass is stepped up by the voltage Vc2 in the N+1-th and subsequent write loops, the threshold voltage Vth of the non-selected memory cells MC, to which the passage voltage Vpass is applied, changes in the same manner as a case where the program voltage Vpgm is applied. Therefore, the passage voltage Vpass is not stepped up in the N+1-th and subsequent write loops.

As described above, in the write sequence of the present embodiment, the step-up width ΔVpass is switched such that the step-up width ΔVpass increases two times, that is, it is increased after the L-th write loop in which the programming of the A level is completed is performed, and after the M-th write loop in which the programming of the B level is completed is performed.

That is, when a difference (step-up width) between the passage voltage Vpass used in the n-th write loop and the passage voltage Vpass used in the n+1-th write loops is expressed as ΔVn, it can be put in such a way that a data writing unit executes a write loop using the passage voltage Vpass where ΔV (L−1)<ΔVL, ΔVL≤ΔV (M−1), and ΔV (M−1)<ΔVM.

Thus, in the case of the embodiment illustrated in FIGS. 12 and 13, broadening of the threshold distribution of the A level is suppressed by using a lower passage voltage Vpass in a program period of the A level. On the other hand, in a program periods of the B level and a program period of the C level during which the threshold voltage Vth is difficult to change, the passage voltage Vpass is stepped up in different patterns depending on the level so that the threshold voltage Vth of the memory cells MC is made easily changeable.

Next, a control method of the write sequence illustrated in FIGS. 12 and 13 is described. The operation of the flowchart is controlled, for example, by the sequence control circuit 7.

Figure 14:
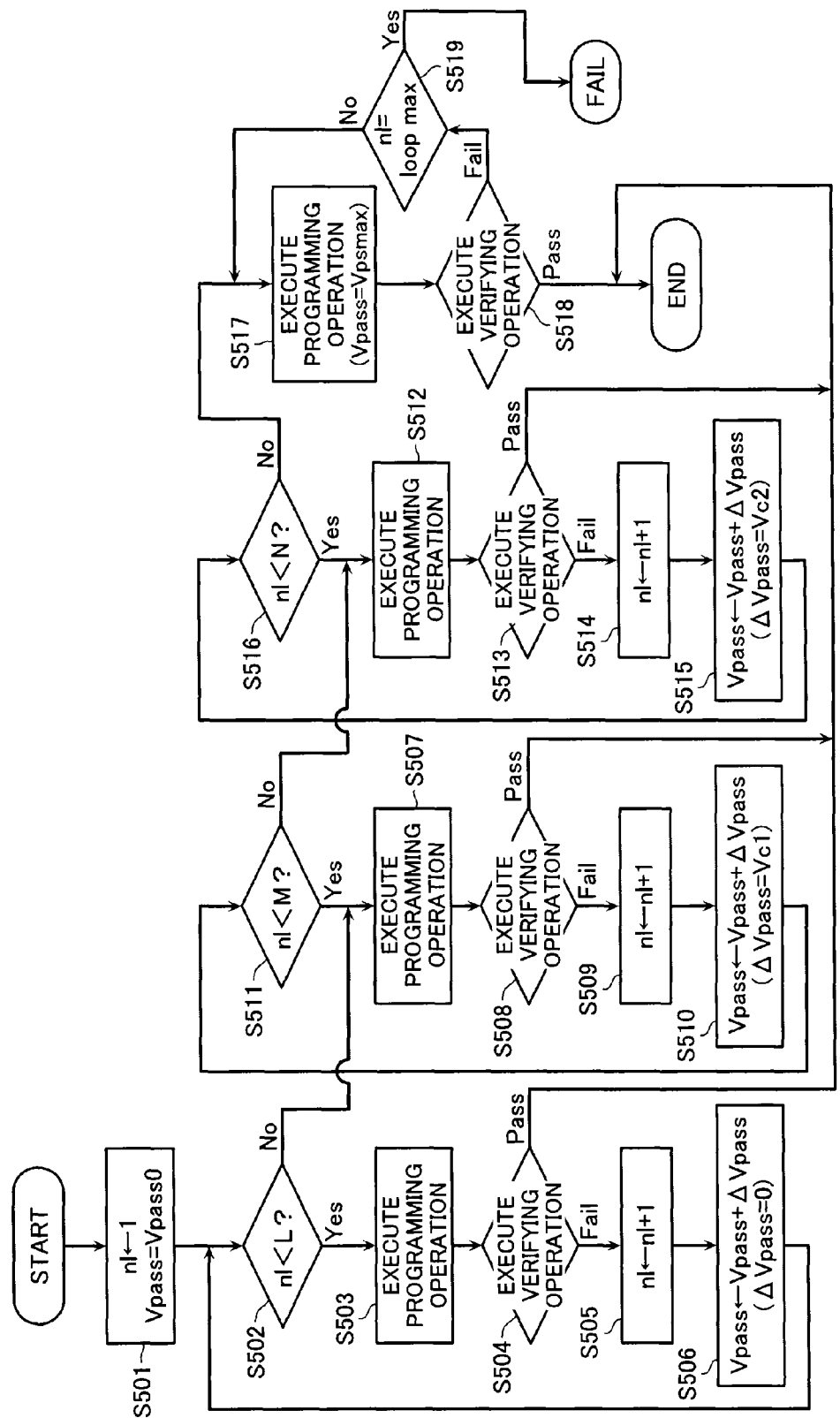
FIG. 14 is an example of a flowchart of the write sequence of the nonvolatile semiconductor memory device according to the first embodiment.

FIG. 14 is an example of a flowchart of a write sequence when the step-up width ΔVpass of the passage voltage Vpass is controlled with the number nl of write loops. Here, the number of write loops may be stored in a latch or the like disposed in the NAND chip 10.

First, the number nl of write loops is initialized to 1 in Step S501. In addition, the passage voltage Vpass is initialized to an initial passage voltage Vpass0 (the initial passage voltage Vpass0 is, for example, 5 V).

It is determined whether the number nl of write loops satisfies a condition of, for example, nl<L (L is 5, for example) in Step S502. When it is nl<L (Yes in S502), the programming operation is executed with the program voltage Vpgm and the passage voltage Vpass in Step S503. On the other hand, when it is nl≥L (No in S502), the processing proceeds to Step S507.

The verifying operation is executed in Step S504. When all the memory cells pass the verification in Step S504 (Pass in S504), the operation ends. On the other hand, when some memory cells fail to pass (Fail in S504), the number nl of write loops is incremented in Step S505.

The ΔVpass is added to the passage voltage Vpass in Step S506. However, here, the ΔVpass is 0 V and no processing is performed actually. That is, while the number of write loops nl satisfies a condition of nl<L, the passage voltage Vpass is not stepped up. The processing is returned to Step S502.

The programming operation is executed with the program voltage Vpgm and the passage voltage Vpass in Step S507.

The verifying operation is executed in Step S508. When all the memory cells pass the verification in Step S508 (Pass in S508), the operation ends. On the other hand, when some memory cells fail to pass (Fail in S508), the number nl of write loops is incremented in Step S509.

The ΔVpass is added to the passage voltage Vpass in Step S510. Here, the ΔVpass is a voltage Vc1. The program voltage Vpgm is stepped up by ΔVpgm in this case.

It is determined whether the number nl of write loops satisfies a condition of, for example, nl<M (M is 10, for example) in Step S511. When it is nl<M (Yes in S511), the programming operation is executed with the program voltage Vpgm and the passage voltage Vpass again in Step S507. On the other hand, when it is nl≥M (No in S511), the processing proceeds to Step S512.

The programming operation is executed with the program voltage Vpgm and the passage voltage Vpass in Step S512.

The verifying operation is executed in Step S513. When all the memory cells pass the verification in Step S513 (Pass in S513), the operation ends. On the other hand, when some memory cells fail to pass (Fail in S513), the number nl of write loops is incremented in Step S514.

The ΔVpass is added to the passage voltage Vpass in Step S515. Here, the ΔVpass is a voltage Vc2 (>voltage Vc1). The program voltage Vpgm is stepped up by ΔVpgm in this case.

It is determined whether the number nl of write loops satisfies a condition of, for example, nl<N (N is 15, for example) in Step S516. When it is nl<N (Yes in S516), the programming operation is executed with the program voltage Vpgm and the passage voltage Vpass again in Step S512. On the other hand, when it is nl≥N (No in S516), the processing proceeds to Step S517.

The programming operation is executed with the maximum program voltage Vpsmax in Step S517.

The verifying operation is executed in Step S518. It is determined whether the programming is completed (whether all memory cells has passed) in the verifying operation. When it is determined to be completed (Pass in S518), the write sequence ends. When it is determined not to be completed (Fail in S518), it is determined whether the number nl of write loops ("loop max in the drawing") has reached a maximum loop count in Step S519. When the number nl of write loops has reached the maximum loop count in Step S519, write failure is determined and the write sequence ends. On the other hand, when the number of write loops has not reached the maximum loop count, the processing is returned to Step S517. In this case, the program voltage Vpgm is stepped up by ΔVpgm, but the passage voltage Vpass is not stepped up.

Although the write sequence illustrated in FIG. 14 was connected with a case where the step-up width ΔVpass of the passage voltage Vpass is controlled with the number of write loops, it also may be controlled with the program voltage Vpagm or the passage voltage Vpass like the case of FIGS. 10 and 11.

In addition, when the write sequence of the present embodiment is used, the increase in the threshold distribution of a lower level can be controlled as described above. Moreover, the following advantages also may be obtained.

Figure 15:
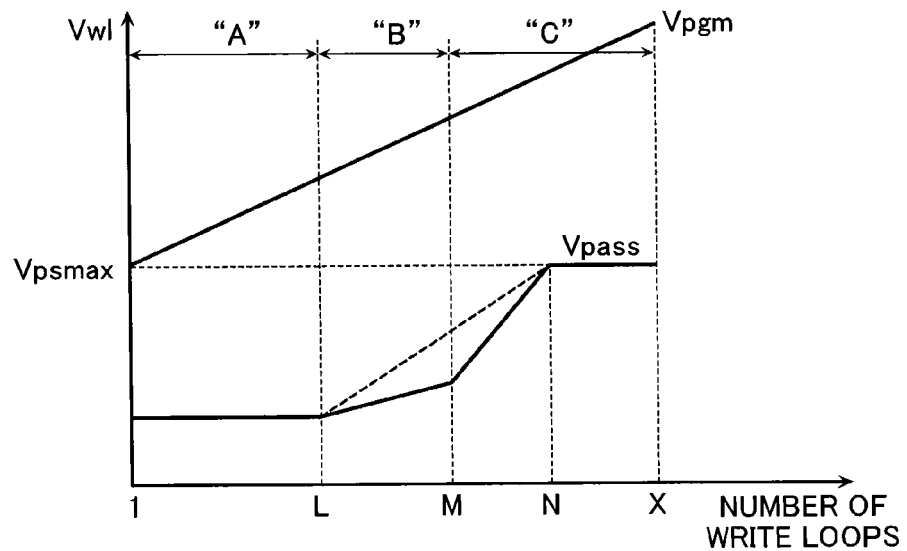
FIG. 15 is an example of a diagram to describe an effect of a programming operation of the nonvolatile semiconductor memory device according to the first embodiment.
Figure 16:
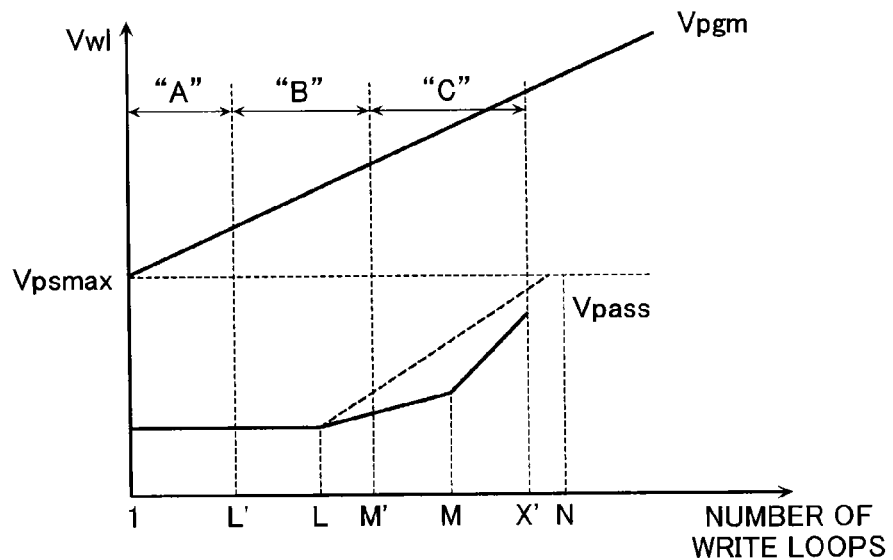
FIG. 16 is an example of a diagram to describe another effect of the programming operation of the nonvolatile semiconductor memory device according to the first embodiment.

FIGS. 15 and 16 are examples in which the program periods of the A level to the C level overlap unlike the graph of FIG. 12. FIG. 15 illustrates a memory cell MC (hereinafter, called "flesh cell") in which the number of writing/erasing cycles is small, FIG. 16 illustrates a memory cell MC (hereinafter, called "cycled cell") in which the number of writing/erasing cycles is large.

In the case of the write sequence of the flesh cell, as illustrated in FIG. 15, the programming of the A level is completed by an L-th write loop (L is 5, for example), the programming of the B level is completed by an M-th write loop (M is 10, for example), and the programming of the C level is completed by an X-th write loop (X is 15, for example).

On the other hand, in the case of the cycled cell, as illustrated in FIG. 16, the programming of the A level is completed by an L'-th write loop which leads the L-th write loop, the programming of the B level is completed by an M'-th write loop which leads the M-th write loop, and the programming of the C level is completed by an X'-th write loop which leads the X-th write loop. This is because the threshold voltage of the cycled cell is easy to increase than the flesh cell (hereinafter, this is expressed as "be easy to program" in some cases).

That is, in the cases illustrated in FIGS. 15 and 16, the program period of the A level (first to L-th write loops) for the cycled cell corresponds to the program periods of the A level and the B level for the fresh cell. However, to be noted here is that the programming of the B level is programming for the memory cell MC which is easy to be programmed among the cycled cells. Similarly, the program period of the B level (L+1-th to M-th write loops) for the flesh cell corresponds to the program periods of the B level and the C level for the cycled cell. However, to be noted here is that the programming of the C level is programming for the memory cell MC which is easy to be programmed among the cycled cells. In addition, the program period of the C level (M-th and the subsequent write loops) for the flesh cell corresponds to the program periods of the C level for the cycled cell. However, to be noted here is that the programming for the C level is programming for the memory cell MC which is hard to be programmed among the cycled cells.

Figure 17:
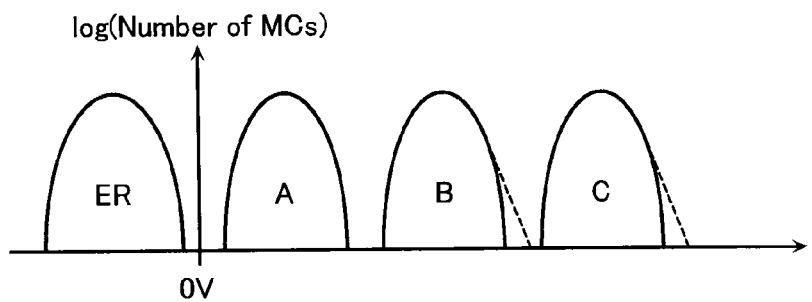
FIG. 17 is an example of a diagram to describe a further effect of the programming operation of the nonvolatile semiconductor memory device according to the first embodiment.

As described above, in the case of the write sequence illustrated in FIGS. 12 through 14, with regard to the cycled cell, the memory cell MC which is easy to be programmed by the programming of the B level is programmed by the write loops up to the L-th write loop in which the passage voltage Vpass is low and is not stepped up, and the memory cell MC which is easy to be programmed by the programming of the C level is programmed by the write loops up to the M-th write loop in which the step-up width ΔVpass of the passage voltage Vpass is low to be the voltage Vc1. As a result, over-programming of the B level and the C level for the cycled cell may be prevented. That is, it is possible to suppress upper skirts of the threshold distributions of the B level and the C level from broadening indicated by the dotted line of FIG. 17 in the write sequence of the present embodiment, and thus threshold distribution like one indicated by the solid line may be obtained.

As described above, according to the present embodiment, it is possible to suppress the threshold distribution of a low level from broadening without increasing the processing time of the write sequence by using the above-described write sequence. Moreover, with regard to the writing of data to the cycled cell, it is also possible to suppress the threshold distribution of a high level from broadening.

Second Embodiment

Second to fourth embodiments described below are modifications of the first embodiment.

The second embodiment describes about a write sequence in which a passage voltage Vpass is exponentially stepped up each time a write loop is executed.

Figure 18:
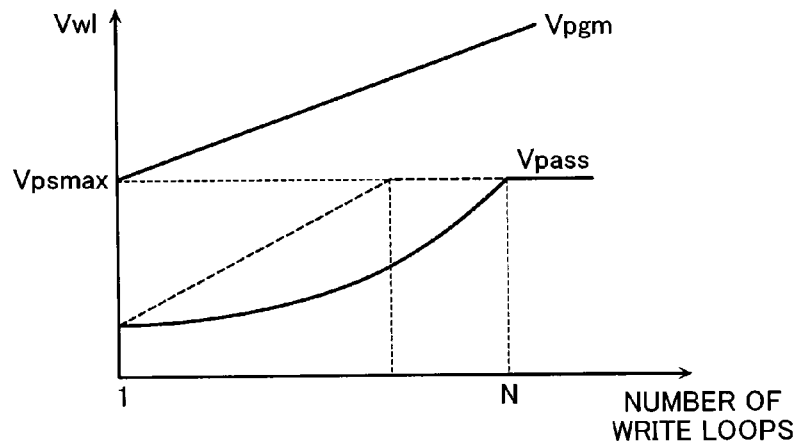
FIG. 18 is an example of a graph illustrating a relation between the number of write loops and each of a program voltage and a passage voltage during a write sequence of a nonvolatile semiconductor memory device according to a second embodiment.
Figure 19:
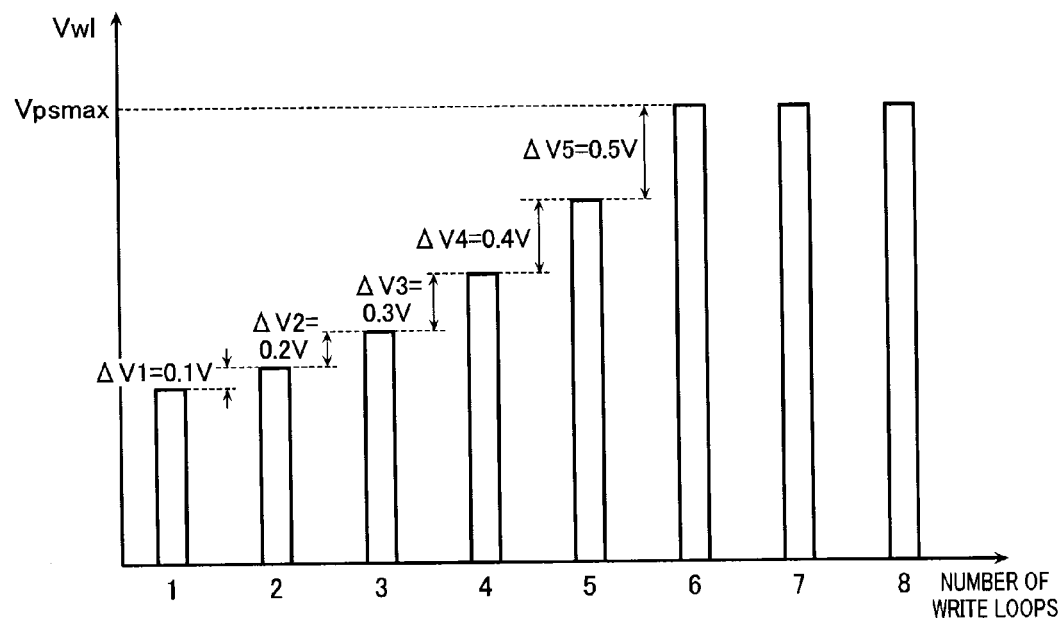
FIG. 19 is an example of a graph illustrating a passage voltage during the write sequence of the nonvolatile semiconductor memory device according to the second embodiment.
Figure 20:
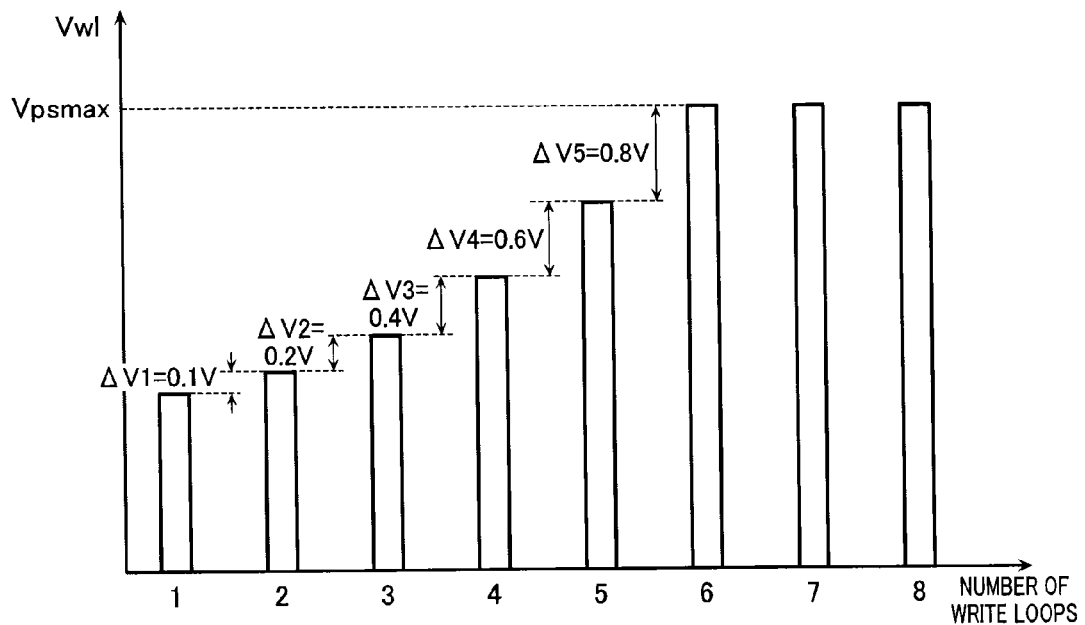
FIG. 20 is an example of a graph illustrating a passage voltage during the write sequence of the nonvolatile semiconductor memory device according to the second embodiment.

FIG. 18 is an example of a graph illustrating a relation between the number of write loops and each of a program voltage Vpgm and a passage voltage Vpass during a write sequence according to the present embodiment. FIGS. 19 and 20 are graphs that illustrate the behavior of the passage voltage Vpass for N=6 when the write sequence according to the present embodiment is used.

In the case of the present embodiment, as illustrated in FIG. 18, until reaching the N-th write loop in which the passage voltage Vpass reaches the maximum passage voltage Vpsmax, the write loop is repeatedly executed while the voltage is stepped up by an equal step-up width ΔVpass. Therefore, the maximum passage voltage Vpsmax is a voltage that if the passage voltage Vpass1 is stepped up to reach or exceed the maximum passage voltage Vpsmax, a threshold voltage Vth of non-selected memory cells MC connected to non-selected word lines WL and selected bit lines BL are highly likely to change. In addition, an initial voltage of the program voltage Vpgm (a voltage when the number of write loops is 1) is higher than the maximum passage voltage Vpsmax in many cases. However, the program voltage Vpgm may be set to be equal to the maximum passage voltage Vpsmax, or may be set to be lower than the maximum passage voltage Vpsmax.

Specifically, in the case of the present embodiment, as illustrated in FIG. 19, until reaching the sixth write loop in which the passage voltage Vpass reaches the maximum passage voltage Vpsmax, the write loop is repeatedly executed while stepping up the passage voltage Vpass by a step-up width ΔVpass of 0.1 V.

That is, when a difference (step-up width) between the passage voltage Vpass used in an n-th write loop and the passage voltage Vpass used in an n+1-th write loops is expressed as ΔVn, it can be put in such a way that a data writing unit executes the write loops using the passage voltage Vpass where ΔV1=0.1 V, ΔV2=0.2 V, . . . , ΔV5=0.5 V. When this is represented in a general form such that ΔVn=ΔV (n−1)+0.1.

FIG. 20 is an example of the write sequence according to the present embodiment.

In the case illustrated in FIG. 20, the write loops are repeatedly executed under the condition that the step-up width ΔVpass of the passage voltage Vpass is 0.1 V over the first and second write loops, but after that, the step-up width ΔVpass of the passage voltage Vpass itself is increased by 0.2 V until the sixth write loop in which the passage voltage Vpass reaches the lower limit of the program voltage Vpgm is executed.

The control of the step-up width ΔVpass of FIGS. 19 and 20 is performed by an operation of a logic circuit. The control also may be performed by storing variations in the step-up width ΔVpass to a ROM fuse in the NAND chip 10, or the like.

The easiness in programming the memory cells MC differs depending on the memory cell MC, and there are cases where the program periods of the respective levels are not clearly distinguished.

At this point, according to the present embodiment, the programming operation using a low passage voltage Vpass is performed on the memory cells MC which are easy to be programmed regardless of the threshold voltage to be programmed, and the programming operation using a high passage voltage Vpass is performed on the memory cells MC which are hard to be programmed. Therefore, as compared with the first embodiment, an optimal programming operation can be performed according to the program characteristics of memory cells.

Third Embodiment

A third embodiment is described in connection with a write sequence in which a passage voltage Vpass is stepped up by a fixed step-up width in write loops at an early stage, and a passage voltage Vpass is exponentially stepped up in the subsequent write loops.

Figure 21:
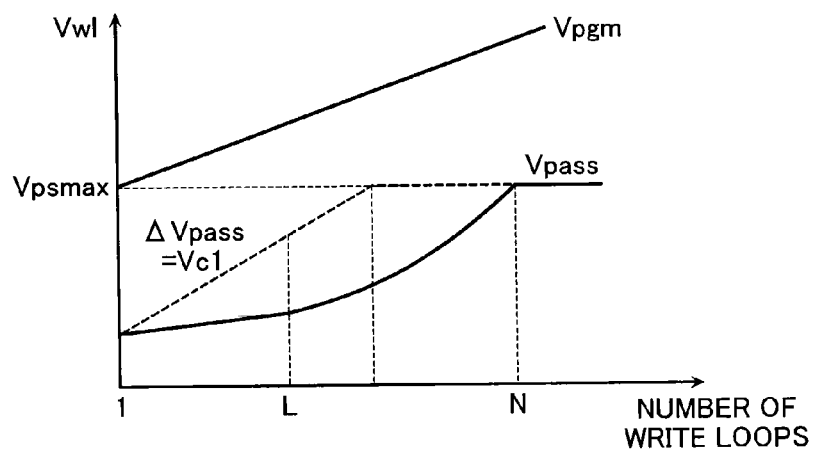
FIG. 21 is an example of a graph illustrating a relation between the number of write loops and each of a program voltage and a passage voltage during a write sequence of a nonvolatile semiconductor memory device according to a third embodiment.
Figure 22:
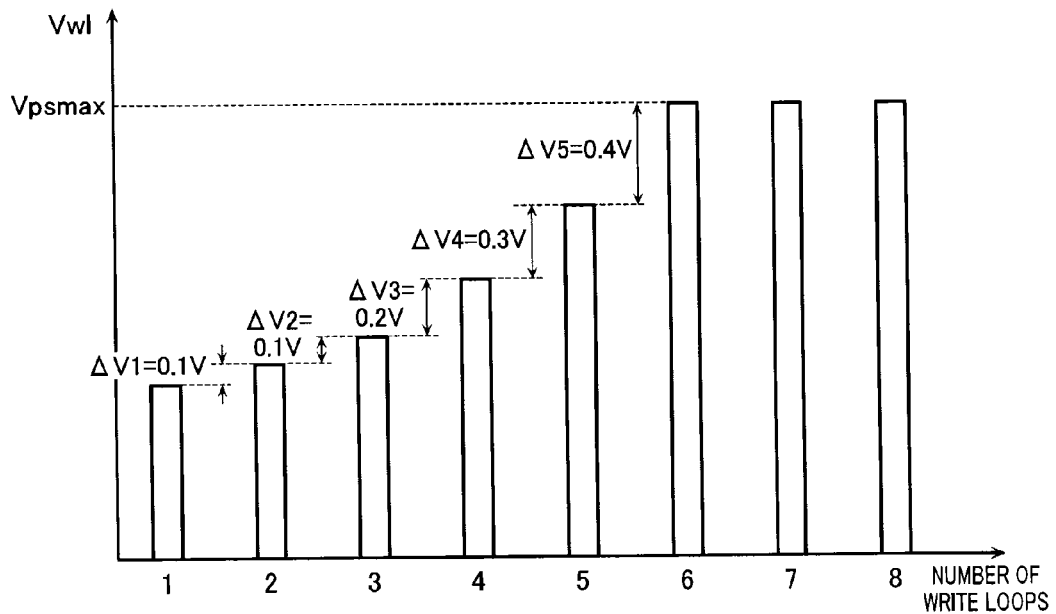
FIG. 22 is an example of a graph illustrating a passage voltage during the write sequence of the nonvolatile semiconductor memory device according to the third embodiment.

FIG. 21 is an example of a graph illustrating a relation between the number of write loops and each of the program voltage Vpgm and the passage voltage Vpass during the write sequence according to the present embodiment. FIG. 22 is a graph illustrating a relation of the passage voltages Vpass for L=2 and M=6 when the write sequence according to the present embodiment is used.

In the case of the present embodiment, as illustrated in FIG. 21, the write loops are repeatedly executed under the condition that the passage voltage Vpass is stepped up by a voltage Vc1 in the first through L-th write loops and the passage voltage Vpass is stepped up by a variable step-up width ΔVpass which itself is stepped up in the L+1-th through the N-th write loops.

Specifically, in the case illustrated in FIG. 22, the write loop is repeatedly executed while stepping up the passage voltage Vpass by 0.1 V in a section of the first to second loops, and while stepping up the passage voltage Vpass by a step-up width ΔVpass which itself is increased by 0.1 V in a section of the third to sixth write loops.

That is, when a difference (step-up width) between the passage voltage Vpass used in an n-th write loop and the passage voltage Vpass used in an n+1-th write loop is expressed as ΔVn, it can be put in such a way that a data writing unit executes the write loops using the passage voltage Vpass where ΔV1=0.1 V, ΔV2=0.2 V, ΔV3=0.2V, ΔV4=0.3V, and ΔV5=0.5 V.

In the case of the present embodiment, in the program period of the threshold voltage of a low level, the programming operation is executed while the step-up of the passage voltage Vpass is suppressed so that, like the first embodiment, broadening of the threshold distribution of a low level may be suppressed. In the subsequent write loops, like the second embodiment, the programming operation may be executed using the optimal passage voltage Vpass according to the program characteristics of the memory cells.

Fourth Embodiment

Unlike the writing of FIG. 3, in a write sequence according to a fourth embodiment, writing is simultaneously performed on the memory cells in which the A through C levels are written, and the memory cells are sequentially write-protected (lockout operation) starting from the memory cell which reaches the corresponding level. This write-protected state may be achieved by changing the voltage of the bit line, for example, from 0 V to 2.5 V.

Figure 23:
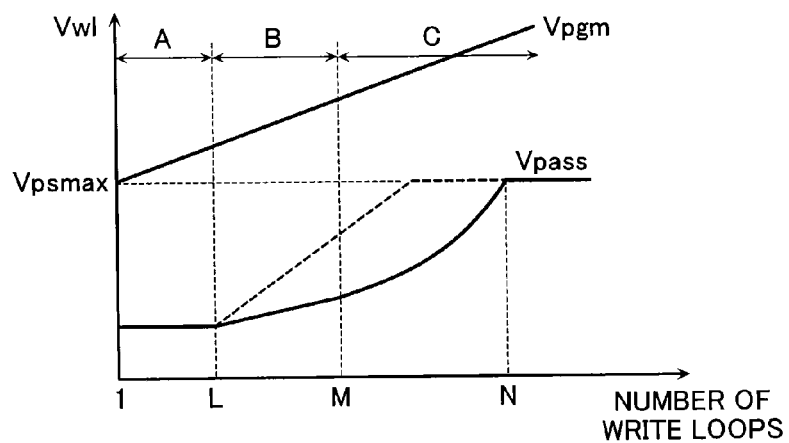
FIG. 23 is an example of a graph illustrating a relation between the number of write loops and each of a program voltage and a passage voltage during a write sequence of a nonvolatile semiconductor memory device according to a fourth embodiment.
Figure 24:
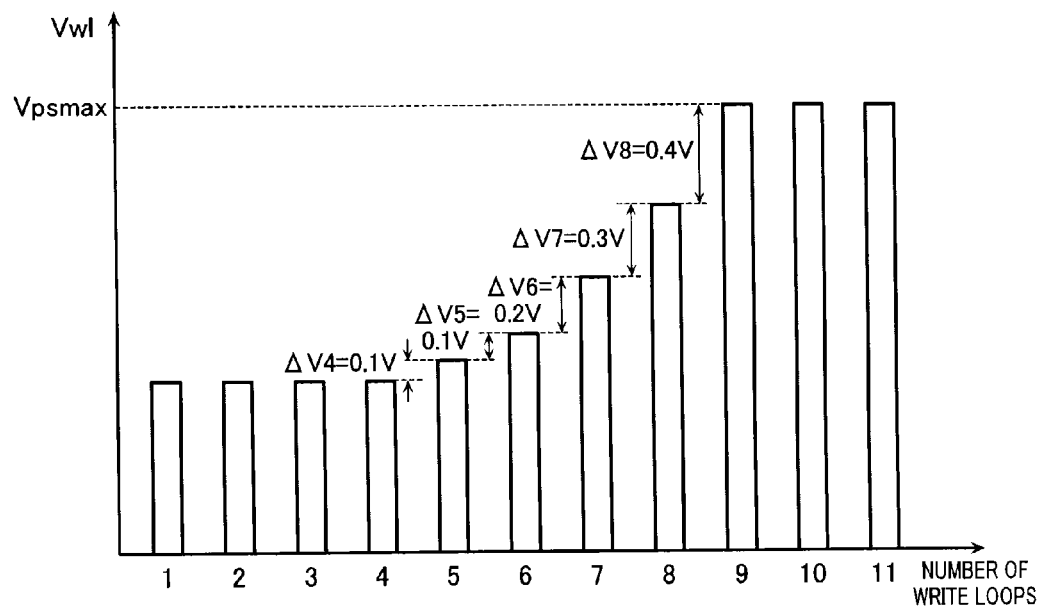
FIG. 24 is an example of a graph illustrating a passage voltage during the write sequence of the nonvolatile semiconductor memory device according to the fourth embodiment.

FIG. 23 is an example of a graph illustrating a relation between the number of write loops and each of a program voltage Vpgm and a passage voltage Vpass during a write sequence according to the present embodiment. FIG. 24 is a graph illustrating the passage voltages Vpass when the write sequence according to the present embodiment is used.

Here, a program period of the A level is a period until the memory cell in which the A level is written passes the verification, and a program period of the B level is a period until the memory cell in which the B level is written passes the verification, and a program period of the C level is a period until the memory cell in which the C level is written passes the verification. At this embodiment, in the program period of the A level, the memory cells in which the B and C levels are written at the same time. And, in the program period of the B level, the memory cells in which the C level are written at the same time.

In the case of the present embodiment, as illustrated in FIG. 23, a programming operation is executed without stepping up the passage voltage Vpass in the first through L-th write loops that correspond to the program period of the A level, and the programming operation is executed while stepping up the passage voltage Vpass by a predetermined voltage Vc1 in the L+1-th through M-th write loops that correspond to the program period of the B level. Then, the programming operation is executed while exponentially stepping up the passage voltage Vpass in the M+1-th through N-th write loops which correspond to the program period of the C level.

Specifically, in the case illustrated in FIG. 24, the programming operation is executed without stepping up the passage voltage Vpass in the first through fourth write loops that correspond to the program period of the A level, and the programming operation is executed while stepping up the passage voltage Vpass by 0.1 V in the fifth to sixth write loops which correspond to the program period of the B level. After that, the programming operation is executed while stepping up the passage voltage Vpass by a step-up width ΔVpass itself which is stepped up by 0.1 V in the seventh through ninth write loops which correspond to the program period of the C level.

That is, when a difference (step-up width) between the passage voltage Vpass used in an n-th write loop and the passage voltage Vpass used in an n+1-th write loop is expressed as ΔVn, it can be put in such a way that a data writing unit executes the write loops using the passage voltage Vpass where ΔV1 through ΔV3=0 V, ΔV4 and ΔV5=0.1 V, ΔV6=0.2 V, ΔV7=0.3 V, and ΔV8=0.4 V.

In the case of the present embodiment, the programming operation suitable for the threshold voltage to be programmed can be executed like the first embodiment in the program periods of the A level and the B level, and the programming operation suitable for the characteristics of the memory cells like the second embodiment can be executed in the program period of the C level.

Figure 25:
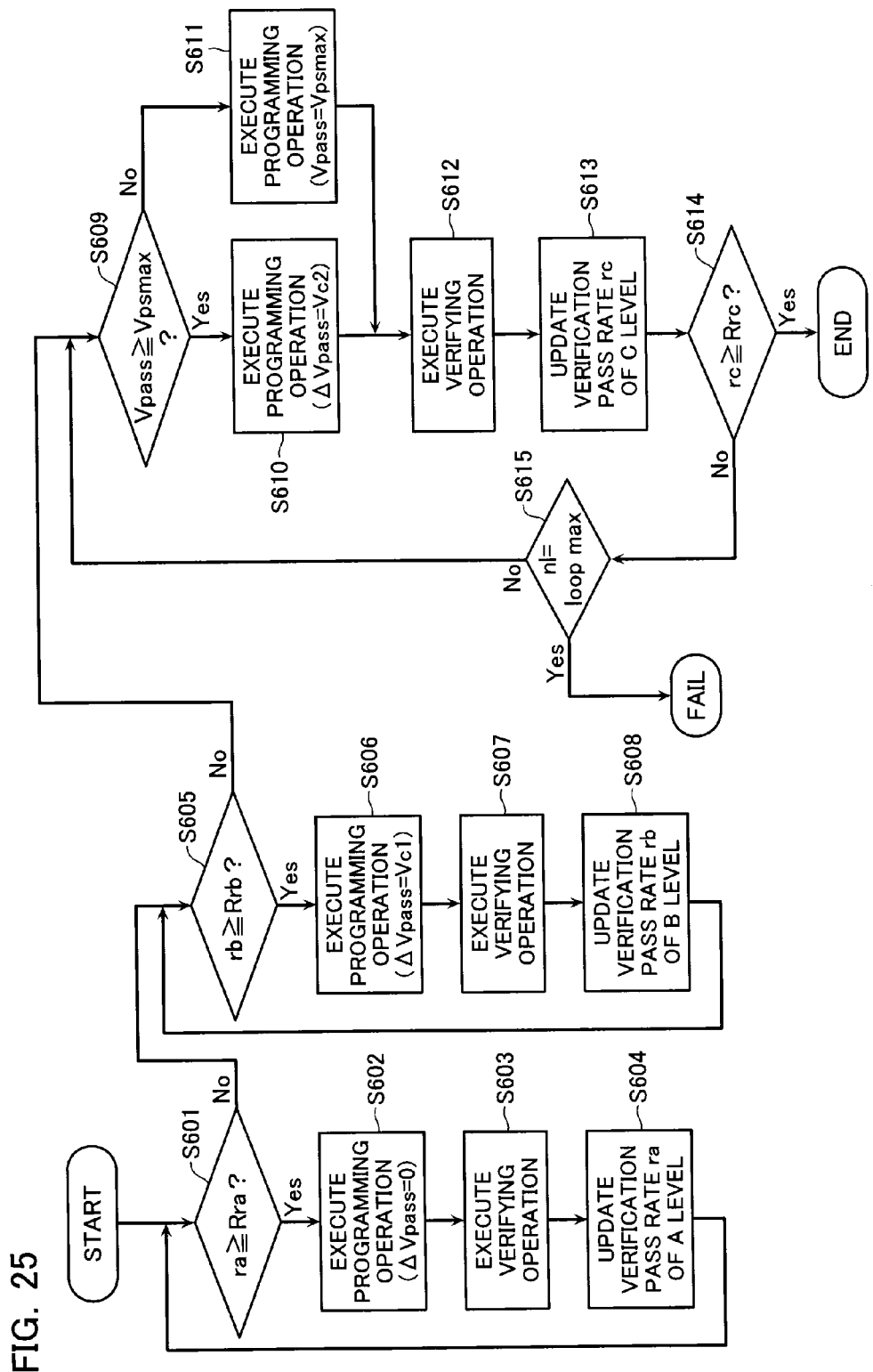
FIG. 25 is an example of a flowchart of the write sequence of the nonvolatile semiconductor memory device according to the fourth embodiment.

FIG. 25 is a flowchart of a write sequence when the step-up width ΔVpass of the passage voltage Vpass is controlled with a ratio (hereafter, referred to as "verification pass rate") of the number of memory cells that passed the verification among the memory cells MC which are targets to be programmed during the verifying operation. The flow chart of FIG. 25 illustrates the write sequence may be adopted the memory cells MC of a 2 bits-per-cell type. Here, with regard to the verification pass rate, the verification pass rate may be computed assuming that bits which can be recovered by ECC are passed bits.

First, it is determined whether the verification pass rate ra of the A level satisfies a condition of ra<Rra (Rra is 100%, for example) in Step S601. When it is ra<Rra, the processing proceeds to Step S602. On the other hand, when it is ra≥Rra, the processing proceeds to Step S605. The verification pass rate is not restricted to 100%, but a time until 70% of the memory cells written in the A level pass the verification is defined as the program period of the A level. Hereinafter, the verification pass rates of the B level and the C level can be similarly understood.

Steps, Steps S602 and S603, are the same as Steps S203 and S204 of FIG. 9, the detailed description thereof is not repeated. Memory cells which passed the verification of the A level in Step S603 are write-protected in the following programming operation.

In Step S604, the verification pass rate ra of the A level is updated based on the verification result of Step S603. The processing is returned to Step S601.

In Step S605, it is determined whether a verification pass rate ra of the B level satisfies a condition of rb<Rrb (Rrb is 100%, for example). When it is rb<Rrb, the processing proceeds to Step S606. On the other hand, when it is rb≥Rrb, the processing proceeds to Step S609.

Steps, Steps S606 and S607, are the same as Steps S207 and S208 of FIG. 9, the detailed description thereof is not repeated.

In Step S608, the verification pass rate rb of the B level is updated based on the verification result of Step S607. The processing is returned to Step S605.

In Step S609, it is determined whether the passage voltage Vpass has reached the maximum passage voltage Vpsmax. When the passage voltage Vpass has reached the maximum passage voltage Vpsmax, the processing proceeds to Step S511. On the other hand, when the passage voltage Vpass has not reached the maximum passage voltage Vpsmax, the processing proceeds to Step S610.

Because the subsequent steps, S610, S611, S612, and S613 are the same as Steps S207, S210, S211, and S214 of FIG. 9, respectively, the detailed description thereof is not repeated.

Lastly, in Step S614, it is determined whether a verification pass rate rc of the C level satisfies a condition of rc<Rrc (Rrc is 100%, for example). When it is rc<Rrc, the write sequence is completed. On the other hand, when it is rc≥Rrc, after determining whether the number nl of write loops has reached the maximum loop count ("loop max" in the drawing) in Step S615, the processing is returned to Step S609.

In this way, it is possible to respond to a collective writing method of writing A to C levels. As a result, the speed of the programming operation may be increased.

Fifth Embodiment

A fifth embodiment is a modification of the first embodiment.

According to the first embodiment, regardless of the number of the writing/erasing cycles, the step-up width ΔVpass of the passage voltage Vpass is changed with the number of write loops, the program voltage Vpgm, the passage voltage Vpass, or the verification pass rate. However, as described in the first embodiment, generally a memory cell tends to be easily programmed as the number of writing/erasing cycles increases.

Therefore, the present embodiment describes a write sequence which changes the determination criterion for switching the step-up width ΔVpass of the passage voltage Vpass according to the number of writing/erasing cycles.

Figure 26:
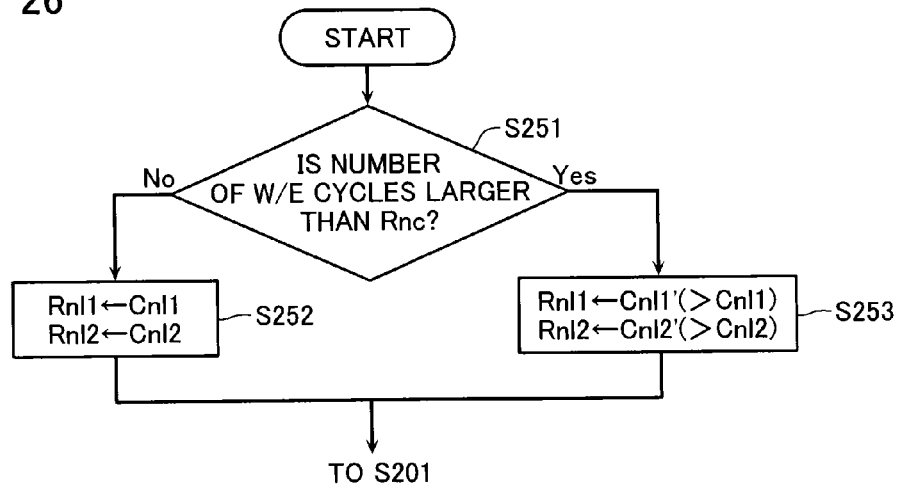
FIG. 26 is an example of a flowchart of a write sequence of a nonvolatile semiconductor memory device according to a fifth embodiment.

FIG. 26 is a part of a flowchart of a write sequence which switches the step-up width ΔVpass of the passage voltage Vpass according to the write loop, and is a process to be inserted between the start and Step S201 of the flowchart of FIG. 9.

In the case of FIG. 26, in Step S251, it is determined first whether the number of writing/erasing cycles is larger than a predetermined number Rnc of cycles. When the number of writing/erasing cycles is equal to or less than the number Rnc of cycles, the processing proceeds to Step S252, a reference number Rnl1 of write loops used in Step S202 of FIG. 9 is initialized to a setting number Cnl1 of loops, and the reference number Rnl2 of write loops used in Step S206 of FIG. 9 is initialized to a setting number Cnl2 of loops. On the other hand, when the number of writing/erasing cycles is larger than the setting number Rnc of cycles, the processing proceeds to Step S253, the reference number Rnl1 of write loops is initialized to a number Cnl1' of loops larger than the number Cnl1 of loops, and the reference number Rnl2 of write loops is initialized to a number Cnl2' of loops larger than the number Cnl2 of loops.

In addition, the number of writing/erasing cycles may be stored in a ROM fuse 12 in the NAND chip 10. In this case, the sequence control circuit 7 reads the number of writing/erasing cycles stored in the ROM fuse 12, and then Step S252 is performed. In addition, the number of writing/erasing cycles may be stored in the ROM fuse 12. In this case, the controller 11 or the sequence control 7 may send information on the number of writing/erasing cycles to the NAND chip 10 at timing shortly before or after sending a write command to the NAND chip 10.

In this way, with the increase in the number of writing/erasing cycles, assistance to the memory cells where the programming speed is increased can be weakened by delaying the step-up of the passage voltage Vpass. This may suppress the broadening of the threshold distribution after the write sequence.

FIG. 27 is a part of a flowchart of a write sequence which switches the step-up width ΔVpass of the passage voltage Vpass according to the program voltage Vpgm, and is a process to be inserted between the start and Step S301 of the flowchart of FIG. 10.

In the case of FIG. 27, first, it is determined whether the number of writing/erasing cycles is larger than the setting number Rnc of cycles in Step S351, and when it is determined that the number Rnc of writing/erasing cycles is equal to or less than the number Rnc of cycles, the processing proceeds to Step S352, the reference program voltage Rvpg1 used in Step S302 of FIG. 10 is initialized to a predetermined voltage Cvpg1, and the reference program voltage Rvpg2 used in Step S306 of FIG. 10 is initialized to a predetermined voltage Cvpg2. On the other hand, when the number of writing/erasing cycles is greater than the setting number Rnc of cycles, the processing proceeds to Step S353, the reference program voltage Vpgm1 is initialized to a setting voltage Vpg1' higher than the voltage Rvpg1, and the reference program voltage Rvpg2 is initialized to a setting voltage Vpg2' higher than the voltage Vpg2.

FIG. 28 is a part of a flowchart of a write sequence which switches the step-up width ΔVpass of the passage voltage Vpass according to the passage voltage Vpass, and is a process to be inserted between the start and Step S401 of the flowchart of FIG. 11.

In the case of FIG. 28, it is determined first whether the number of writing/erasing cycles is greater than the predetermined number Rnc of cycles in Step S451. When the number of writing/erasing cycles is equal to or less than the number Rnc of cycles, the processing proceeds to Step S452, a reference passage voltage Rvpa1 used in Step S402 of FIG. 11 is initialized to a setting voltage Cvpa1, and a reference passage voltage Rvpa2 used in Step S406 of FIG. 11 is initialized to a predetermined voltage Cvpa2. On the other hand, when the number of writing/erasing cycles is greater than the setting number Rnc of cycles, the processing proceeds to Step S453, the reference passage voltage Vpag1 is initialized to a setting voltage Cvpa1' higher than the voltage Rvpg1, and the reference passage voltage Rvpa2 is initialized to a setting voltage Cvpa2' higher than a voltage Cvpa2.

FIG. 29 is a specific example illustrating an example of a relation between the number of writing/erasing cycles and the determination condition of Steps S601, S605, and S614 of the flowchart illustrated in FIG. 25 in the write sequence which switches the step-up width ΔVpass of the passage voltage Vpass according to the verification pass rate.

For example, when the number Rnc of writing/erasing cycles is less than 100%, the determination condition of Step S601 is set to 100% of the verification pass rate of the A level, the determination condition of Step S605 is set to 100% of the verification pass rate of the B level, or the determination condition of Step S614 is set to 100% of the verification pass rate of the C level.

For example, when the number Rnc of writing/erasing cycles is less than 10000, the determination condition of Step S601 is set to 50% of the verification pass rate of the A level, the determination condition of Step S605 is set to 50% of the verification pass rate of the B level, or the determination condition of Step S614 is set to 100% of the verification pass rate of the C level.

In addition, when the number Rnc of writing/erasing cycles is equal to or greater than 10000, the determination condition of Step S601 is set to 75% of the verification pass rate of the B level, the determination condition of Step S605 is set to 75% of the verification pass rate of the B level, or the determination condition of Step S614 is set to 100% of the verification pass rate of the C level.

In this way, with the increase in the number of writing/erasing cycles, assistance to the memory cells where the programming speed is increased can be weakened by delaying the step-up of the passage voltage Vpass in each case of FIGS. 26 to 28 like the case of FIG. 25. This may suppress the broadening of the threshold distribution after the write sequence.

As described above, according to the present embodiment, not only the same effect as the first embodiment is obtained but also it is possible to suppress the threshold distribution from broadening even in a case where the program characteristics are changed due to the increase in the number of writing/erasing cycles by allowing the passage voltage Vpass to be suitably stepped up.

Sixth Embodiment

In the first embodiment, writing of data in the nonvolatile semiconductor memory device was described with reference to FIGS. 3 and 4. After discussing the problems arising during the writing of data with reference to FIGS. 5 to 7, the problems were solved by the first to fifth embodiments.

Incidentally, the following problem also may arise during the data writing aside from the above problems. That is, when not allowing data to be written in selected memory cells MCi (i=0 to n−1), in the programming operation, a power supply voltage Vdd is applied to the bit lines BL, that is, the channel voltage of the selected memory cells MCi is increased by so-called self-boosting so that injection of charges into the charge storage layer may be prevented. If the channel voltage of the selected memory cells MCi is low at this time, an erroneous write to the selected memory cells MCi becomes easy to occur.

Here, a programming operation of a self-boosting system (hereinafter, referred to as "SB system") is described.

In the programming operation of the SB system, the channel voltage of a NAND string is first made to enter a floating state, and the passage voltage Vpass is applied to the non-selected word lines WL. Then, if the voltage of the non-selected word lines WL reaches the passage voltage Vpass, the channel voltage of the NAND string rises. In this state, the program voltage Vpgm is applied to the selected word line WL. Under this circumstances, the channel voltage of the NAND string drops due to a leakage such as a junction leakage and an off leakage between selection gate transistors SG1 and SG2, for example. When a certain time passes after the application of the program voltage Vpgm, an end operation of the write sequence is to be ended. The voltages of the selected word line WL and the non-selected word line WL are lowered. After the voltage of the selected word line WL may be lowered to the passage voltage Vpass first, and then the voltage of the selected word line WL may be further lowered along with the decrease in the voltage of the non-selected word line WL.

The channel voltage of the NAND string drops due to coupling with the word line WL. In this way, in the programming operation of the SB system, because the channel voltage of the NAND string is boosted with the passage voltage Vpass of the non-selected word line WL, the erroneous write to the write-protected selected memory cells MC can be reduced.

As described above, the following write sequence is employed in the nonvolatile semiconductor memory device according to the present embodiment.

Figure 30:
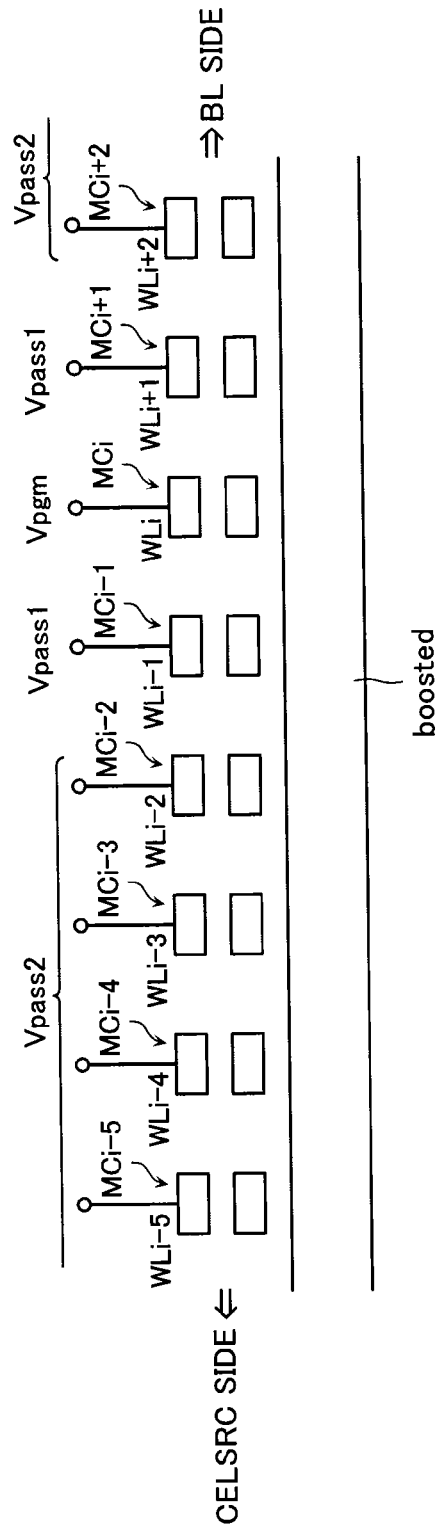
FIG. 30 is an example of a diagram illustrating a bias state of a memory cell array during a programming operation of a nonvolatile semiconductor memory device according to a sixth embodiment.

FIG. 30 is a diagram illustrating a bias state of a memory cell array during a programming operation of the present embodiment.

According to the present embodiment, during the programming operation, the selected word line WLi is applied with the program voltage Vpgm, the non-selected word lines WLi−1 and WLi+1 adjacent to the selected word line WLi are applied with the passage voltage Vpass1 (first passage voltage), and the other non-selected word lines WL0 to WLi−1 and WLi+1 to WLn−1 are applied with the passage voltage Vpass2 (second passage voltage). Here, the passage voltage Vpass1 is a voltage which is stepped up each time a write loop is executed. In addition, hereinbelow, the non-selected word line adjacent to the selected word line may be called an "adjacent word line".

Figure 31:
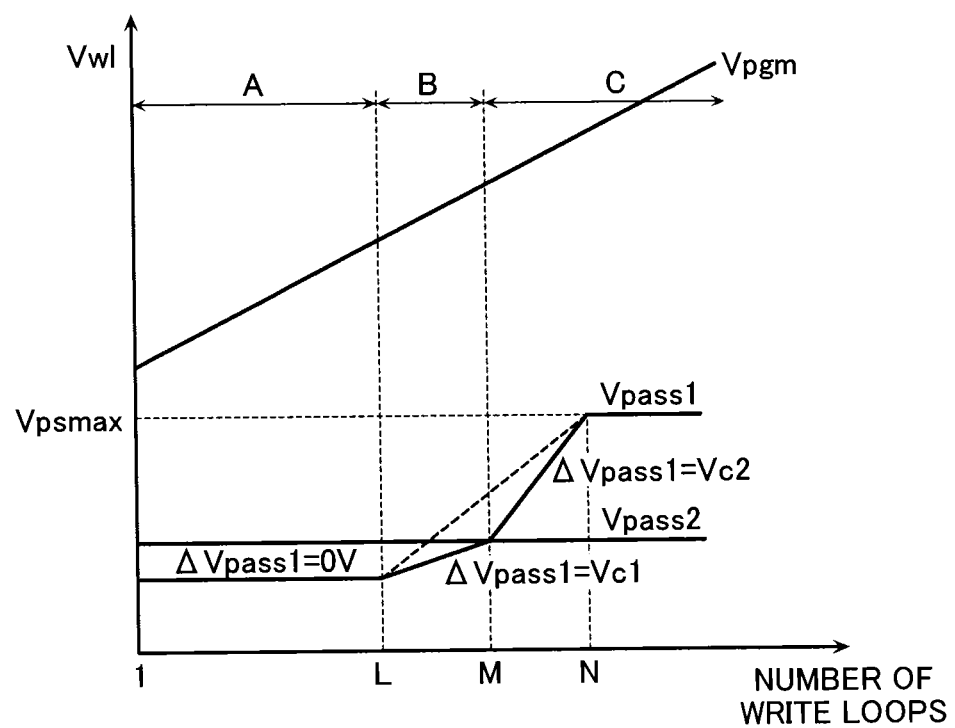
FIG. 31 is an example of a graph illustrating a relation between the number of write loops and each of a program voltage and a passage voltage during the write sequence of the nonvolatile semiconductor memory device according to the sixth embodiment.

FIG. 31 is an example of a graph illustrating a relation between the number of write loops and each of a program voltage and a passage voltage during a write sequence according to the present embodiment.

In the case of the write sequence of the present embodiment, the step-up width ΔVpass1 of the passage voltage Vpass1 is suppressed to be small in the write loops by which the threshold voltage Vth of a low level is programmed, and the step-up width ΔVpass1 of the passage voltage Vpass1 is adjusted to be large in the write loops by which the threshold voltage Vth of a high level is programmed. On the other hand, the passage voltage Vpass2 is kept a constant voltage higher than the minimum value of the passage voltage Vpass1 in all of the write loops.

In the case of the example illustrated in FIG. 31, the step-up width ΔVpass1 of the passage voltage Vpass1 is increased such that the step-up width ΔVpass1 of the passage voltage Vpass1 is 0 V in the first to L-th write loops by which the A level is programmed, Vc1 (Vc1>0) in the L+1-th to M-th write loops by which the B level is programmed, and Vc2 (Vc2>Vc1) in the M+1-th to N-th write loops by which the C level is programmed. In addition, even in this case, the threshold voltage Vpass1 is controlled not to reach or exceed the maximum passage voltage Vpsmax. In the write loop at an early stage of the write sequence by which the A level and the B level are programmed, the passage voltage Vpass2 is a voltage higher than the passage voltage Vpass1.

Next, a method of controlling the write sequence illustrated in FIG. 31 is described.

Figure 32:
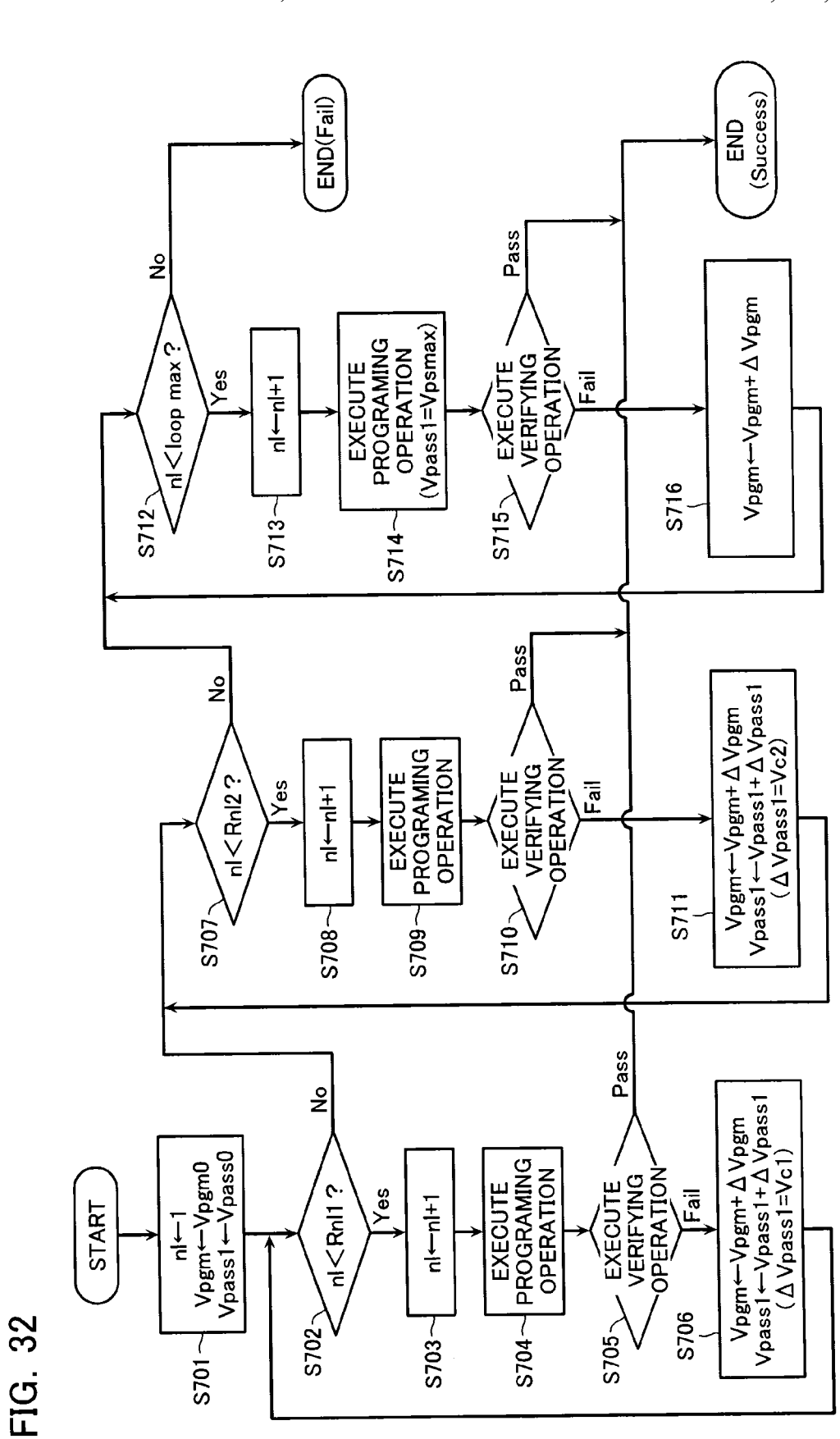
FIG. 32 is an example of a flowchart of the write sequence of the nonvolatile semiconductor memory device according to the sixth embodiment.

FIG. 32 is an example of a flowchart of a write sequence when the step-up width ΔVpass1 of the passage voltage Vpass1 is controlled with the number of write loops. The operation of the flowchart is controlled, for example, by the sequence control circuit 7.

First, the number nl of write loops is set (initialized) to 1 in Step S701. The program voltage Vpgm is set (initialized) to an initial program voltage Vpgm0 (Vpgm0 is, for example, 13 V). In addition, the passage voltage Vpass1 is set (initialized) to an initial passage voltage Vpass0 (Vpass0 is, for example, 5 V).

It is determined whether the number of write loops satisfies a condition of nl<Rnl1 (Rnl1 is 10, for example) in Step S702. When it is nl<Rnl1 (Yes in Step S702), after the number nl of write loops is incremented in Step S703, the programming operation is executed with the program voltage Vpgm, the passage voltage Vpass1, and the passage voltage Vpass2 in Step S704. On the other hand, when it is nl≥Rnl1 (No in S702), the processing proceeds to Step S707. Here, the number nl of write loops may be stored in a latch disposed in the NAND chip 10. The number nl of write loops also may be stored in the controller 11. The number nl of write loops also may be stored in a ROM fuse 12.

Subsequently, the verifying operation is executed in Step S705. When all the memory cells pass the verification in Step S705 (Pass in S705), the operation ends. On the other hand, when some memory cells fail to pass (Fail in Step S705), ΔVpass1 is added to the passage voltage Vpass1 in Step S706. Here, the ΔVpass1 is a voltage Vc1. The program voltage Vpgm is stepped up by ΔVpgm at this point in time. The processing is returned to Step S702.

It is determined whether the number nl of write loops satisfies, for example, a condition of nl<Rnl2 (Rnl2 is 15, for example) in Step S707. When it is nl<Rnl2 (Yes in Step S707), after the number nl of write loops is incremented in Step S708, the programming operation is executed with the program voltage Vpgm, the passage voltage Vpass1, and the passage voltage Vpass2 in Step S709. On the other hand, when it is nl≥Rnl2 (No in S707), the processing proceeds to Step S712. In addition, it is Rnl1<Rnl2.

The verifying operation is executed in Step S710. When all the memory cells pass the verification in Step S710 (Pass in S710), the operation ends. On the other hand, when some memory cells fail to pass (Fail in Step S710), the ΔVpass1 is added to the passage voltage Vpass1 in Step S711. Here, the ΔVpass1 is a voltage Vc2 (>voltage Vc1). At this point in time, the program voltage Vpgm is stepped up by ΔVpgm.

It is determined in Step S712 whether the number nl of write loops has reached a maximum loop count ("loop max" in the drawing). When the number nl of write loops has reached the maximum loop count in Step S714, write failure is determined and the write sequence ends. On the other hand, when the number nl of write loops has not reached the maximum loop count, after the number nl of write loops is incremented in Step S713, the programming operation is executed with the program voltage Vpgm and the passage voltages Vpass1 and Vpass2 in Step S714. Here, the passage voltage Vpass1 is set to the maximum passage voltage Vpsmax. That is, the passage voltage Vpass1 is not stepped up in the subsequent programming operation.

The verifying operation is executed in Step S715. It is determined whether the programming is completed (whether all memory cells has passed) in the verifying operation. When it is determined to be completed (Pass in S715), the write sequence ends. When it is determined not to be completed (Fail in S715), the program voltage Vpgm is stepped up by ΔVpgm in Step S716 and then the processing is returned to Step S712. That is, the passage voltage Vpass1 is not stepped up in Step S716.

Figure 33:
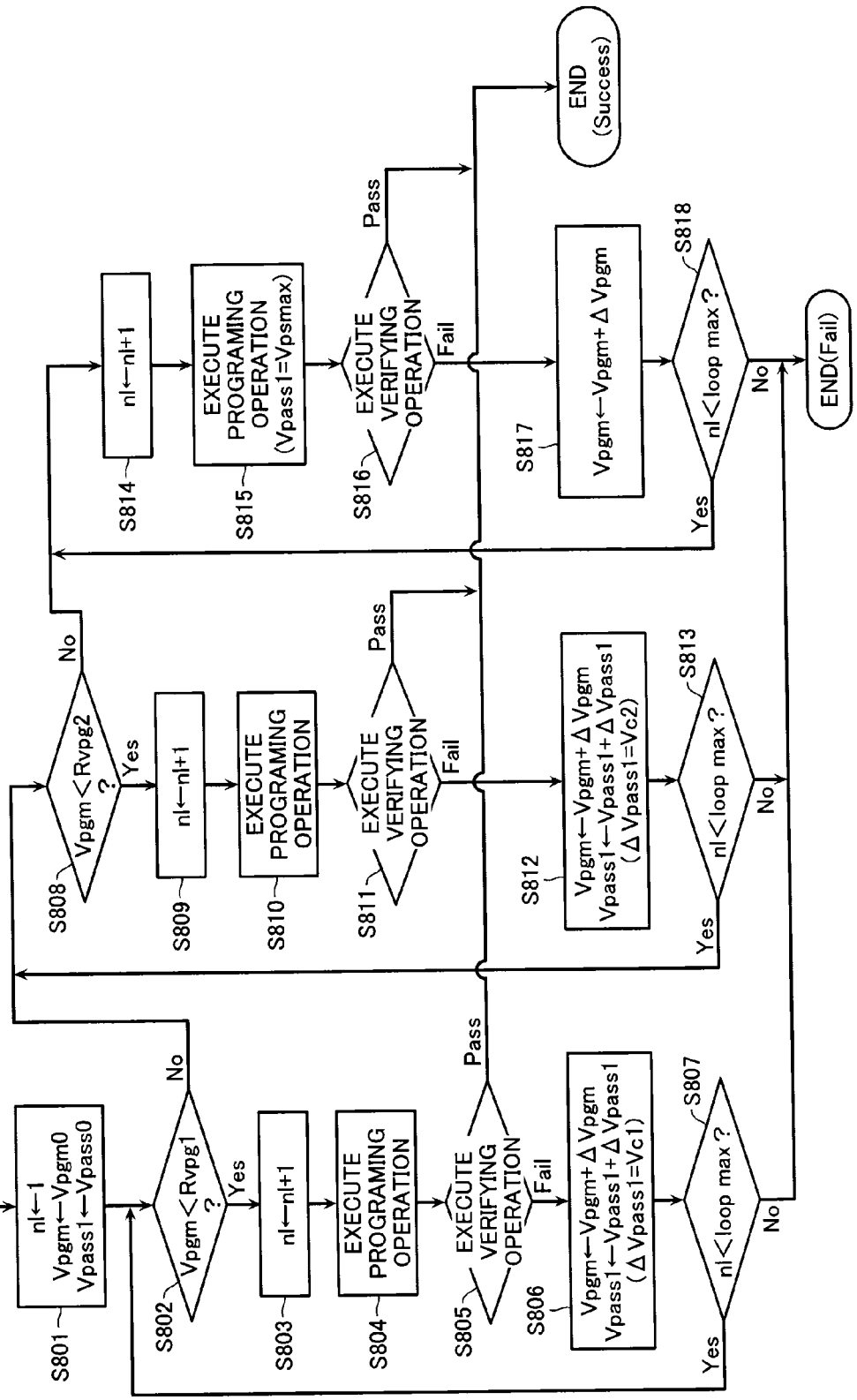
FIG. 33 is an example of a flowchart of the write sequence of the nonvolatile semiconductor memory device according to the sixth embodiment.

FIG. 33 is an example of a flowchart of a write sequence when the step-up width ΔVpass1 of the passage voltage Vpass1 is controlled with the program voltage Vpgm. The operation of the flowchart is controlled, for example, by the sequence control circuit 7.

Because Step S801 at an early stage is the same as Step S701 of FIG. 32, the detailed description thereof is not repeated.

In Step S802, it is determined whether the program voltage Vpgm satisfies a condition of Vpgm<Rvpg1 (Rvpg1 is, for example, 15 V). When it is Vpgm<Rvpg1 (Yes in Step S802), the number nl of write loops is incremented in Step S803, and after that, the proceeding proceeds to Step S804. On the other hand, when it is Vpgm≥Rvpg1 (No in Step S802), the processing proceeds to Step S808.

Because subsequent steps, Steps S804 through S806, are the same as Steps S704 through S706 of FIG. 32, the detailed description thereof is not repeated.

It is determined whether the number nl of write loops has reached a maximum loop count ("loop max" in the drawing) in Step S807. When it is determined that the number nl of write loops has reached the maximum loop count in Step S807, write failure is determined and the write sequence ends. On the other hand, when it is determined that the number nl of write loops has not reached the maximum loop count, the processing is returned to Step S802.

It is determined whether the program voltage Vpgm satisfies a condition of Vpgm<Rvpg2 (Rvpg2 is, for example, 17 V) in Step S808. When it is Vpgm<Rvpg2 (Yes in Step S808), the number nl of write loops is incremented in Step S809 and after that, the proceeding proceeds to Step S810. On the other hand, when it is Vpgm≥Rvpg2 (No in Step S808), the processing proceeds to Step S814. Further, it is Rvpg1<Rvpg2.

Because subsequent steps, Steps S810 through S812, are the same as Steps S709 through S711 of FIG. 32, the detailed description thereof is not repeated.

Because subsequent steps, Steps S814 through S817, are the same as Steps S713 through S716 of FIG. 32, the detailed description thereof is not repeated.

In this way, by controlling the step-up width ΔVpass1 of the passage voltage Vpass1 with the program voltage Vpgm, the channel voltage of the selected memory cell can be made to rise when the program voltage Vpgm is high. As a result, the erroneous write to the memory cell can be prevented with sufficient accuracy.

Like the write sequence illustrated in FIG. 33, when controlling the step-up width ΔVpass1 of the passage voltage Vpass1 with the program voltage Vpgm, whether to provide Steps S807, S813, and S818 is arbitrarily determined. When Steps S807, S813, and S818 are provided like the example of FIG. 33, under the condition that the number nl of write loops reaches a certain write loop count at the end of the write loop of Steps S806, S812, and S817, the write failure is determined and thus the write sequence may immediately end.

On the other hand, because it is not necessary to manage the number nl of write loops when Steps S807, S813, and S818 are not provided, a circuitry may be simplified.

Figure 34:
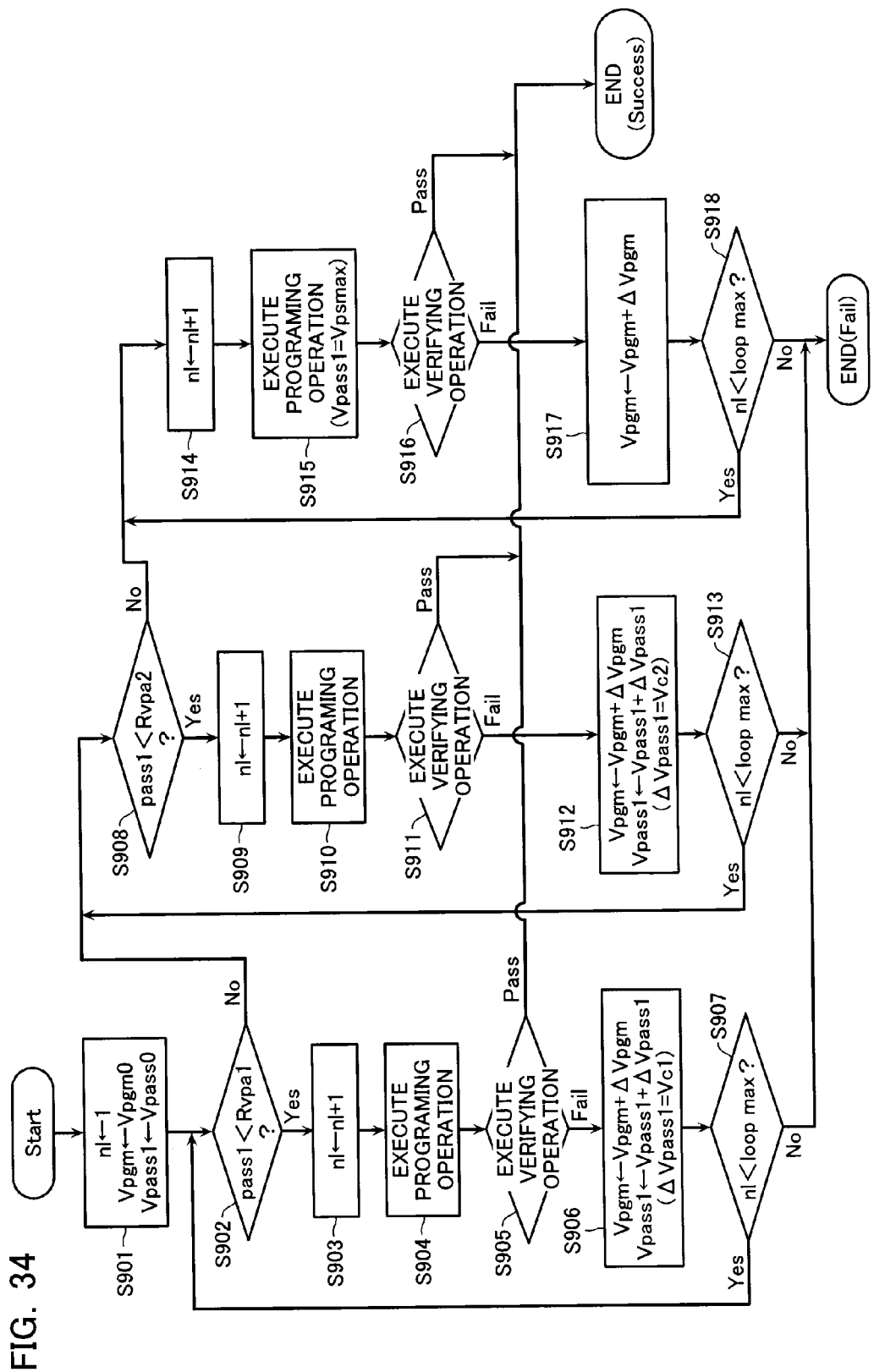
FIG. 34 is an example of a flowchart of the write sequence of the nonvolatile semiconductor memory device according to the sixth embodiment.

FIG. 34 is an example of a flowchart of a write sequence in a case where the step-up width ΔVpass1 of the passage voltage Vpass1 is controlled with the passage voltage Vpass1. The operation of the flowchart is controlled, for example, by the sequence control circuit 7.

Because Step S901 at an early stage is the same as Step S701 of FIG. 32, the detailed description thereof is not repeated.

It is determined whether the pass voltage Vpass1 satisfies a condition of Vpass1<Rvpa1 (Rvpa1 is, for example, 7 V) in Step S902. When it is Vpass1<Rvpa1 (Yes in Step S902), the number nl of write loops is incremented in Step S903, and after that, the proceeding proceeds to Step S904. On the other hand, when it is Vpass1≥Rvpa1 (No in Step S902), the processing proceeds to Step S908.

Because subsequent steps, Steps S904 through S907, are the same as Steps S804 through S807 of FIG. 33, the detailed description thereof is not repeated.

Subsequently, it is determined whether the passage voltage Vpass1 satisfies a condition of Vpass1<Rvpa2 (Rvpa2 is, for example, 9 V) in Step S908. When it is Vpass1<Rvpa2 (Yes in Step S908), the number nl of write loops is incremented in Step S909, and after that, the proceeding proceeds to Step S910. On the other hand, when it is Vpass1≤Rvpa2 (No in Step S908), the processing proceeds to Step S914. Further, it is Rvpa1<Rvpa2.

Because subsequent steps, Steps S910 through S918, are the same as Steps S810 through S818 of FIG. 33, the detailed description thereof is not repeated.

In addition, like the write sequence illustrated in FIG. 34, when controlling the step-up width ΔVpass1 of the passage voltage Vpass1 with the passage voltage Vpass1, whether to provide Steps S907, S913, and S918 is arbitrarily determined. When Steps S907, S913, and S918 are provided like the example of FIG. 34, under the condition that the number of write loops reaches a certain write loop count at the end of the write loop of Steps S906, S912, and S917, the write failure is determined and the write sequence may immediately end.

On the other hand, because it is not necessary to manage the number nl of write loops when Steps S907, S913, and S918 are not provided, a circuitry may be simplified.

In addition, the step-up width ΔVpass1 can be controlled without depending on the program voltage Vpgm, by controlling the passage voltage Vpass1. For example, when an initial voltage of the program voltage Vpgm is lowered with the deterioration of a memory cell, start of the step-up of the passage voltage Vpass1 may be delayed. As a result, erroneous write may increasingly occur. On the other hand, the passage voltage Vpass1 rarely changes with the deterioration of a memory cell. As a result, the step-up of the passage voltage Vpass1 may be started at suitable timing, so that erroneous write may be prevented.

Figure 35:
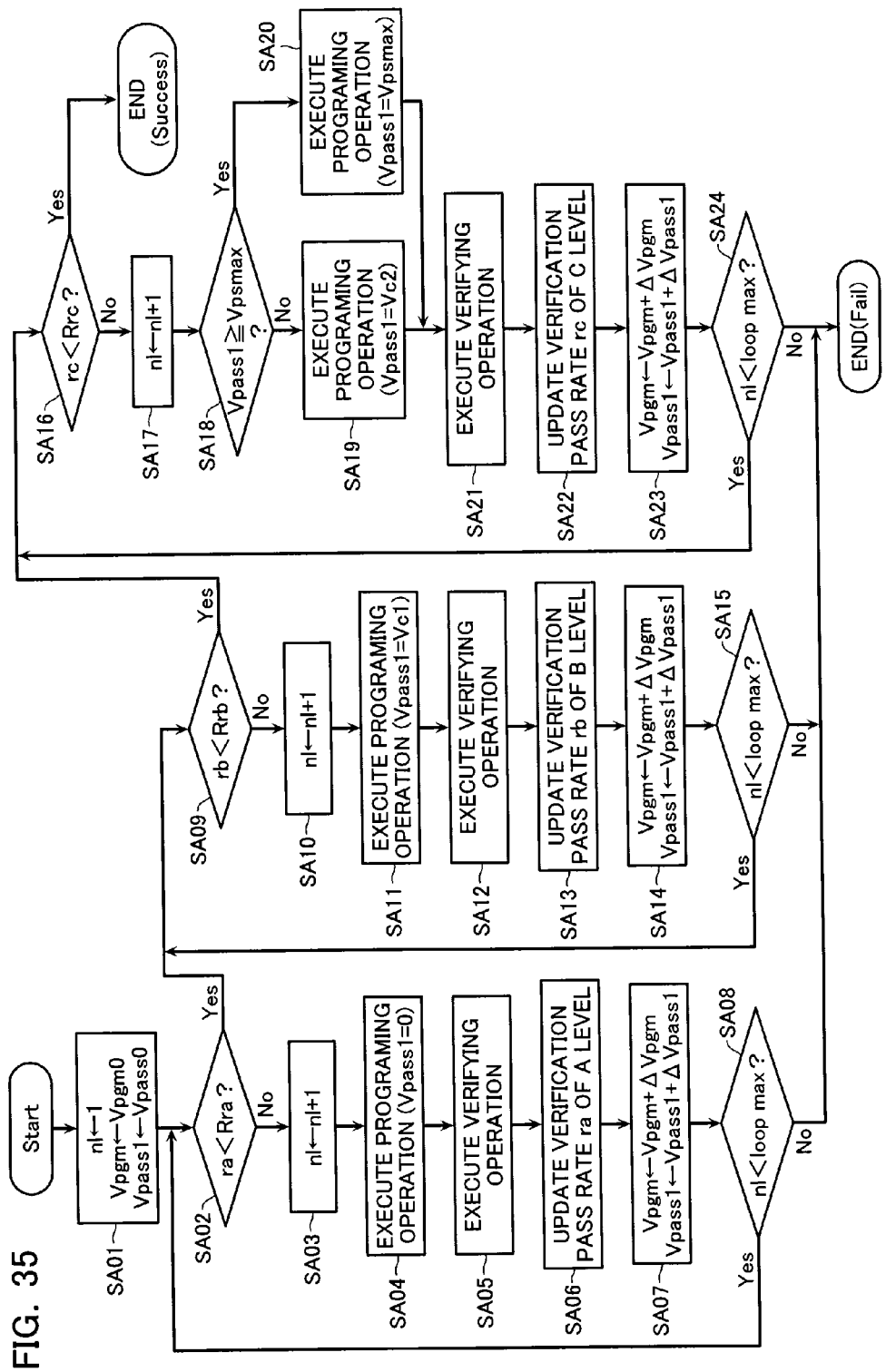
FIG. 35 is an example of a flowchart of the write sequence of the nonvolatile semiconductor memory device according to the sixth embodiment.

FIG. 35 is a flowchart of a write sequence when the step-up width ΔVpass1 of the passage voltage Vpass1 is controlled with a ratio (hereafter, referred to as "verification pass rate") of the number of memory cells that passed verification among the memory cells MC to be subjected to programming during the verifying operation. The operation of the flowchart is controlled, for example, by the sequence control circuit 7. A verification pass rate may be computed assuming that bits recoverable by ECC are ones that have passed verification.

Because Step SA01 at an early stage is the same as Step S701 of FIG. 32, the detailed description thereof is not repeated.

It is determined whether the verification pass rate ra for the A level satisfies a condition of ra Rra (Rra is 100%, for example) in Step SA02. When it is ra<Rra (NO in Step SA02), the number nl of write loops is incremented in Step SA03 and after that, the programming operation is executed with the program voltage Vpgm, the passage voltage Vpass1, and the passage voltage Vpass2 in Step SA04. Here, the ΔVpass1 is 0 V, for example. On the other hand, if it is ra≥Rra (Yes In Step SA02), the processing proceeds to Step SA09. The verification pass rate is not restricted to 100%, but a time taken until 70% of the memory cells in which the A level is written pass is defined as a program period of the A level. Hereinafter, the verification pass rates of the B level and the C level are also similarly understood.

A verifying operation is executed in Step SA05. Memory cells which passed the verification of the A level in Step SA05 are write-protected in the following programming operation.

In Step SA06, the verification pass rate ra of the A level is updated based on the verification result of Step SA05.

Steps, Steps SA07 and SA08, are the same as Steps S807 and S808 of FIG. 33 except for the step-up width ΔVpass1 of the passage voltage Vpass1 being 0 V (ΔVpass 1=0), description thereof is not repeated.

In Step SSA09, it is determined whether the verification pass rate rb of the B level satisfies a condition of rb≥Rrb (Rrb is 100%, for example). When it is rb<Rrb (NO in Step SA09), the number nl of write loops is incremented in Step SA10 and after that, the programming operation is executed with the program voltage Vpgm, the passage voltage Vpass1, and the passage voltage Vpass2 in Step SA11. Here, the ΔVpass1 is a voltage Vc1. On the other hand, when it is ra≤Rra (Yes In Step SA09), the processing proceeds to Step SA16.

The verifying operation is executed in Step SA12. In Step SA12, the memory cells which passed the verification of the B level are write-protected in the subsequent programming operation.

In Step SA13, the verification pass rate rb of the B level is updated based on the verification result of Step SA12.

Steps, Steps SA14 and SA15, are the same as Steps S806 and S807 of FIG. 33 except for the step-up width ΔVpass1 of the passage voltage Vpass1 being Vc1 (ΔVpass1=Vc1), description thereof is not repeated.

In Step SA14, it is determined whether a verification pass rate rc of the C level satisfies a condition of rc≥Rrc (Rrc is 100%, for example). When it is rc≥Rrc (Yes in Step SA16), the write sequence is completed. On the other hand, When it is rc<Rrc (No in Step SA16), the number nl of write loops is incremented in Step SA16, and after that, the processing proceeds to Step SA18.

In Step SA18, it is determined whether the passage voltage Vpass1 has reached the maximum passage voltage Vpsmax. When the passage voltage Vpass1 has reached the maximum passage voltage Vpsmax (Yes in step SA18), the programming operation is executed with the step-up width ΔVpass1 of passage voltage Vpass1 being Vc2 (Vpass1=Vc2) in Step SA19. On the other hand, when the passage voltage Vpass1 has not reached the maximum passage voltage Vpsmax (No in Step SA18), the programming operation is executed with the passage voltage Vpass1 being Vpsmax (Vpass1=Vpsmax) in Step SA20.

The verifying operation is executed in Step SA21. The memory cells which passed the verification of the C level in Step SA21 are write-protected with the following programming operation.

In Step SA22, the verification pass rate rc of the C level is updated based on the verification result of Step SA21.

Because subsequent steps, Steps SA23 and SA24, are the same as Steps S806 and S807 of FIG. 33 except for the step-up width ΔVpass1 of the passage voltage Vpass1 being Vc2 (ΔVpass1=Vc2), the detailed description thereof is not repeated.

In this way, because the step-up width ΔVpass1 of the passage voltage Vpass1 is controlled with the verification pass rate ra, rb, or rc, the passage voltage Vpass1 may be adjusted according to each level. As a result, a width of a threshold distribution of each level may be narrowed.

In addition, like the write sequence illustrated in FIG. 35, when controlling the step-up width ΔVpass1 of the passage voltage Vpass1 with the verification pass rate ra, rb, or rc, whether to provide Steps SA08, SA15, and SA24 is arbitrarily determined. When Steps SA08, SA15, and SA24 are provided like the example of FIG. 35, under the condition that the number nl of write loops reaches a certain write loop at the end of the write loop of Steps SA07, SA14, and SA23, the write failure is determined and the write sequence may be immediately ended.

On the other hand, because it is not necessary to manage the number nl of write loops when Steps SA08, SA15, and SA24 are not provided, a circuitry may be simplified.

As described above, according to the write sequence of the present embodiment, because the passage voltage Vpass2 is high to some extent in the early stage of the write sequence, the channel voltage may be sufficiently boosted like the case of using the programming operation of the SB system. By this, the erroneous write to the write-protected selected memory cells may less occur. On the other hand, because the passage voltage Vpass2 is constant, the passage voltage Vpass2 is not likely to be excessively high at a final stage of the write sequence. Because of this, the erroneous write to the non-selected memory cells connected to the selected bit line may less occur.

Compared with the case of using the programming operation of the SB system, the passage voltage Vpass1 of the non-selected word lines adjacent to the selected word line is suppressed to be relatively low at the early stage of the write sequence. As a result, the rise of the voltage due to the boosting effect of the adjacent word lines may be decreased. That is, the increase in the effective program voltage Vpgm of the selected word line may be suppressed. By this, a change in the threshold voltage (for example, the A level or the B level) of a low level of the select memory cell may be prevented, and therefore broadening of the threshold distribution in a memory cell group of a low level can be suppressed. Because the step-up width of the passage voltage Vpass1 is increased at the last half stage of the write sequence, (for example, when writing is performed such that the threshold voltage of the memory cell becomes the C level), the effective program voltage Vpgm of the selected word line can be further raised by the boosting effect. By this, it is possible to increase a rising rate of the threshold voltage of the selected memory cells, which are target memory cells to be increased in the threshold voltage, and accordingly it is possible to shorten the processing time of the write sequence.

Moreover, it is possible to suppress the threshold distribution of the threshold voltage of a low level (especially, the A level) of the selected memory cells from broadening by setting the voltage Vc1 to 0.

Next, a modification of the write sequence of the present embodiment is described.

Figure 36:
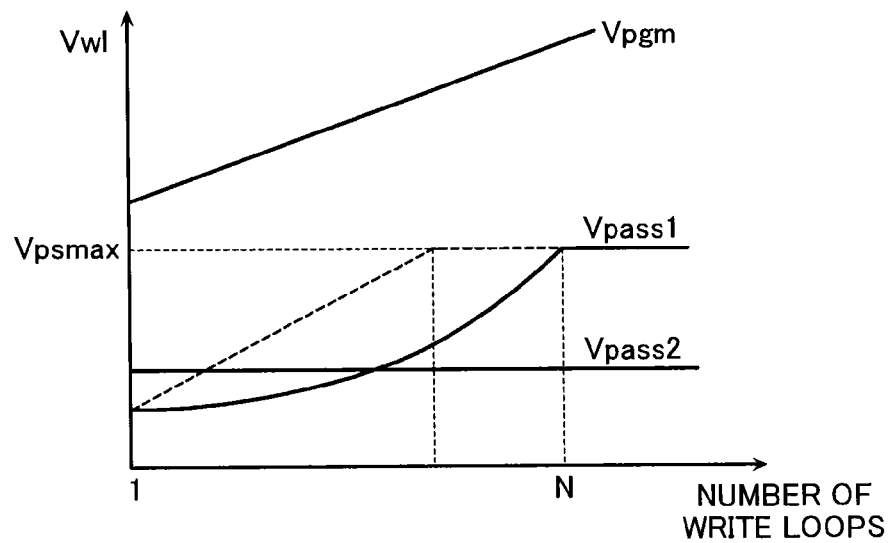
FIG. 36 is an example of a graph illustrating a relation between the number of write loops and each of a program voltage and a passage voltage during the write sequence of the nonvolatile semiconductor memory device according to the sixth embodiment.

FIG. 36 is an example of a graph illustrating a relation between the number of write loops and each of a program voltage and a passage voltage during a write sequence of the present embodiment. According to this modification, the passage voltage Vpass1 is exponentially stepped up each time a write loop is executed.

Here, the expression "exponential step-up" means a case where, for example, when a difference (step-up width) between a passage voltage Vpass1 used in an n-th write loop and a passage voltage Vpass1 used in an n+1-th write loop is expressed as ΔVn, the step-up width is expressed as ΔVn=ΔV(n−1)+0.1.

The easiness in raising the threshold voltage of the memory cells MC varies depending on memory cells MC, and there may be a case where a program period of each level cannot be clearly distinguished. However, in the case of this modification, regardless of the threshold voltage to be programmed, a programming operation using a low passage voltage Vpass1 is executed on memory cells MC whose threshold voltage is easy to increase, and a programming operation using a high passage voltage Vpass1 is executed on memory cells MC whose threshold voltage is difficult to increase. Therefore, compared with the example illustrated in FIG. 31 of the present embodiment, a more optimal programming operation may be executed according to the program characteristics of the memory cells MC.

As described above, according to the present embodiment, like the case of using the programming operation of the SB system, not only it is possible to reduce the erroneous write to write-protected selected memory cells, but also it is possible to provide a nonvolatile semiconductor memory device in which broadening of a threshold distribution of a memory cell group is suppressed.

Seventh Embodiment

The sixth embodiment is described in connection with a nonvolatile semiconductor memory device using a programming operation of the SB system. However, a seventh embodiment will be described in connection with a nonvolatile semiconductor memory device using a programming operation of a so-called erase area self-boost system (hereinafter, referred to as "EASB system"). Some aspects of this embodiment about which description is not given are the same as the first embodiment.

Figure 38:
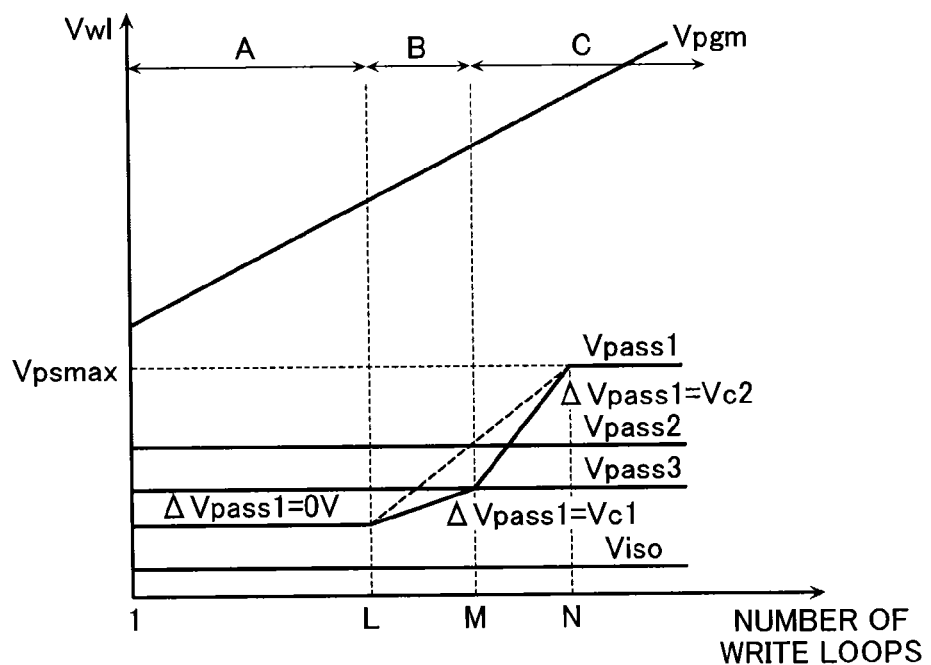
FIG. 38 is an example of a graph illustrating a relation between the number of write loops and each of a program voltage and a passage voltage during the write sequence of the nonvolatile semiconductor memory device according to the seventh embodiment.
Figure 37:
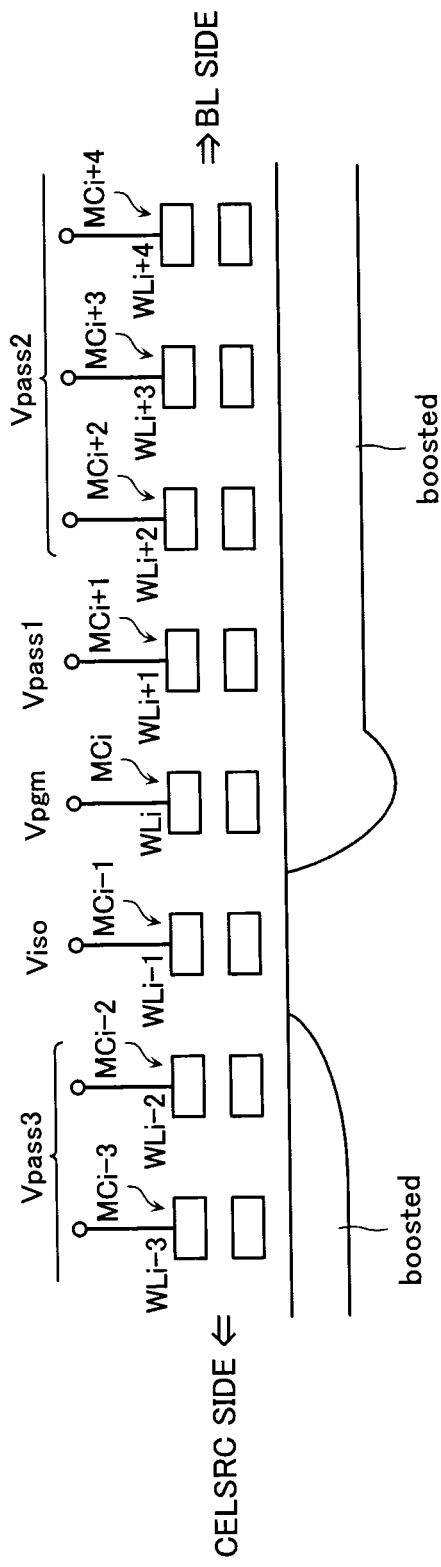
FIG. 37 is an example of a diagram illustrating a bias state of a memory cell array during a programming operation of a nonvolatile semiconductor memory device according to a seventh embodiment.

FIG. 37 is an example of a diagram illustrating the bias state of a memory cell array during a programming operation of the present embodiment, and FIG. 38 is an example of a graph illustrating a relation between the number of write loops and each of a program voltage and a passage voltage during a write sequence of the present embodiment. FIGS. 37 and 38 assume a case where data is written from a memory cell MC on the source line CELSRC side.

The threshold voltage of a memory cell rises by data writing. Therefore, the channel voltage of the memory cell after the data writing is performed becomes difficult to rise by the boosting effect, and the boosting efficiency decreases.

Therefore, the programming operation of the EASE system allows the channel voltage of a selected memory cell to be easily boosted by electrically isolating the channel of a memory cell which has undergone data writing from the channel of memory cells which has not yet undergone data writing which includes the selected memory cell.

Specifically, as illustrated in FIG. 37, a selected word line WLi is applied with a program voltage Vpgm, a non-selected word line WL adjacent to a source line CELSRC of the selected word line WLi is applied with an isolation voltage Viso, an adjacent word line WLi+1 near a bit line BL of the selected word line WLi is applied with a passage voltage Vpass1 (first passage voltage), non-selected word lines WL0 to WLi−2 are applied with a passage voltage Vpass3 (third passage voltage), and non-selected word lines WLi+2 to WLn−1 are applied with a passage voltage Vpas2 (second passage voltage).

Here, as illustrated in FIG. 38, the passage voltage Vpass2 is a constant voltage which is higher than the minimum value of the program voltage Vpgm in any of the write loops. The passage voltage Vpass3 is also a constant voltage in any of the write loops as illustrated in FIG. 38. Here, as illustrated in FIG. 38, the isolation voltage Viso is also a constant voltage in any of the write loops and a voltage which is slightly higher than a ground voltage Vss.

On the other hand, like the sixth embodiment, the passage voltage Vpass1 is a voltage which is stepped up as the number of write loops increases, up to the upper limit which is a maximum passage voltage Vpsmax. That is, as illustrated in FIG. 38, the passage voltage Vpass1 is a voltage such that an initial value thereof is set to a voltage lower than the passage voltage Vpass3, and the step-up width ΔVpass1 thereof is increased in a manner that the step-up width ΔVpass1 is 0 V in the first to L-th write loops in which A level is programmed, Vc1 (Vc2>Vc1) in the L+1-th to M-th write loops in which the B level is programmed, and Vc2 (Vc2>Vc1) in the M+1-th to N-th write loops in which the C level is programmed.

As described above, the isolation voltage Viso is applied to the word line WLi−1 to cut the channel of the memory cell MCi−1 off, and therefore the channels of the memory cells MC0 to MCi−2 which have undergone the data writing and the channels of the memory cells MCi to MCn−1 which have not yet undergone the data writing can be electrically isolated from each other. In addition, hereinbelow, the non-selected word line to which the isolation voltage Viso is applied is called an "adjacent word line".

By applying a relatively low passage voltage Vpass3 to the word lines WL0 to WLi−2 under the above-mentioned condition, it is possible to reduce occurrence of erroneous write to the memory cells MC0 to MCi−2 which have undergone the data writing which is attributable to application of an excessive passage voltage.

On the other hand, because a relatively high passage voltage Vpass2 is applied to the word lines WLi+1 to Wln−1, the channel voltage of the memory cells MCi to MCn−1 which have not yet undergone the data writing can be boosted efficiently, without being influenced by the memory cells MC0 to MCi−2. As a result, occurrence of the erroneous write to the write-protected selected memory cells MCi may be reduced.

That is, according to the examples of FIGS. 37 and 38 of the present embodiment, not only the same effect as the examples illustrated in FIGS. 30 and 31 of the sixth embodiment can be obtained, but also occurrence of the erroneous write to the write-protected selected memory cells can be reduced.

Figure 39:
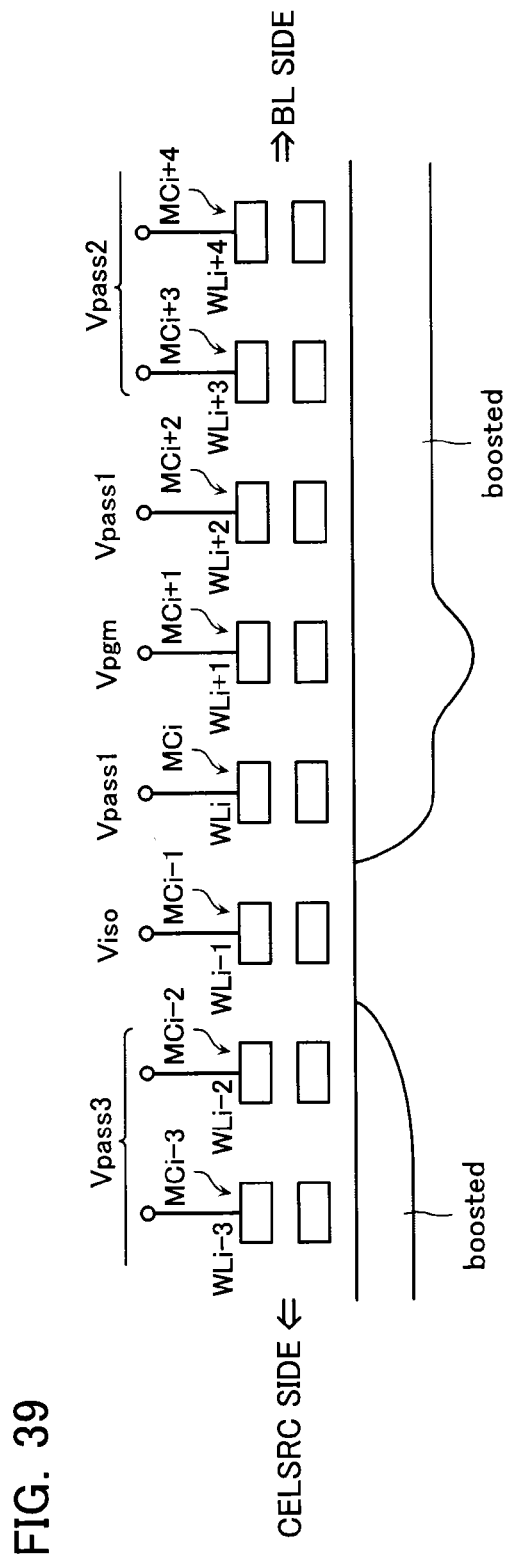
FIG. 39 is an example of the behavior of a voltage applied to a word line during the write sequence of the nonvolatile semiconductor memory device according to the seventh embodiment.

As illustrated in FIG. 39, broadening of a threshold distribution of a memory cell group can be effectively suppressed by applying the passage voltage Vpass1 to the non-selected word lines WLi and WLi+2 adjacently disposed at both sides of the selected word line WLi+1.

Next, a modification of the write sequence of the present embodiment is described.

Figure 40:
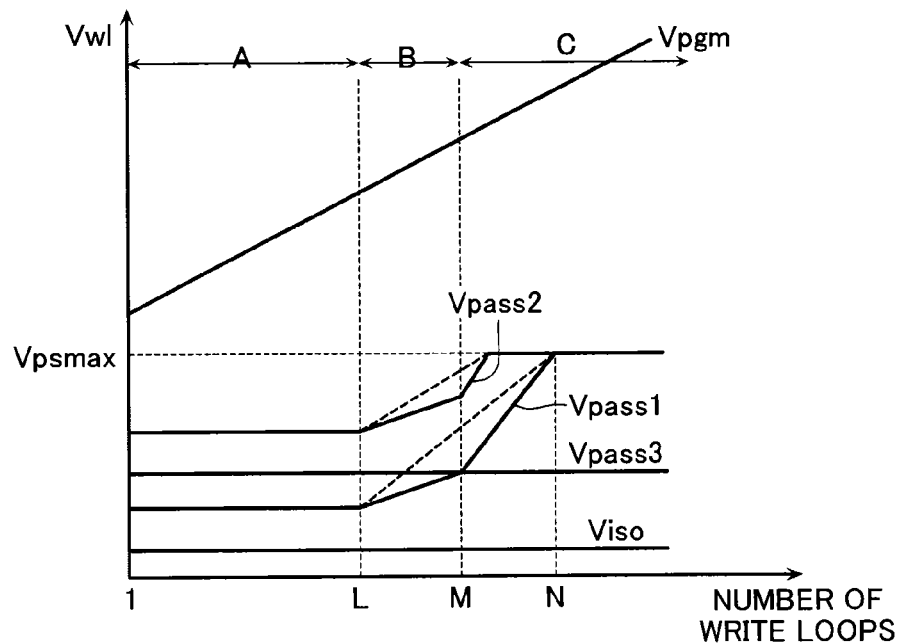
FIG. 40 is an example of a graph illustrating a relation between the number of write loops and each of a program voltage and a passage voltage during the write sequence of the nonvolatile semiconductor memory device according to the seventh embodiment.

A first modification is an example in which each of the voltages illustrated in FIG. 37 is controlled in a manner illustrated in FIG. 40. FIG. 40 is a graph illustrating a relation between the number of write loops and each of a program voltage and a passage voltage during a write sequence according to the present embodiment.

In this modification, a passage voltage Vpass2 is stepped up, as the number of write loops increases, up to a maximum passage voltage Vpsmax which is an upper limit unlike the example which combines FIG. 37 and FIG. 38 of the present embodiment. In this way, not only the passage voltage Vpass1 but also the passage voltage Vpass2 may be stepped up in the present embodiment. In this way, by stepping up the Vpass2, the channel voltage can be raised further.

As illustrated in FIG. 40, by matching timing when to change the step-up width ΔVpass2 of the passage voltage Vpass2 with timing when to change the step-up width ΔVpass1 of the passage voltage Vpass1, parameters for control of the passage voltage Vpass2 and parameters for control of the passage voltage Vpass1 can be set in common, and control of the passage voltage Vpass2 by the data writing unit may become easy.

Figure 41:
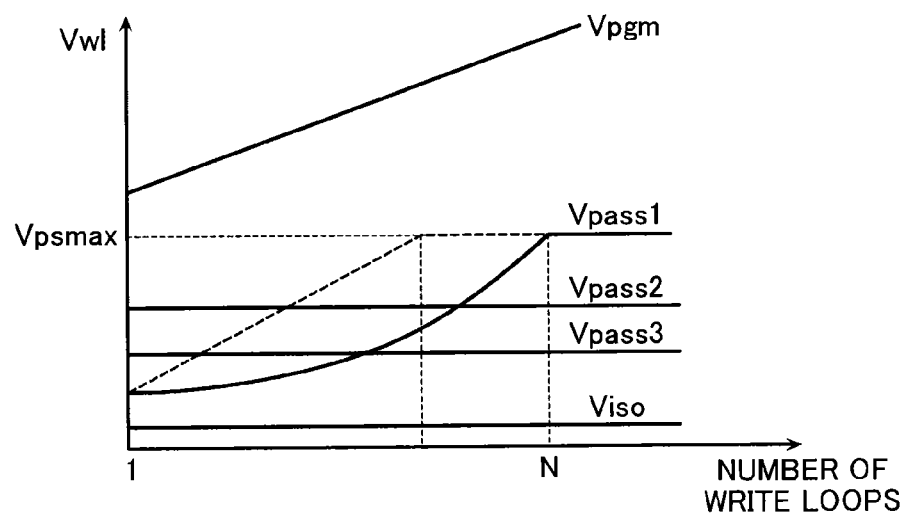
FIG. 41 is an example of a graph illustrating a relation between the number of write loops and each of a program voltage and a passage voltage during the write sequence of the nonvolatile semiconductor memory device according to the seventh embodiment.

A second modification is an example in which each of the voltages illustrated in FIG. 37 is controlled in a manner illustrated in FIG. 41. FIG. 41 is a graph illustrating a relation between the number of write loops and each of a program voltage and a passage voltage during a write sequence according to the present embodiment.

In this modification, a passage voltage Vpass1 is exponentially stepped up, as the number of write loops increases, up to a maximum passage voltage Vpsmax which is an upper limit unlike the example which combines FIG. 37 and FIG. 38 of the present embodiment. That is, in the case of this modification, regardless of the threshold voltage to be programmed, a programming operation using a low passage voltage Vpass1 is executed on memory cells MC which are easy to be programmed, and a programming operation using a high passage voltage Vpass1 is executed on memory cells MC which are difficult to be programmed.

Therefore, according to this embodiment, compared with the example which combines FIG. 37 and FIG. 38 of the present embodiment, a more optimal programming operation may be executed according to the program characteristics of the memory cells.

Figure 42:
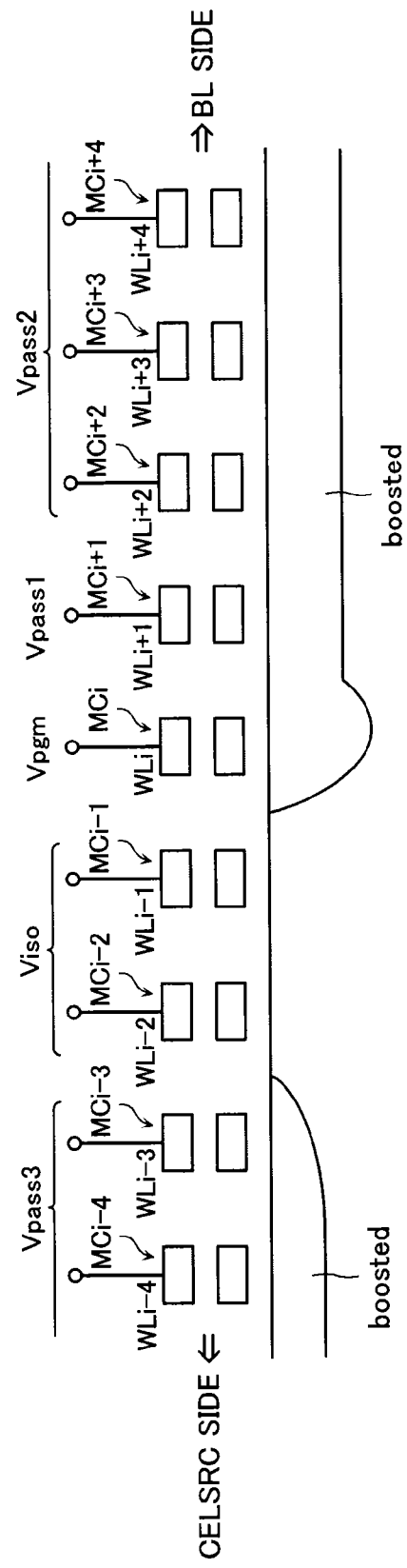
FIG. 42 is an example of a diagram illustrating a bias state of the memory cell array during a programming operation of the nonvolatile semiconductor memory device according to the seventh embodiment.

A third modification is an example in which each of the voltages illustrated in FIG. 42 is controlled in a manner illustrated in FIG. 38. FIG. 42 is a diagram illustrating the bias state of a memory cell array during a programming operation of the present embodiment.

Unlike the example which combines FIG. 37 and FIG. 38 of the present embodiment, in this modification, not only the non-selected word lines WLi−1 adjacent to the source line CELSRC of the selected word line WLi but also the non-selected word line WLi−2 adjacent to the non-selected word line WLi−1 are used as isolation word lines.

Like the example which combines FIG. 37 and FIG. 38 of the present embodiment, when one isolation word line WL is present, the channel of the memory cell MC which has undergone the data writing and the channel of the memory cell MC which has not yet undergone the data writing are unlikely to be completely, electrically isolated from each other. At this point, according to the present modification, because multiple isolation word lines WL are provided, compared with the example which combines FIG. 37 and FIG. 38 of the present embodiment, the channel of the memory cell MC which has undergone the data writing and the channel of the memory cell MC which has not yet undergone the data writing can be surely, electrically isolated from each other.

Eighth Embodiment

The seventh embodiment is described in connection with the nonvolatile semiconductor memory device using a programming operation of the EASE system. However, an eighth embodiment will be described in connection with a nonvolatile semiconductor memory device using a programming operation of a so-called Revised Erase Area Self-Boost system (hereinafter, referred to as "REASB system"). Some aspects of the present embodiment about which description is not given are the same as the seventh embodiment.

Figure 43:
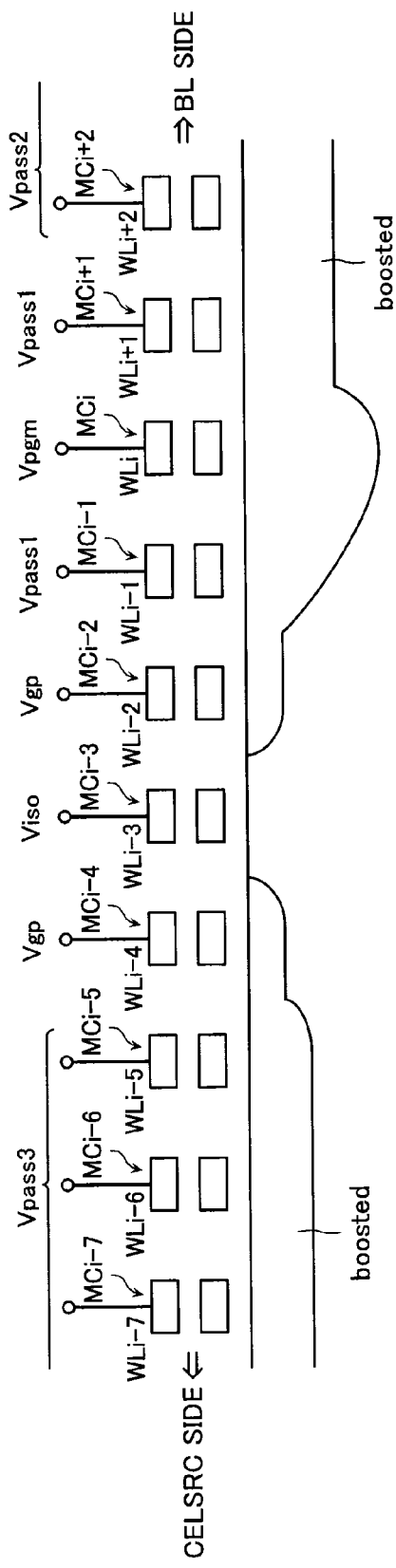
FIG. 43 is an example of a diagram illustrating a bias state of a memory cell array during a programming operation of a nonvolatile semiconductor memory device according to an eighth embodiment.
Figure 44:
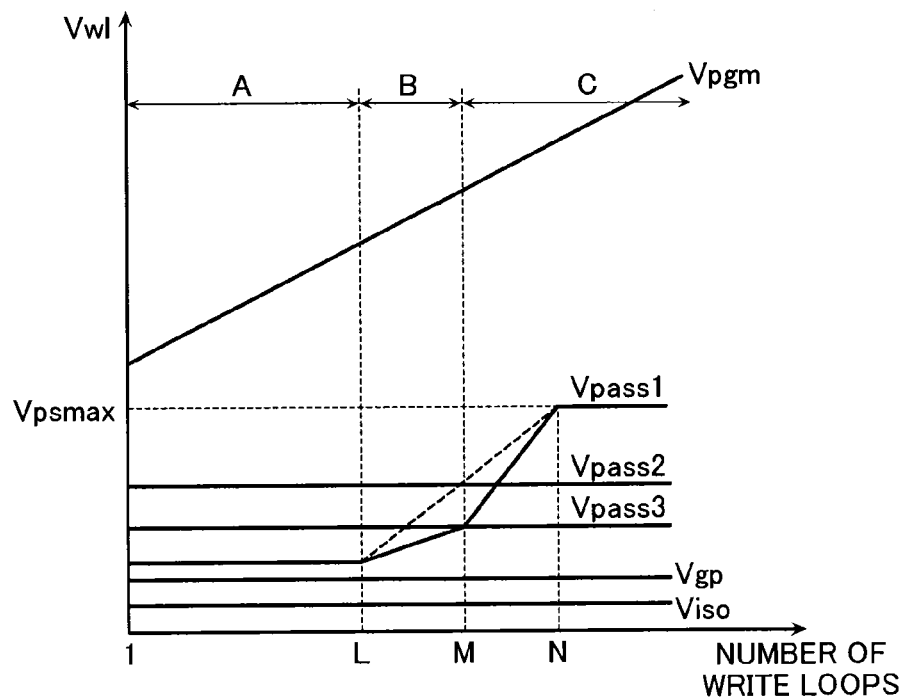
FIG. 44 is an example of a graph illustrating a relation between the number of write loops and each of a program voltage and a passage voltage during the write sequence of the nonvolatile semiconductor memory device according to the eighth embodiment.

FIG. 43 is a diagram illustrating a bias state of a memory cell array during a programming operation of the present embodiment, and FIG. 44 is a graph illustrating a relation between the number of write loops and each of a program voltage and a passage voltage during a write sequence of the present embodiment. FIGS. 43 and 44 assume that data is written sequentially from a memory cell MC on a source line CELSRC side.

When a programming operation of the EASB system is used, in the case of an example of FIG. 37, a large potential difference is generated between a channel of a memory cell MCi−1 connected to an isolation word line WLi−1 and a channel of a memory cell MCi−2 or a memory cell MCi which is adjacent to the memory cell MCi−1. In this case, electrons accelerated towards the memory cell MCi−2 or the memory cell MCi are emitted from the channel of the memory cell MCi−1. Next, when the electrons enter into a floating gate of the memory cell MCi−2 or the memory cell MCi, an erroneous write to the memory cell MCi−2 or the memory cell MCi is likely to occur.

Therefore, in the programming operation using the REASB system, a relaxation voltage which is an intermediate voltage between an isolation voltage and a program voltage or a passage voltage is applied to either one or both of non-selected word lines adjacently disposed at both side of the isolation word line.

Specifically, as illustrated in FIG. 43, the selected word line WLi is applied with a program voltage Vpgm, the adjacent word lines WLi−1 and WLi+1 are applied with a passage voltage Vpass1 (first passage voltage), a non-selected word line WLi−3 on a source line CELSRC side of the selected word line WLi is applied with an isolation voltage Viso, non-selected word lines WLi−4 and WLi−2 adjacent to the isolation word line WLi−3 are applied with a relaxation voltage Vgp, non-selected word lines WLi+2 to WLn−1 are applied with a passage voltage Vpass2 (second passage voltage), and non-selected word lines WL0 to WLi−5 are applied with a passage voltage Vpass3 (third passage voltage).

For example, the relaxation voltage Vgp is, as illustrated in FIG. 44, a constant voltage in any of the write loops, and is a voltage set to be lower than the lowest value of the program voltage Vpgm, the lowest value of the passage voltage Vpass1, the passage voltage Vpass2, or the passage voltage Vpass3, and to be higher than the isolation voltage Viso. The program voltage Vpgm, the passage voltages Vpass1, Vpass2, Vpass3, and the isolation voltage Viso are set to the same values as the example in FIG. 38. In addition, the non-selected word line to which the isolation voltage Viso is applied is called a "relaxation word line". Broadening of a threshold distribution of memory cells may be effectively suppressed by applying the passage voltage Vpass1 to the word lines WLi−1 and WLi+1 adjacently disposed at both sides of the selected word line WLi.

As described above, acceleration of the electrons emitted from a channel of a memory cell MCi−3 and directed to channels of memory cells MCi−4 and MCi−2 is alleviated by the application of the relaxation voltage Vgp to the non-selected word lines WLi−2 and WLi−4 adjacent to the isolation word line WLi−3. Therefore, a possibility that the electrons enter into the charge storage layers of the memory cells MCi−4 and MCi−2 is lowered.

That is, according to an example that combines FIGS. 43 and 44 of the present embodiment, not only the same effect as the example that combines FIGS. 37 and 38 of the seventh embodiment may be obtained, but also occurrence of an erroneous write to memory cells adjacent to a memory cell connected to the isolation word line may be reduced.

Next, a modification of the write sequence of the present embodiment is described.

Figure 45:
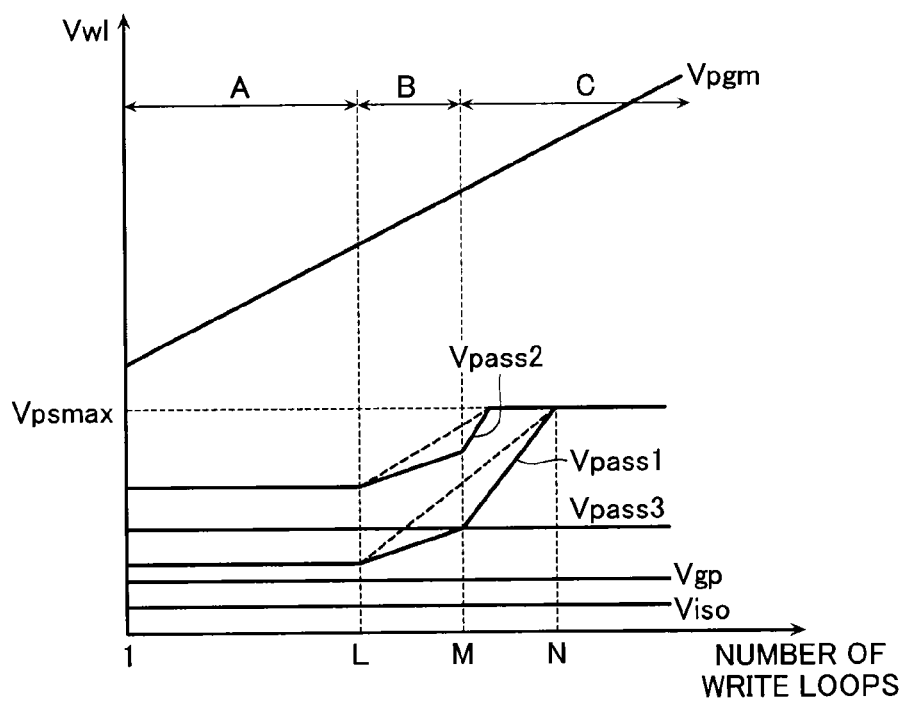
FIG. 45 is an example of a graph illustrating a relation between the number of write loops and each of a program voltage and a passage voltage during the write sequence of the nonvolatile semiconductor memory device according to the eighth embodiment.

A first modification is an example in which each of the voltages illustrated in FIG. 43 is controlled in a manner illustrated in FIG. 45. FIG. 45 is an example of a graph illustrating a relation between the number of write loops and each of a program voltage and a passage voltage during a write sequence of the present embodiment.

In this modification, a passage voltage Vpass2 is stepped up, as the number of write loops increases, up to a maximum passage voltage Vpsmax which is an upper limit unlike the example which combines FIGS. 43 and 44 of the present embodiment. In this way, not only the passage voltage Vpass1 but also the passage voltage Vpass2 may be stepped up in the present embodiment.

Figure 46:
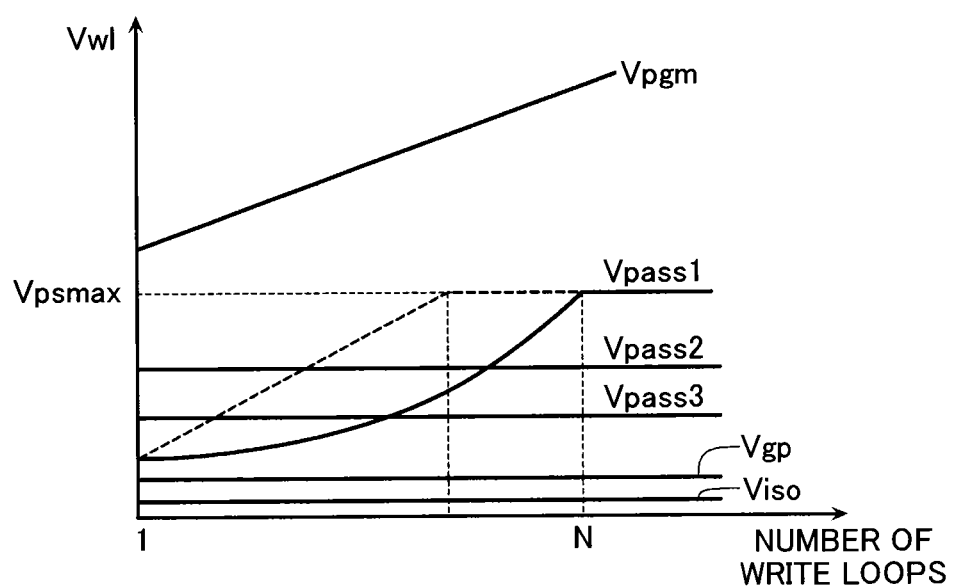
FIG. 46 is an example of a graph illustrating a relation between the number of write loops and each of a program voltage and a passage voltage during the write sequence of the nonvolatile semiconductor memory device according to the eighth embodiment.

A second modification is an example in which each of the voltages illustrated in FIG. 43 is controlled in a manner illustrated in FIG. 46. FIG. 46 is a graph illustrating a relation between the number of write loops and each of a program voltage and a passage voltage during a write sequence according to the present embodiment.

In this modification, a passage voltage Vpass1 is exponentially stepped up, as the number of write loops increases, up to a maximum passage voltage Vpsmax which is an upper limit unlike the example which combines FIGS. 43 and 44 of the present embodiment.

Therefore, according to this modification, compared with the embodiment example which combines FIGS. 43 and 44 of the present embodiment, a more optimal programming operation may be executed according to the program characteristics of a memory cell.

Figure 47:
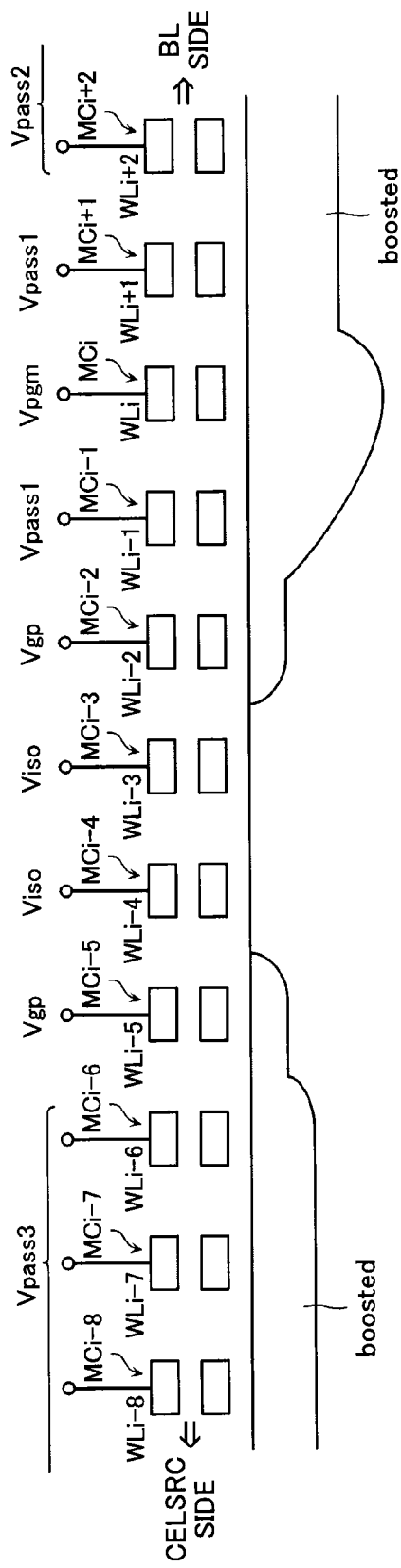
FIG. 47 is an example of a diagram illustrating a bias state of the memory cell array during a programming operation of the nonvolatile semiconductor memory device according to the eighth embodiment.

A third modification is an example in which each of the voltages illustrated in FIG. 47 is controlled in a manner illustrated in FIG. 44. FIG. 47 is a diagram illustrating the bias state of a memory cell array during a programming operation of the present embodiment.

Unlike the example which combines FIGS. 43 and 44 of the present embodiment, in this modification, not only the non-selected word line WLi−3 adjacent to the source line CELSRC of the selected word line WLi but also the non-selected word line WLi−4 adjacent to the non-selected word line WLi−3 are used as isolation word lines.

For this reason, according to the present modification, compared with the example which combines FIGS. 43 and 44 of the present embodiment, the channel of the memory cell MC which has undergone the data writing and the channel of the memory cell MC which has not yet undergone the data writing can be surely, electrically isolated from each other.

Ninth Embodiment

The seventh embodiment is described in connection with a nonvolatile semiconductor memory device using a programming operation of the EASB system. However, a ninth embodiment will be described in connection with a nonvolatile semiconductor memory device using a programming operation of a so-called Local Self-Boost system (hereinafter, referred to as "LSB system"). Some aspects of the present embodiment about which description is not given are the same as the seventh embodiment.

Figure 48:
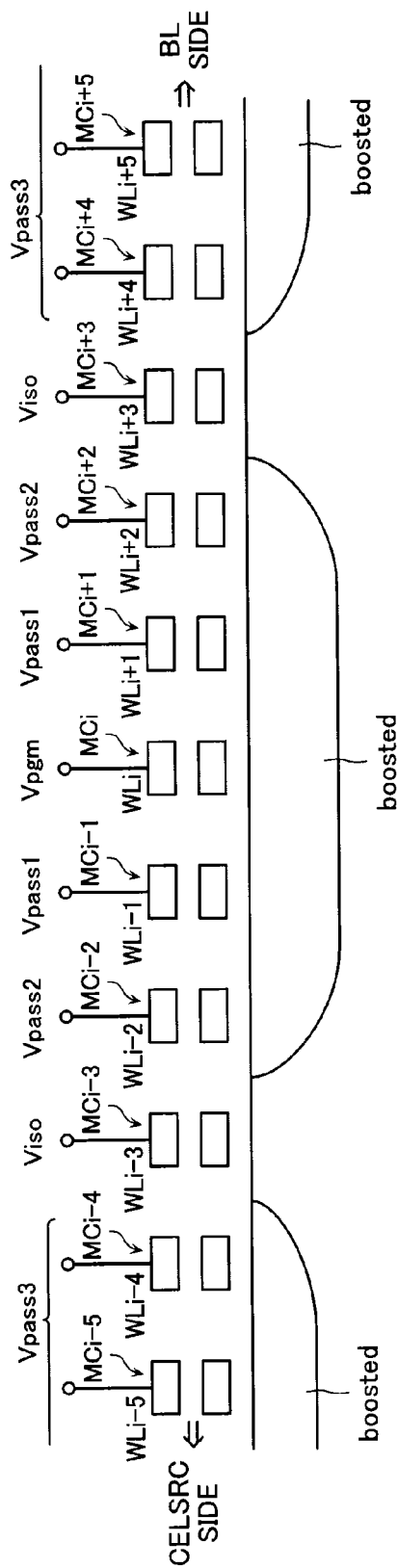
FIG. 48 is an example of a diagram illustrating a bias state of a memory cell array during a programming operation of a nonvolatile semiconductor memory device according to a ninth embodiment.

FIG. 48 is an example of a diagram illustrating a bias state of a memory cell array during a programming operation of the present embodiment. FIG. 48 assumes a case where data is written from a memory cell MC on the source line CELSRC side.

When the programming operation of the EASB system is used, as compared with the case where the programming operation of the SB system is used, the channel voltage of the selected memory cell may be more efficiently boosted by electrically isolating the channel of the memory cell which has undergone the data writing and the channel of the memory cell which has not yet undergone the data writing from each other.

On the other hand, in the programming operation of the LSB system, the channel of the selected memory cell is electrically isolated not only from the channel of the memory cell on the source line CELSRC side of the selected memory cell but also from the channel of the memory cell near the bit line BL. By this, the channel voltage of the selected memory cell can be boosted with higher efficiency as compared with a case where the programming operation of the EASB system is used.

Specifically, as illustrated in FIG. 48, the selected word line WLi is applied with a program voltage Vpgm, adjacent word lines WLi−1 and WLi+1 are applied with a passage voltage Vpass1 (first passage voltage), a non-selected word line WLi−2 adjacent to the source line CELSRC of the adjacent word line WLi−1 and a non-selected word line WLi+2 adjacent to the bit line BL of the adjacent word line WLi+1 are applied with a passage voltage Vpass2 (second passage voltage), a non-selected word line WLi−3 adjacent to the source line CELSRC of the non-selected word line WLi−2 and a non-selected word line WLi+3 adjacent to the bit line BL of the non-selected word line WLi+2 are applied with an isolation voltage Viso, and the other non-selected word lines WL0 to WLi−4 and WLi+4 to WLn−1 are applied with a passage voltage Vpass3 (third passage voltage).

The control of the program voltage Vpgm, the passage voltages Vpass1, Vpass2, Vpass3, and the isolation voltage Viso for the write loop are the same as that in the embodiment example illustrated in FIG. 38.

As described above, in the case of an example which combines FIGS. 38 and 48 of the present embodiment, the channels around the selected memory cell MCi can be electrically isolated from the channels of the other non-selected memory cells MC by cutting off the non-selected memory cells MCi−3 and MCi+3.

By this, according to an example that combines FIGS. 38 and 44 of the present embodiment, not only the same effect as the examples illustrated in FIGS. 37 and 38 of the seventh embodiment can be obtained, but also occurrence of an erroneous write to write-protected selected memory cells can be reduced.

Next, a modification of a write sequence of the present embodiment is described.

A first modification is an example in which each of the voltages illustrated in FIG. 44 is controlled in a manner illustrated in FIG. 40.

In this modification, the passage voltage Vpass2 is stepped up, as the number of write loops increases, up to a maximum passage voltage Vpsmax which is an upper limit unlike the example which combines FIGS. 38 and 48 of the present embodiment. In this way, not only the passage voltage Vpass1 but also the passage voltage Vpass2 may be stepped up in the present embodiment.

A second modification is an example in which each of the voltages illustrated in FIG. 48 is controlled in a manner illustrated in FIG. 41.

In this modification, the passage voltage Vpass1 is exponentially stepped up, as the number of write loops increases, up to a maximum passage voltage Vpsmax which is an upper limit unlike the example which combines FIGS. 38 and 48 of the present embodiment.

Therefore, according to this modification, compared with the example which combines FIGS. 38 and 48 of the present embodiment, a more optimal programming operation may be executed according to the program characteristics of a memory cell.

Figure 49:
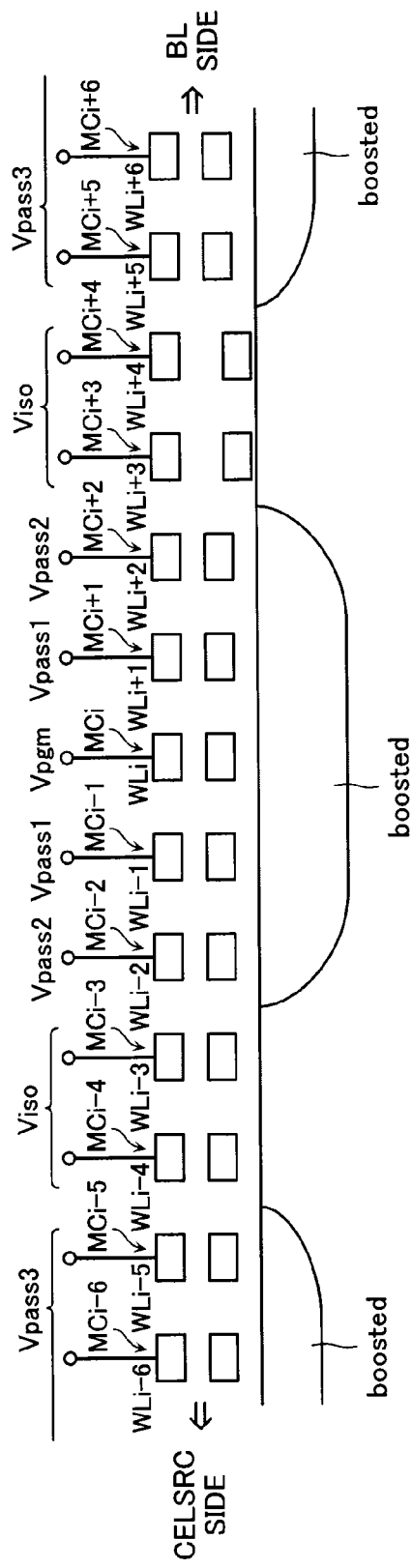
FIG. 49 is an example of a diagram illustrating a bias state of the memory cell array during a programming operation of the nonvolatile semiconductor memory device according to the ninth embodiment.

A third modification is an example in which each of the voltages illustrated in FIG. 49 is controlled in a manner illustrated in FIG. 38. FIG. 49 is a diagram illustrating the bias state of a memory cell array during a programming operation of the present embodiment.

Unlike the example which combines FIGS. 38 and 48 of the present embodiment, in this modification, not only the non-selected word line WLi−3 adjacent to the source line CELSRC of the selected word line WLi but also the non-selected word line WLi−4 adjacent to the non-selected word line WLi−3 are used as isolation word lines.

For this reason, according to the present modification, compared with the example which combines FIGS. 38 and 48 of the present embodiment, the channels around the selected memory cell MC and the channels of the other non-selected memory cells are surely, electrically isolated from each other.

Tenth Embodiment

The eighth embodiment is described in connection with the nonvolatile semiconductor memory device using a programming operation of the REASB system. However, a tenth embodiment will be described in connection with a nonvolatile semiconductor memory device using a programming operation of a so-called Revised Local Self-Boost system (hereinafter, referred to as "RLSB system"). Some aspects of the present embodiment about which description is not given are the same as the eighth embodiment.

Figure 50:
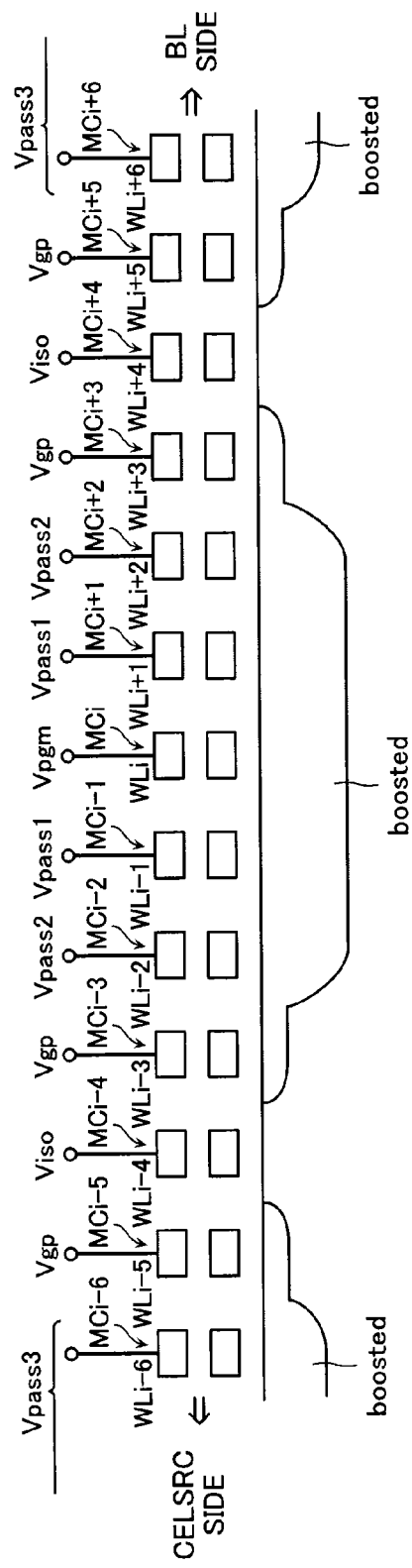
FIG. 50 is an example of a diagram illustrating a bias state of a memory cell array during a programming operation of a nonvolatile semiconductor memory device according to a tenth embodiment.

FIG. 50 is a diagram illustrating the bias state of a memory cell array during a programming operation of the present embodiment. FIG. 50 assumes that data is written sequentially from a memory cell MC on the source line CELSRC side.

When the programming operation of the REASB system is used, as compared with the case where the programming operation of the SB system is used, the channel voltage of the selected memory cell may be more efficiently boosted by electrically isolating the channel of the memory cell which has undergone the data writing and the channel of the memory cell which has not yet undergone the data writing from each other.

On the other hand, in the programming operation of the RLSB method, the channel of the selected memory cell is electrically isolated not only from the channel of the memory cell on the source line CELSRC side of the selected memory cell but also from the channel of the memory cell on the bit line BL. By this, the channel of the selected memory cell can be more efficiently boosted as compared with the case where the programming operation of the EASB system is used.

Specifically, as illustrated in FIG. 50, the selected word line WLi is applied with a program voltage Vpgm, adjacent word lines WLi−1 and WLi+1 are applied with a passage voltage Vpass1 (first passage voltage), a non-selected word line WLi−2 adjacent to the source line CELSRC of the adjacent word line WLi−1 and a non-selected word line WLi+2 adjacent to the bit line BL of the adjacent word line WLi+1 are applied with a passage voltage Vpass2 (second passage voltage), a non-selected word line WLi−3 adjacent to the source line CELSRC of the non-selected word line WLi−2 and a non-selected word line WLi+3 adjacent to the bit line BL of the non-selected word line WLi+2 are applied with an isolation voltage Viso, non-selected word lines WLi−5, WLi−3, WLi+3, and WLi+5 adjacent to the isolation word lines WLWLi−4 and WLi+4 are applied with a relaxation voltage Vgp, and the other non-selected word lines WL0 to WLi−6 and WLi+6 to WLn−1 are applied with a passage voltage Vpass3 (third passage voltage).

The control of the program voltage Vpgm, the passage voltages Vpass1, Vpass2, Vpass3, the isolation voltage Viso, and the relaxation voltage Vgp for the write loop are the same as that of the example illustrated in FIG. 44.

As described above, in the case of an example which combines FIGS. 44 and 50 of the present embodiment, the channels around the selected memory cell MCi can be electrically isolated from the channels of the other non-selected memory cells MC by cutting off the non-selected memory cells MCi−4 and MCi+4.

By this, according to the example that combines FIGS. 44 and 50 of the present embodiment, not only the same effect as the examples illustrated in FIGS. 43 and 44 of the eighth embodiment can be obtained, but also occurrence of an erroneous write to write-protected selected memory cells can be reduced.

Next, a modification of a write sequence of the present embodiment is described.

A first modification is an example in which each of the voltages illustrated in FIG. 50 is controlled in a manner illustrated in FIG. 45.

In this modification, the passage voltage Vpass2 is stepped up, as the number of write loops increases, up to a maximum passage voltage Vpsmax which is an upper limit unlike the example which combines FIGS. 44 and 50 of the present embodiment. In this way, not only the passage voltage Vpass1 but also the passage voltage Vpass2 may be stepped up in the present embodiment.

A second modification is an example in which each of the voltages illustrated in FIG. 50 is controlled in a manner illustrated in FIG. 46.

In this modification, the passage voltage Vpass1 is exponentially stepped up, as the number of write loops increases, up to a maximum passage voltage Vpsmax which is an upper limit unlike the example which combines FIGS. 44 and 50 of the present embodiment.

Therefore, according to this modification, compared with the example which combines FIGS. 44 and 50 of the present embodiment, a more optimal programming operation may be executed according to the program characteristics of a memory cell.

Figure 51:
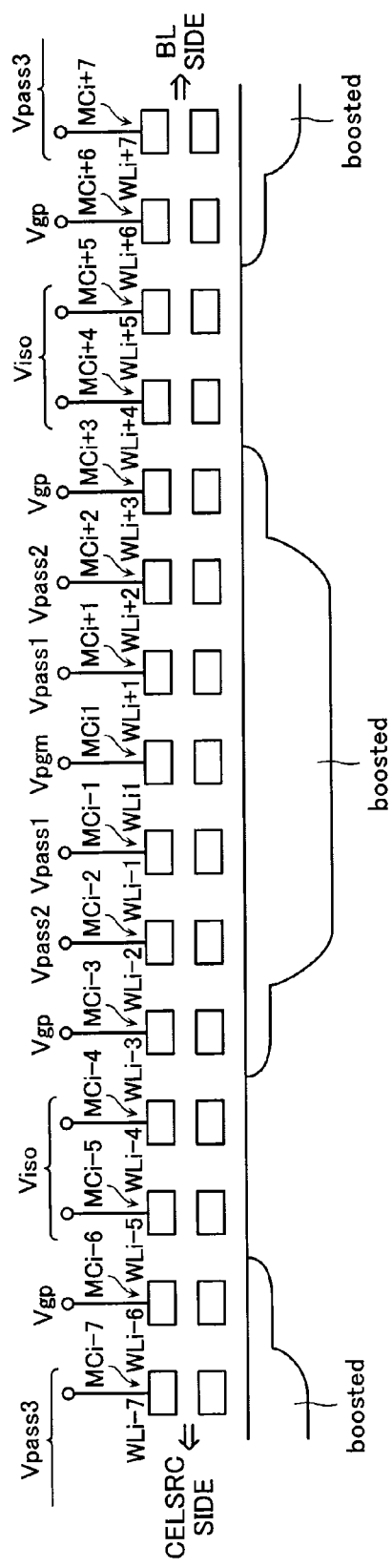
FIG. 51 is an example of a diagram illustrating a bias state of a memory cell during the programming operation of the nonvolatile semiconductor memory device according to the tenth embodiment.

A third modification is an example in which each of the voltages illustrated in FIG. 51 is controlled in a manner illustrated in FIG. 44. FIG. 51 is an example of a diagram illustrating the bias state of a memory cell array during a programming operation of the present embodiment.

Unlike the example which combines FIGS. 44 and 50 of the present embodiment, in this modification, not only the non-selected word line WLi−3 adjacent to the source line CELSRC of the selected word line WLi but also the non-selected word line WLi−4 adjacent to the non-selected word line WLi−3 are used as isolation word lines. Similarly, not only the non-selected word line WLi+3 adjacent to the bit line BL of the selected word line WLi but also the non-selected word line WLi+4 adjacent to the non-selected word line Wli+3 are used as isolation word lines.

For this reason, according to the present modification, compared with the example which combines FIGS. 44 and 50 of the present embodiment, the channels around the selected memory cell MC and the channels of the other non-selected memory cells are surely, electrically isolated from each other.

Eleventh Embodiment

An eleventh embodiment describes a data writing operation which realizes a narrow threshold distribution by correcting ex-post facto broadening of a threshold distribution of memory cells attributable to an inter-cell interference effect.

First, referring to FIGS. 52 and 53, a data writing operation of a nonvolatile semiconductor memory device according to the eleventh embodiment will be described.

Figure 52:
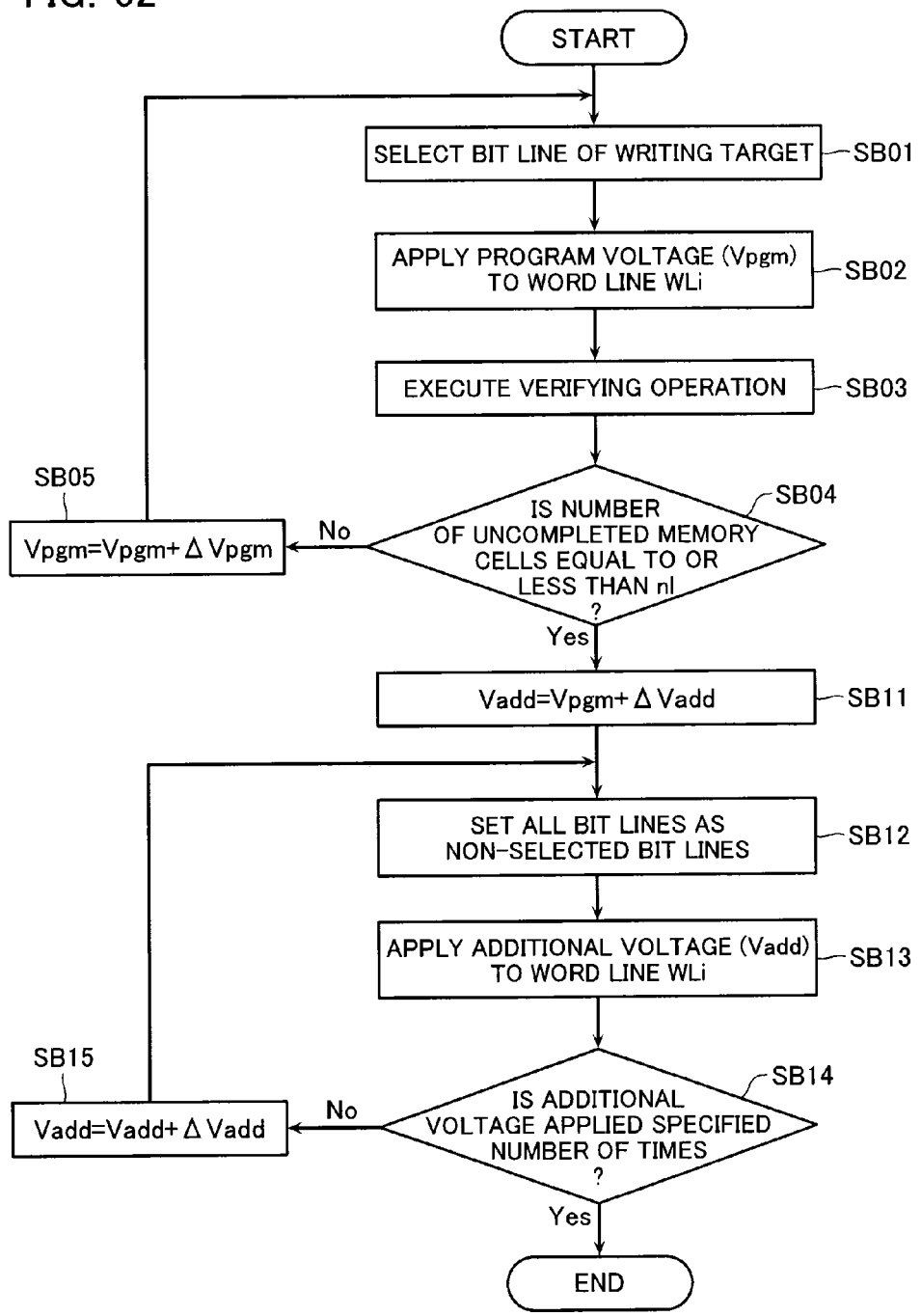
FIG. 52 is an example of a flowchart of a write sequence of a nonvolatile semiconductor memory device according to an eleventh embodiment.

FIG. 52 is an example of a flow chart which illustrates a write sequence of the present embodiment.

FIG. 52 illustrates a case where data is written in each of memory cells MC connected to word lines WLi (i=0 to n−1). The control of the write sequence is performed by a data writing unit which includes, for example, a row decoder/word line driver 2a, a column decoder 2b, a page buffer 3, and a voltage generation circuit 8.

The word line WLi is an example of a second word line, and the word line on which data writing is performed prior to data writing on the word line WLi is an example of a first word line. For example, writing may be performed in order of word lines WL0, WL1, . . . WLn−2, and WLn−1. In this case, the word line WLi−1 which is subjected to writing prior to writing on the word line WLi is an example of the first word line.

Figure 53:
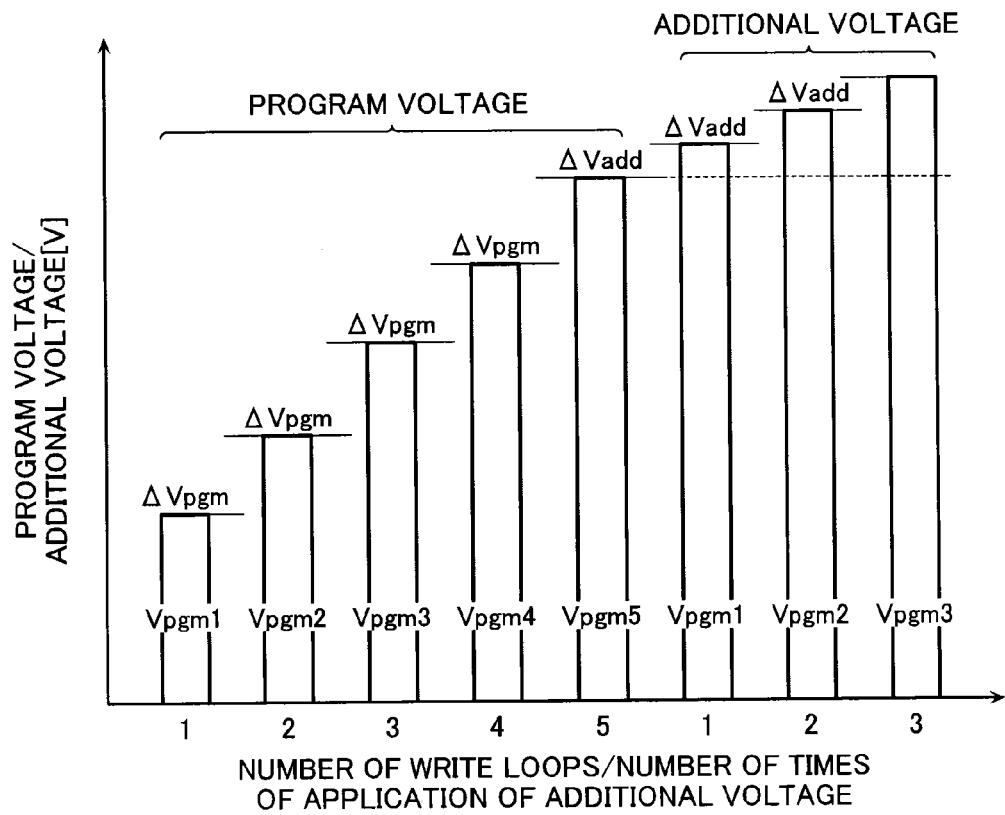
FIG. 53 is an example of a graph illustrating a relation between the number of write loops/the number of times of application of an additional voltage and a programming voltage/the additional voltage during a write sequence of the nonvolatile semiconductor memory device according to the eleventh embodiment.

FIG. 53 is a graph illustrating a relation between the number of write loops/the number of applications of an additional voltage and a program voltage/the additional voltage according to the eleventh embodiment.

At the time of writing, a program voltage Vpgm and an additional voltage Vadd are applied to the word line WLi. The value of the program voltage Vpgm increases according to the number of write loops, as illustrated in FIG. 53. Similarly, the value of the additional voltage Vadd increases according to the number of applications of the additional voltage Vpgm. The operation in which the program voltage and the additional voltage increase is called "step-up operation".

Hereinafter, the flowchart of FIG. 52 is described. In the description of FIG. 52, the graph of FIG. 53 is also suitably referred to.

First, all the bit lines BL to be subjected to writing among all the bit lines BL within a memory cell array 1 are set as selected bit lines, and the other bit lines BL are set as non-selected bit lines (Step SB01). The program voltage Vpgm is applied to the word line WLi (Step SB02). In a first programming operation, the value of the program voltage is set to Vpgm1 (refer to FIG. 53).

A verifying operation of checking whether data is written in a memory cell MC connected to the word line WLi is performed (Step SB03). It is determined whether the number of memory cells MC on which writing is uncompleted is equal to or less than nl (nl is an integer equal to or greater than 0) (Step SB04). Equivalently, it may be determined whether the number of bit lines BL connected to the memory cells on which writing is uncompleted is equal to or less than nl which is a condition value.

When the number of the writing-uncompleted memory cells is equal to or less than nl, it is determined that the writing is completed and the processing proceeds to Step SB11. On the other hand, when the number of writing-uncompleted memory cells is greater than n1, the program voltage Vpgm is stepped up by ΔVpgm (Step SB05), and then Steps SB01 to SB04 are repeated. FIG. 53 illustrates an example in which writing is completed by executing a write loop 5 times. In the second to fifth write loops, the values of the program voltage are set to Vpgm2 to Vpgm5 (Vpgm1<Vpgm2<Vpgm3<Vpgm4<Vpgm5), respectively (refer to FIG. 53). The number n1 may be the number of memory cells MC scheduled to be subjected to writing, or may be the number of memory cells MC including the memory cells MC scheduled to be subjected to writing and the memory cells that can be recovered by ECC (Error-Correcting Code).

When writing to the word line WLi ends, an initial value of the additional voltage Vadd is set to a value obtained by adding ΔVadd to the last value of the program voltage Vpgm (Step SB11). That is, the value of Vadd1 is set to Vpgm5+ΔVadd.

All the bit lines BL in the memory cell array 1 is set as the non-selected bit lines (Step SB12). The additional voltage Vadd is applied to the word line WLn (Step SB13). In a first application of the additional voltage, the value of the additional voltage is set to Vadd1 (refer to FIG. 53).

It is checked whether the additional voltage is applied a specified number of times (Step SB14). When the number of times of application of the additional voltage Vadd is less than the specified number, the additional voltage Vadd is increased by ΔVadd (Step SB15) and then Steps SB12 to SB14 are repeatedly executed. FIG. 53 illustrates an example that the specified number is 3. In second and third applications of the additional voltage, the value of the additional voltage is set to Vadd2 and Vadd3, respectively (refer to FIG. 53).

On the other hand, when the number of times of application of the additional voltage Vadd reaches the specified number, the application of the additional voltage Vadd to the word line WLi is completed. After that, Steps SB01 to SB15 can be performed on the following word line WLi+1. In this processing, the word line WLi+1 is an example of the second word line, and the word line WLi on which writing is completed is an example of the first word line.

The value of ΔVadd may be same as or different from ΔVpgm. In the present embodiment, the values of ΔVpgm and ΔVadd, and the specified number of times of application may be set by being stored in, for example, a ROM fuse 12. Alternatively, the values and the number may be generated by the controller 11 and sent from the controller 11.

The value of the initial value Vadd1 of the additional voltage may be set to a value other than Vpgm5+ΔVadd. For example, the value of the initial value Vadd1 of the additional voltage may be set to a value higher than the last value Vpgm5 of the program voltage, may be set to a value lower than the last value Vpgm5 of the program voltage, or may be set to a value equal to the last value Vpgm5 of the program voltage. However, as for the value of the initial value Vadd1 of the additional voltage, from a viewpoint of decreasing the number of times of application of the additional voltage Vadd, it is preferable to set to a value higher than the last value Vpgm5 of the program voltage. In the present embodiment, each value of the additional voltages Vadd1 to Vadd3 is set to a value higher than the last value Vpgm5 by setting the values of the additional voltages so as to satisfy a condition of Vadd1>Vpgm5.

Next, with reference to FIGS. 54 through 58, the operational effect of the write sequence of FIG. 52 is described.

FIGS. 54 through 57 are examples of a graph illustrating a threshold distribution of memory cells MC in the present embodiment. FIGS. 54 through 57 illustrate examples of simulation of a NAND flash memory obtained by using an in-company simulator. The horizontal axis of FIGS. 54 through 57 indicates threshold voltages of memory cells MC, and the vertical axis indicates the number of memory cells MC on the log scale. In FIGS. 54 through 57, the simulation is performed by assuming a case where a memory cell of a 3 bits-per-cell type is used.

Figure 54:
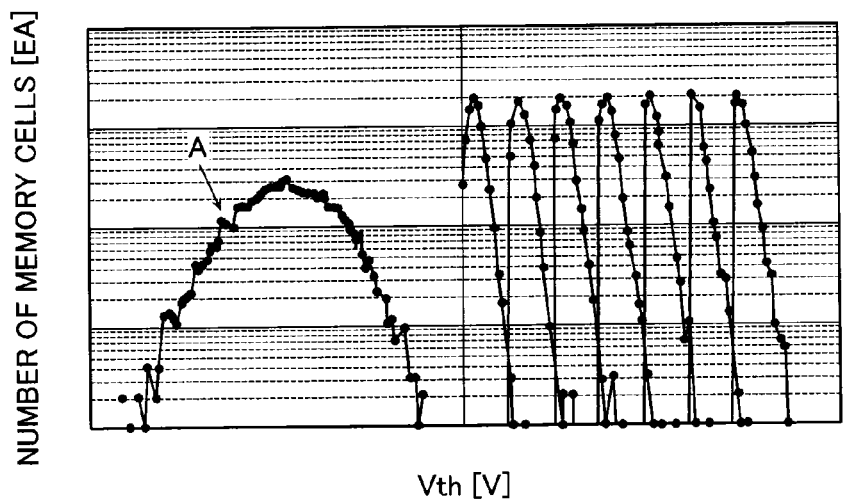

FIG. 54 illustrates a threshold distribution of memory cells MC connected to the word line WLi immediately after performing writing (namely, immediately after Yes in SB04). FIG. 55 illustrates a threshold distribution of memory cells MC connected to the word line WLi immediately after applying the additional voltage (namely, immediately after Yes in SB14).

Arrows A and B of FIGS. 54 and 55 show a threshold distribution of an erasing level (equivalent to the ER level shown in FIG. 3). According to FIGS. 54 and 55, it can be understood that the threshold distribution of the erasing level is shifted to a high voltage side due to the application of the additional voltage. In this way, if all the bit lines BL are set as the non-selected bit lines and the application voltage is applied to the word line WLi, additional writing is selectively performed on the memory cells MC of the erasing level connected to the word line WLi and therefore the threshold distribution of the memory cells MC of the erasing level connected to the word line WLi is shifted to the high voltage side.

Next, the influence of the word line WLi on the word line WLi−1 (inter-cell interference effect) is described.

FIG. 56 illustrates a threshold distribution of memory cells MC connected to the word line WLi−1 immediately after writing to the word line WLi. FIG. 57 illustrates a threshold distribution of memory cells MC connected to the word line WLi−1 immediately after applying the additional voltage to the word line WLi.

Writing to the word line WLi has an influence on the threshold distribution of memory cells MC connected to the adjacent word line WLi−1 on which the writing has been performed. Under the present circumstances, the influence on the memory cells MC connected to the word line WLi−1 varies depending on the threshold voltage Vth of the adjacent memory cells MC connected to the word line WLi. As a result, as illustrated in FIG. 56, the threshold distribution on the word line WLi−1 will broaden by the writing to the word line WLi. A range C of FIG. 56 represents the threshold distribution of the write level of the memory cells MC of a write level higher than the erasing level which has broadened in such a way.

Generally, there are many memory cells MC which are greatly influenced by the inter-cell interference effect, that is, memory cells MC of which adjacent memory cells have a high threshold voltage Vth, on the high voltage side within the broadened threshold distribution. On the other hand, there are many memory cells MC which are hardly influenced by the inter-cell interference effect, that is, memory cells MC whose adjacent memory cells have a low threshold voltage Vth (for example, memory cells MC of which adjacent memory cells has a threshold voltage Vth of the erasing level) on the low voltage side within the broadened threshold distribution.

A range D of FIG. 57 represents the threshold distribution of memory cells MC of a write level higher than the erasing level like the range C. According to FIG. 57, it is understood that a lower skirt of the threshold distribution of the write level on the word line WLi−1 is shifted to the high voltage side, and the threshold distribution on the word line WLi−1 is narrow. This corresponds to the threshold distribution obtained by performing additional writing to the memory cells MC of the erasing level connected to the word line WLi. As a result of the additional writing, the threshold voltage of the memory cells MC in the lower skirt is considered to have risen by the inter-cell interference effect.

On the other hand, there is nearly no effect of the additional writing on the memory cells MC of the write level higher than the erasing level. This is because the threshold voltage Vth of the memory cells MC hardly changes even through the additional voltage is applied to the non-selected word line WLi due to the high write level. As a result, it is considered that the threshold voltage Vth of the memory cells MC in an upper skirt of the threshold distribution is hardly influenced by the inter-cell interference effect and does not rise. That is, the application of the additional voltage of the present embodiment corresponds to an operation of selectively performing additional writing to the memory cells MC of the erasing level connected to the word line WLi.

Thus, according to the present embodiment, the threshold distribution of memory cells MC on the word line WLi−1 can be narrowed by applying the additional voltage to the word line WLi, setting all the bit lines BL as the non-selected bit lines. The write sequence of the present embodiment is applicable to other cases than a case where a memory cell of a 3 bits-per-cell type is used, for example, to a case where a memory cell of a 1 bit-per-cell type is used.

Figure 58:
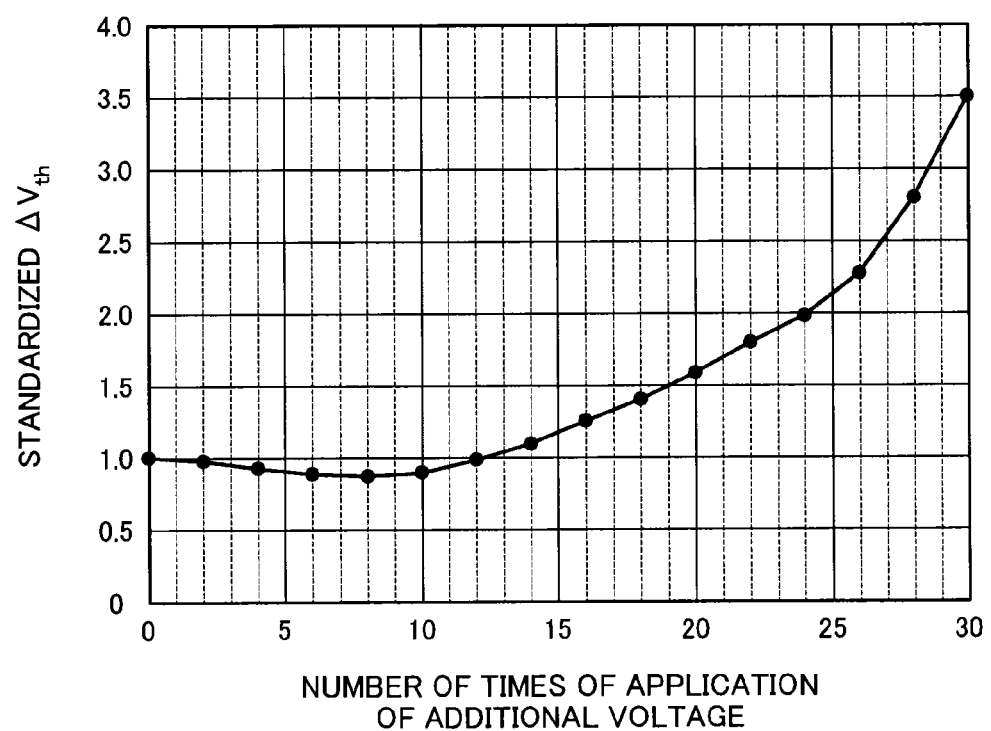
FIG. 58 is an example of a graph illustrating a relation between the number of times of application of an additional voltage and a width of a threshold distribution in the nonvolatile semiconductor memory device according to the eleventh embodiment.

FIG. 58 is a graph illustrating a relation between the number of times of application of the additional voltage and the width of the threshold distribution in the present embodiment.

The horizontal axis of FIG. 58 indicates the number of times of application of the additional voltage to the word line WLi. The state where the number of times of application is 0 corresponds to a state which comes immediately after performing the writing. The vertical axis of FIG. 58 indicates a width of a standardized threshold distribution of the write level on the word line WLi−1 which becomes 1 immediately after performing the writing. FIG. 58 illustrates an example of a simulation concerning a NAND flash memory using a memory cell of a 3 bits-per-cell type like FIGS. 54 through 57.

According to FIG. 58, as the number of times of application of the additional voltage is increased from 0 times, the width of the threshold distribution narrows and it is possible to know that at which number of times of application of the additional voltage, the width of the threshold distribution reaches the minimum. In the example of FIG. 58, the number of times of application is 8 times. When the number of times of application is further increased, it turns out that the width of the threshold distribution broadens conversely. It is considered because the influence of the inter-cell interference effect on the memory cells MC on the word line WLi is excessively increased.

That is, an optimum value exists in the number of times of application of the additional voltage.

Therefore, in the present embodiment, this optimum value or a value nearest the optimum value are determined through experiments or simulations, and the determined value may be stored in the ROM fuse 12 to be set as the specified number of times. Therefore, according to the present embodiment, the optimized width of the threshold distribution can be obtained. The specified number of times may be determined by trimming at the time of testing the nonvolatile semiconductor memory device.

Finally, the effect of the present embodiment is described.

As described above, in present embodiment, after the writing to word line WLi is completed, all the bit lines BL are set as the non-selected bit lines, and the additional voltage is applied to the word line WLi. In addition, the application of the additional voltage to the word line WLi can be performed before the start of the writing to the word line WLi+1. Therefore, according to the present embodiment, it becomes possible to narrow the threshold distribution of memory cells MC on the adjacent word line WLi−1 which has undergone the writing.

In addition, in the present embodiment, the processing of applying the program voltage and the additional voltage are continuously performed in a manner of applying the program voltage and the application voltage to the same word line. That is, the order of applications is such that the program voltage is applied to the word line WLi, the additional voltage is applied to the word line WLi, the program voltage is applied to the word line WLi+1, and the additional voltage is applied to the word line WLi+1. Therefore, according to the present embodiment, it becomes possible to apply such voltages at high speed.

According to the present embodiment, because it is possible to operate a multiple-value nonvolatile semiconductor memory device with a program voltage whose upper limit is low, the conditions of the breakdown voltage are made less severe and therefore memory cells MC may be further downscaled.

Twelfth Embodiment

According to a twelfth embodiment, at the time of applying an additional voltage, all the bit lines BL in a memory cell array 1 is set as selected bit lines. In the twelfth embodiment, each value of the additional voltages Vadd1 to Vadd3 is set to a value lower than an initial value Vpgm1 of a program voltage.

Hereinafter, referring to FIGS. 59 and 60, a data writing operation in a nonvolatile semiconductor memory device according to the twelfth embodiment will be described.

Figure 59:
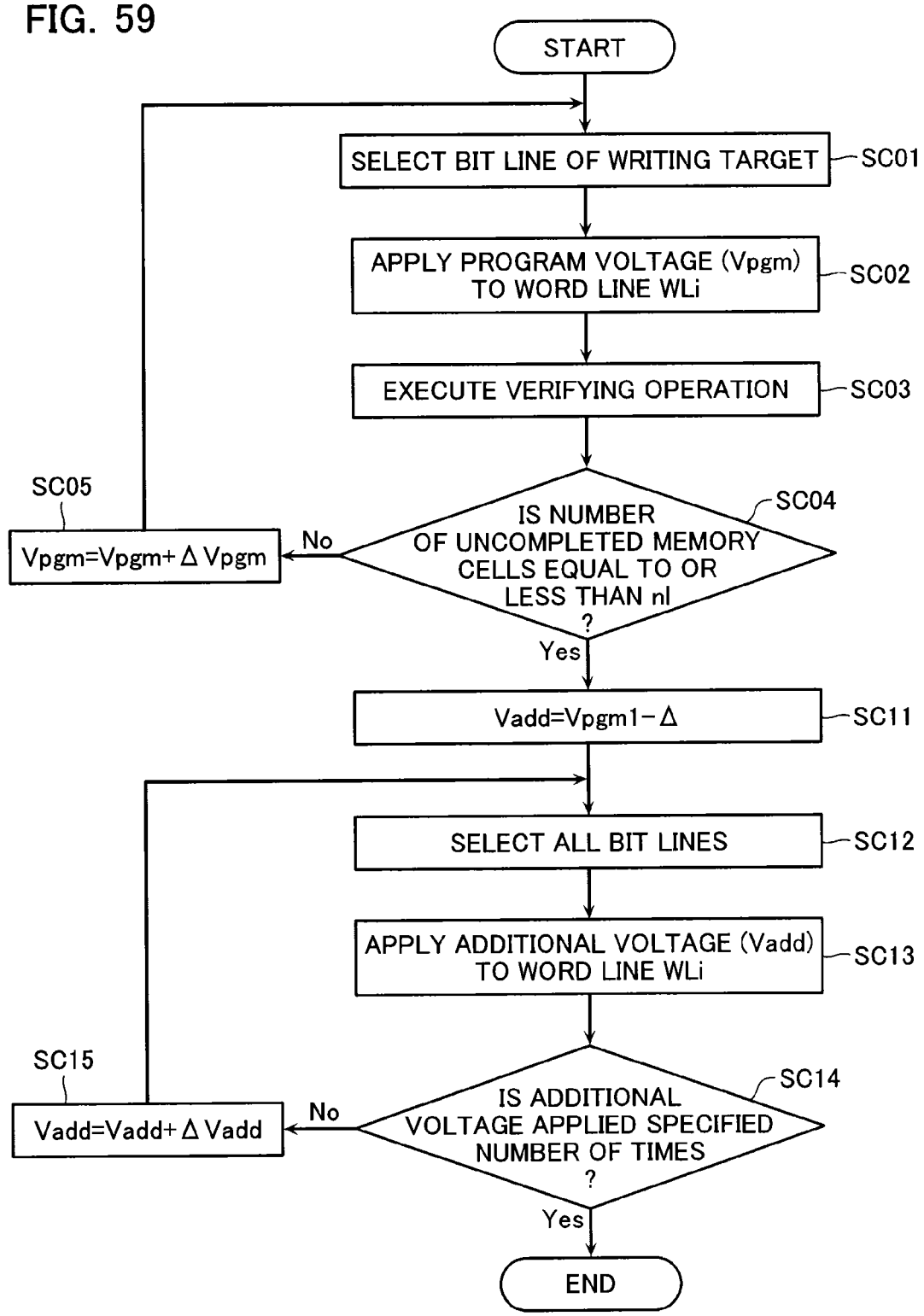
FIG. 59 is an example of a flowchart of a write sequence of a nonvolatile semiconductor memory device according to a twelfth embodiment.
Figure 60:
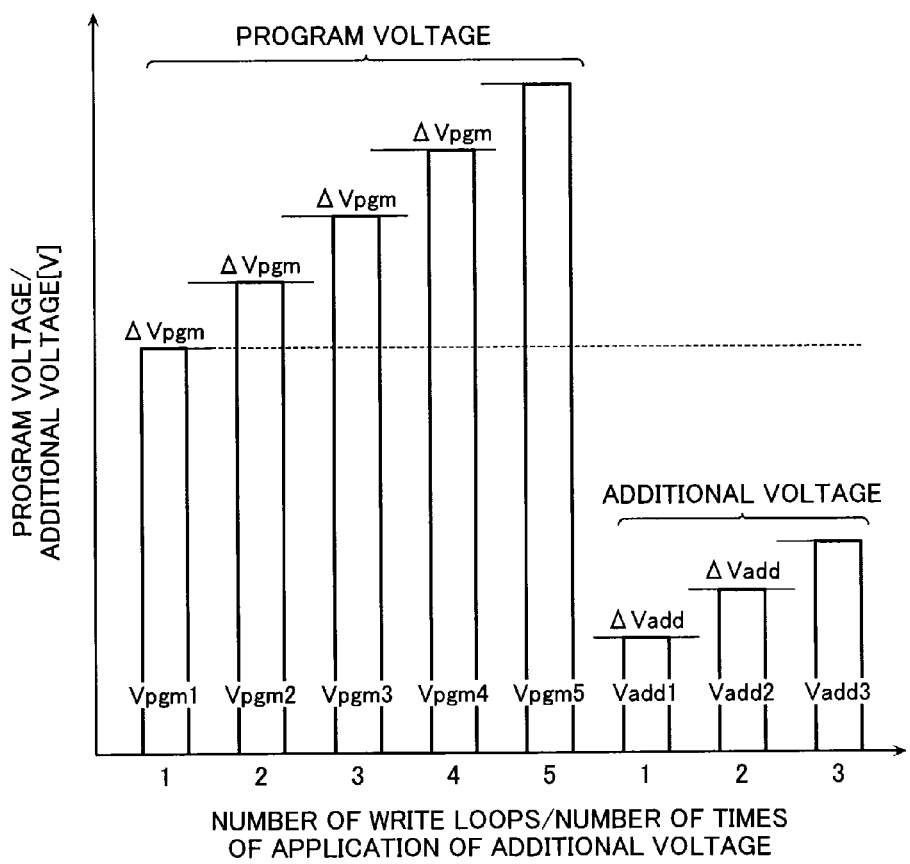
FIG. 60 is an example of a graph illustrating a relation between the number of write loops/the number of times of application of an additional voltage and a programming voltage/the additional voltage during a write sequence of the nonvolatile semiconductor memory device according to the twelfth embodiment.

FIG. 59 is an example of a flow chart which illustrates a write sequence of the present embodiment. FIG. 60 is a graph illustrating a relation between the number of write loops/the number of times of application of the additional voltage and the program voltage/the additional voltage according to the present embodiment. Hereinafter, the flowchart of FIG. 59 is described, referring suitably to FIG. 60.

All the bit lines BL to be subjected to writing among all the bit lines BL within the memory cell array 1 are set as selected bit lines, and the other bit lines BL are set as non-selected bit lines (Step SC01). The program voltage Vpgm is applied to the word line WLi (Step SC02).

A verifying operation of checking whether data is written in memory cells MC on the word line WLi is performed (Step SC03). It is determined whether the number of memory cells MC on which writing is uncompleted is equal to or less than n1 (n1 is an integer equal to or greater than 0) (Step SC04).

When the number of the writing-uncompleted memory cells is equal to or less than n1, it is determined that the writing is completed and the processing proceeds to Step SC11. On the other hand, when the number of writing-uncompleted memory cells is greater than n1, the program voltage Vpgm is increased by ΔVpgm (Step SC05), and then Steps SC01 to SC04 are repeated. FIG. 60 illustrates an example in which writing is completed by executing a write loop 5 times.

When writing to the word line WLi ends, an initial value of the additional voltage Vadd is set to a value lower than the initial value of the program voltage Vpgm (Step SC11). That is, the value of Vadd1 becomes Vpgm1−Δ(Δ>0) and it may be set to satisfy a condition of Vadd1>0.

All the bit lines BL in the memory cell array 1 are set as selected bit lines (Step SC12). The additional voltage Vadd is applied to the word line WLi (Step SC13). In a first application of the additional voltage, the value of the additional voltage is set to Vadd1 (refer to FIG. 60).

It is checked whether the additional voltage Vadd is applied a specified number of times (Step SC14). When the number of times of application of the additional voltage Vadd is less than the specified number of times, the additional voltage Vadd is increased by ΔVadd (Step SC15) and then Steps SC12 to SC14 are repeatedly executed. FIG. 60 illustrates an example in which the specified number is 3. In second and third applications of the additional voltage, the value of the additional voltage is set to Vadd2 and Vadd3, respectively (refer to FIG. 60).

On the other hand, when the number of times of application of the additional voltage Vadd reaches the specified number, the application of the additional voltage to the word line WLi is completed. After that, in the present embodiment, Steps SC01 through SC15 are performed on the following word line WLi+1.

Figure 61:
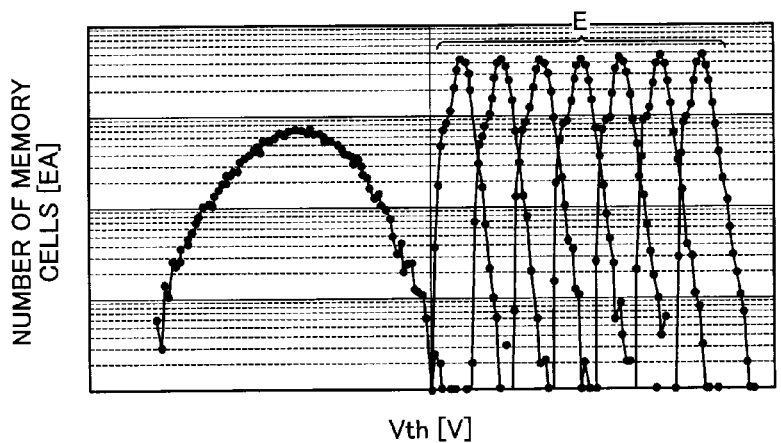
FIGS. 61 and 62 are examples of a graph illustrating a threshold distribution of memory cells of the nonvolatile semiconductor memory device according to the twelfth embodiment.
Figure 62:
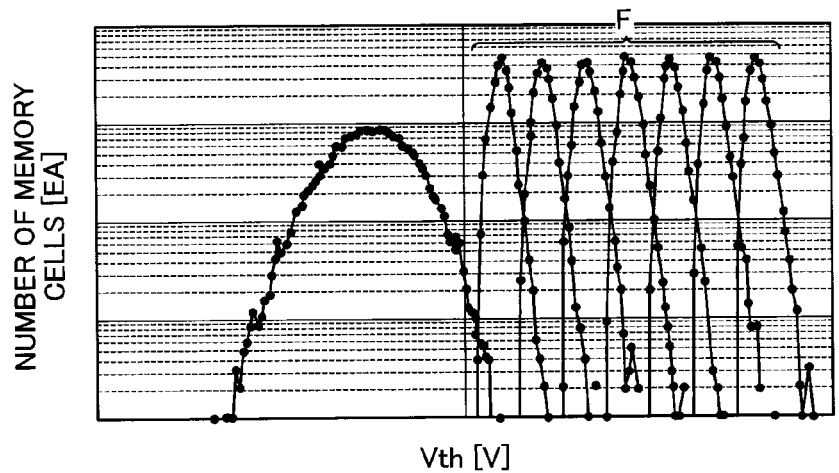
Figure 63:
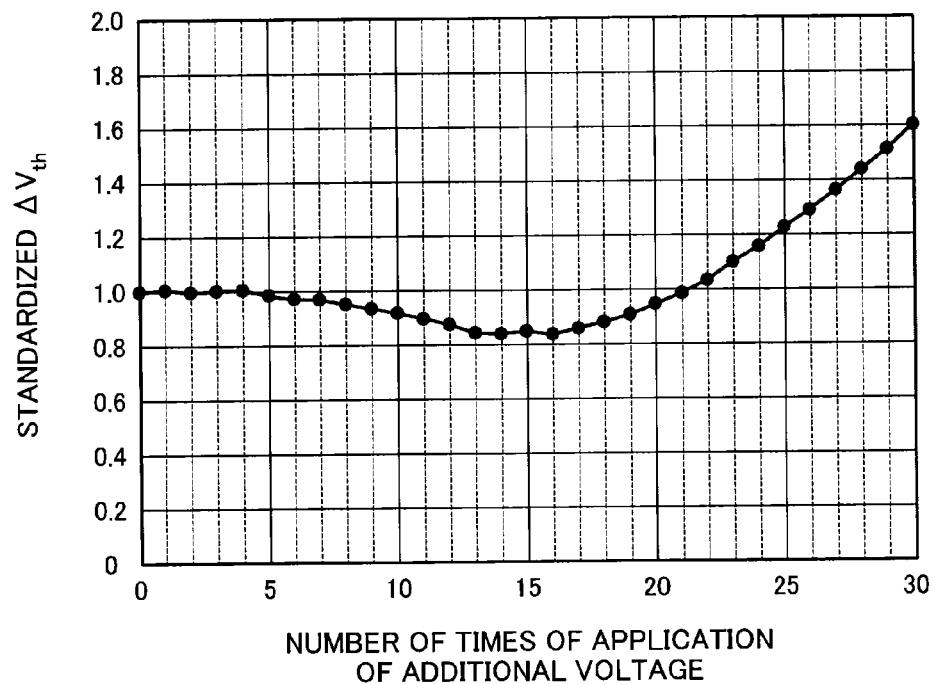
FIG. 63 is an example of a graph illustrating a relation between the number of times of application of an additional voltage and a width of a threshold distribution in the nonvolatile semiconductor memory device according to the twelfth embodiment.

Next, with reference to FIGS. 61 through 63, the operation effect of the write sequence of FIG. 59 is described.

FIGS. 61 and 62 are graphs illustrating a threshold distribution of memory cells MC in the present embodiment. FIGS. 61 and 62 illustrate an example of a simulation concerning a NAND flash memory which uses a memory cell of a 3 bits-per-cell type.

In the present embodiment, the application of the additional voltage has an effect of shifting the threshold distribution of the erasing level (corresponding to the ER level illustrated in FIG. 3) to the high voltage side like the case of the embodiment of FIG. 11. That is, by applying the additional voltage to the word line WLi while setting all the bit lines BL to the selected bit lines, the same effect as the case of performing the additional writing to the memory cells MC of the erasing level on the word line WLi is obtained, and the threshold distribution of the erasing level on the word line WLi is shifted to the high voltage side. The behavior is the same as that of FIG. 54 and FIG. 55.

Next, the influence of the word line WLi on the word line WLi−1 (inter-cell interference effect) is described.

FIG. 61 illustrates a threshold distribution of memory cells MC connected to the word line WLi−1 immediately after writing to the word line WLi. In addition, FIG. 62 illustrates a threshold distribution of memory cells MC connected to the word line WLi−1 immediately after applying the additional voltage to the word line WLi.

In the present embodiment, the threshold distribution of the memory cells MC connected to the word line WLi−1 broadens by writing to the word line WLi for the same reason as the case of the eleventh embodiment (FIG. 61). A range E of FIG. 61 represents the threshold distribution of the write level of the memory cells MC of a write level higher than the erasing level which has broadened in such a way.

A range F of FIG. 62 represents the threshold distribution of the memory cells MC of a write level higher than the erasing level like the range E. According to FIG. 62, it is understood that a lower skirt of the threshold distribution of the write level of the memory cells MC connected to the word line WLi−1 is shifted to the high voltage side, and the threshold distribution of the memory cells MC connected to the word line Li−1 becomes narrower. Like the eleventh embodiment, the reason of this is considered that the additional writing is selectively performed on the memory cells MC of the erasing level connected to the word line WLi and therefore the threshold voltage Vth of the memory cells MC in the lower skirt rises due to the inter-cell interference effect.

On the other hand, the additional writing has nearly no influence on the memory cells MC of the write level higher than the erasing level. This is because the threshold voltage Vth of the memory cells MC hardly changes even through the additional voltage is applied to the selected word line WLi due to the high write level. As a result, it is considered that the threshold voltage Vth of the memory cells MC in an upper skirt of the threshold distribution is hardly influenced by the inter-cell interference effect and therefore does not rise. That is, the application of the additional voltage of the present embodiment corresponds to an operation of selectively performing additional writing to the memory cells MC of the erasing level on the word line WLi.

Thus, according to the present embodiment, the threshold distribution of the memory cells MC connected to the word line WLi−1 can be narrowed by applying the additional voltage to the word line WLi, setting all the bit lines BL as the selected bit lines. In the present embodiment, because the bit lines are set as the selected bit lines, in order to prevent the additional writing of an excessive level from being performed, the values of all the additional voltages Vadd1 to Vadd3 are set to values lower than the initial value Vpgm1 of the program voltage.

FIG. 63 is a graph illustrating a relation between the number of times of application of the additional voltage and the width of the threshold distribution in the present embodiment. FIG. 63 illustrates an example of a simulation of a NAND flash memory using a memory cell of a 3 bits-per-cell type, which is performed using an in-company simulator, like FIGS. 61 and 62.

That is, as illustrated in FIG. 63, with regard to the number of times of application of the additional voltage, an optimum value exists. In the example of FIG. 63, the optimum value is about 15 times. Therefore, in the present embodiment, this optimum value or a value nearest the optimum value are determined through experiments or simulations, and the determined value may be stored in the ROM fuse 12 to be set as the specified number of times. Therefore, according to the present embodiment, the optimized width of the threshold distribution may be obtained.

Finally, the effect of the present embodiment is described.

As described above, in present embodiment, after the writing to word line WLi is completed, all the bit lines BL are set as the selected bit lines, and the additional voltage is applied to the word line WLi. In addition, the application of the additional voltage to the word line WLi can be performed before the start of the writing to the word line WLi+1. Therefore, according to the present embodiment, like the eleventh embodiment, it becomes possible to narrow the threshold distribution of the memory cells MC on the adjacent word line WLi−1 which has undergone the writing.

Thirteenth Embodiment

Figure 64:
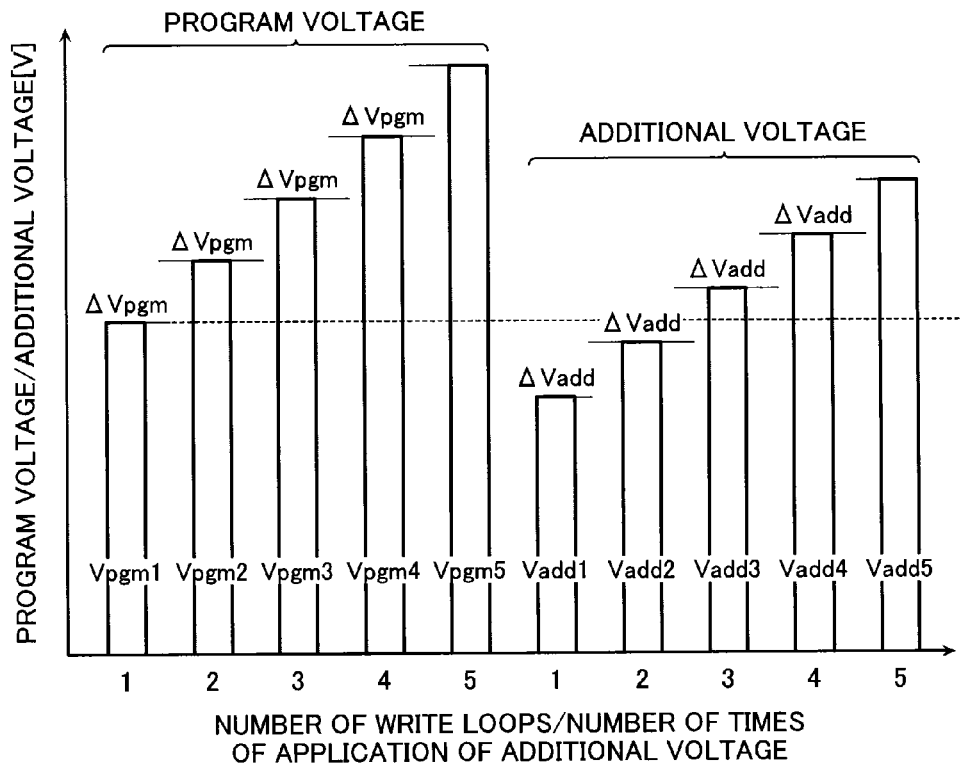
FIG. 64 is an example of a graph illustrating a relation between the number of write loops/the number of times of application of an additional voltage and a program voltage/the additional voltage during a write sequence of a nonvolatile semiconductor memory device according to a thirteenth embodiment.

FIG. 64 is an example of a graph illustrating a relation between the number of write loops/the number of applications of an additional voltage and a program voltage/the additional voltage according to a thirteenth embodiment.

In the eleventh embodiment, at the time of applying the additional voltage, all the bit lines BL in the memory cell array 1 is set as non-selected bit lines. In the twelfth embodiment, at the time of applying the additional voltage, all the bit lines BL in the memory cell array 1 is set as the selected bit lines. In contrast with those embodiments, in the thirteenth embodiment, at the time of applying the additional voltage, all the bit lines BL in the memory cell array 1 is set as selected bit lines or non-selected bit lines according to the additional voltage value.

Specifically, when the value of the additional voltage Vadd is set to a value lower than the initial value Vpgm1 of the program voltage, all the bit lines BL are set as selected bit lines. In FIG. 64, Vadd1 and Vadd2 are examples of such a value.

On the other hand, when the value of the additional voltage Vadd is set to a value higher than the initial value Vpgm1 of the program voltage, all the bit lines BL are set as non-selected bit lines. In FIG. 64, Vadd3 to Vadd5 correspond to examples of such a value.

According to the present embodiment, unlike the eleventh and twelfth embodiments in which there is a restriction in the value of the additional voltage, the value of the additional voltage can be set to an arbitrary value.

In addition, application of the additional voltage in a condition that all the bit lines BL are set as the selected bit lines is more preferable than application of the additional voltage in a condition that all the bit lines BL are set as the non-selected bit lines in terms of stability of the potential of the bit lines BL. On the other hand, when all the bit lines BL are set as the selected bit lines, excessive additional writing may occur as described above. However, in the present embodiment, because it is possible to switch between settings that all the bit lines BL are set as the selected bit lines and that all the bit lines are set as the non-selected bit lines, not only advantages of the case where the bit lines are set as the selected bit lines can be obtained but also excessive additional writing can be prevented.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 65:
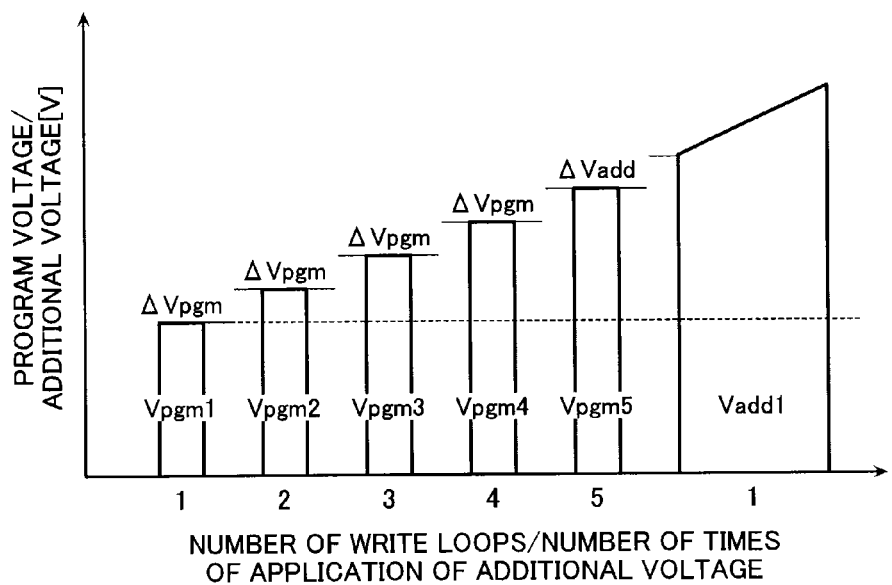
FIG. 65 is an example of a graph illustrating a relation between the number of write loops/the number of times of application of an additional voltage and a programming voltage/the additional voltage during a write sequence of a nonvolatile semiconductor memory device according to a modification of the eleventh embodiment.
Figure 66:
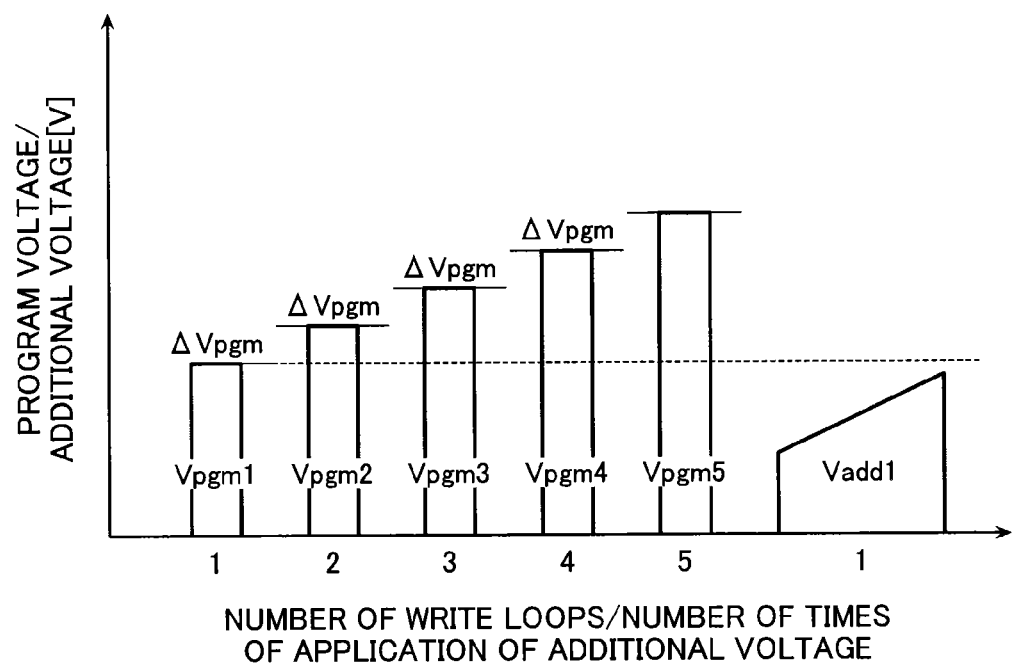
FIG. 66 is an example of a graph illustrating a relation between the number of write loops/the number of times of application of an additional voltage and a programming voltage/the additional voltage during a write sequence of a nonvolatile semiconductor memory device according to a modification of the twelfth embodiment.

For example, in the cases of the eleventh to thirteenth embodiments, the application method of the additional voltage Vadd can also be changed to an application of a single pulse which continuously changes from an application of a plurality of independent pulses (refer to FIGS. 65 and 66). FIGS. 65 and 66 are graphs illustrating a relation between the number of write loops/the number of times of application of the additional voltage and the program voltage/the additional voltage in modifications of the eleventh and twelfth embodiments, respectively. The method of continuously changing a single voltage allows the stress applied to the gate insulation film of the memory cell MC to be reduced. In addition, this method may reduce the writing time as compared with the application of independent pulses because a time taken to raise and lower the voltage is not necessary. In addition "continuous change of a single voltage" includes not only a case where the voltage changes linearly as illustrated in FIGS. 65 and 66, but also a case where the voltage changes in a curved and step-like manner. This is because with even this form of voltage change, the effect of reducing the stress applied to the gate insulation film of the memory cell MC and the effect of reducing the writing time can be obtained.

What is claimed is:

1. A nonvolatile semiconductor memory device comprising:
   a memory cell array including a plurality of memory cells, and a plurality of word lines and a plurality of bit lines; and
   a data writing unit that writes data to memory cells connected to a first word line among the word lines by applying a program voltage to the first word line one or more times, sets all of the bit lines to write-inhibited states, and applies an additional voltage to the first word line one or more times after data writing to all of the memory cells connected to the first word line is completed,
   when performing the writing with respect to a second word line different from the first word line among the word lines after performing the data writing to the memory cells connected to the first word line, the data writing unit setting all of the bit lines to write-inhibited states, and applying the additional voltage to the second word line after data writing to all of memory cells connected to the second word line is completed,
   wherein the data writing unit sets a value of the additional voltage to a value equal to or higher than a last value of the program voltage under existence of one of the bit lines being in a write-permitted state.

2. The nonvolatile semiconductor memory device according to claim 1, wherein when performing the writing with respect to the second word line,
   the data writing unit repeats a program operation applying the program voltage to the second word line and a program verify operation checking whether data is written in memory cells connected to the second word line,
   the data writing unit causing the program voltage to increase by a first step-up voltage if it is checked that data is not written in the memory cells connected to the second word line in the program verify operation and executing the program operation with respect to the second word line again,
   the data writing unit applies to the second word line the additional voltage plural times causing the additional voltage to increase by a second step-up voltage, and
   the data writing unit sets an initial value of the additional voltage higher than a last value of the program voltage.

3. The nonvolatile semiconductor memory device according to claim 2, wherein the first step-up voltage is same as the second step-up voltage.

4. The nonvolatile semiconductor memory device according to claim 2, wherein the first step-up voltage is different from the second step-up voltage.

5. The nonvolatile semiconductor memory device according to claim 1, wherein the additional voltage applied to the second word line includes a single pulse having pulse form of voltage change.

6. A nonvolatile semiconductor memory device comprising:
   a memory cell array including a plurality of memory cells, and a plurality of word lines and a plurality of bit lines; and
   a data writing unit that writes data to memory cells connected to a first word line among the word lines by applying a program voltage to the first word line one or more times, sets all of the bit lines to write-inhibited states, and applies an additional voltage to the first word line one or more times after data writing to all of the memory cells connected to the first word line is completed,
   when performing the writing with respect to a second word line different from the first word line among the word lines after performing the data writing to the memory cells connected to the first word line, the data writing unit setting all of the bit lines to write-inhibited states or write-permitted states, and applying the additional voltage to the second word line after data writing to all of memory cells connected to the second word line is completed, wherein the data writing unit sets all of the bit lines to the write-inhibited states or the write-permitted states according to a value of the additional voltage.

7. The nonvolatile semiconductor memory device according to claim 6, wherein the data writing unit sets all of the of bit lines to the write-permitted states when a value of the additional voltage is set to a value lower than an initial value of the program voltage, and sets the plurality of bit lines to the write-inhibited states when a value of the additional voltage is set to a value higher than an initial value of the program voltage.

8. The nonvolatile semiconductor memory device according to claim 6, wherein when performing the writing with respect to the second word line, the data writing unit repeats a program operation applying a program voltage to the second word line and a program verify operation checking whether data is written in memory cells connected to the second word line, the data writing unit causing the program voltage to increase by a first step-up voltage if it is checked that data is not written in the memory cells connected to the second word line in the program verify operation and executing the program operation with respect to the second word line again, the data writing unit applies to the second word line the additional voltage plural times causing the additional voltage to increase by a second step-up voltage, and the data writing unit sets an initial value of the additional voltage lower than an initial value of the program voltage.

9. The nonvolatile semiconductor memory device according to claim 8, wherein the first step-up voltage is same as the second step-up voltage.

10. The nonvolatile semiconductor memory device according to claim 8, wherein the first step-up voltage is different from the second step-up voltage.

11. The nonvolatile semiconductor memory device according to claim 8, wherein the additional voltage applied to the second word line plural times does not exceed a last value of the program voltage.

* * * * *